United States Patent
Kataoka et al.

(10) Patent No.: US 9,316,910 B2
(45) Date of Patent: Apr. 19, 2016

(54) PATTERN FORMING METHOD, ACTINIC-RAY-SENSITIVE OR RADIATION-SENSITIVE RESIN COMPOSITION, AND RESIST FILM

(75) Inventors: Shohei Kataoka, Shizuoka (JP); Hidenori Takahashi, Shizuoka (JP); Shuhei Yamaguchi, Shizuoka (JP); Shoichi Saitoh, Shizuoka (JP); Michihiro Shirakawa, Shizuoka (JP); Fumihiro Yoshino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 65 days.

(21) Appl. No.: 13/406,306

(22) Filed: Feb. 27, 2012

(65) Prior Publication Data
US 2012/0219913 A1 Aug. 30, 2012

(30) Foreign Application Priority Data
Feb. 28, 2011 (JP) ................................. 2011-043393

(51) Int. Cl.
*G03F 7/20* (2006.01)
*G03F 7/039* (2006.01)

(52) U.S. Cl.
CPC .................... *G03F 7/0397* (2013.01)

(58) Field of Classification Search
USPC .............................................. 430/285.1, 325
See application file for complete search history.

(56) References Cited

U.S. PATENT DOCUMENTS

| | | | |
|---|---|---|---|
| 6,280,898 B1 | 8/2001 | Hasegawa et al. | |
| 6,703,178 B2 | 3/2004 | Chen et al. | |
| 6,720,430 B2 | 4/2004 | Chen et al. | |
| 8,062,829 B2 | 11/2011 | Hata et al. | |
| 8,450,041 B2 | 5/2013 | Yamaguchi | |
| 8,617,785 B2 | 12/2013 | Yamaguchi | |
| 2003/0077543 A1* | 4/2003 | Sato | 430/287.1 |
| 2003/0229234 A1 | 12/2003 | Chen et al. | |
| 2003/0232270 A1 | 12/2003 | Chen et al. | |
| 2010/0183979 A1 | 7/2010 | Yamaguchi | |
| 2010/0183980 A1 | 7/2010 | Yamaguchi | |

FOREIGN PATENT DOCUMENTS

| | | | |
|---|---|---|---|
| JP | 2000-159758 A | 6/2000 | |
| JP | 2003-345025 A | 12/2003 | |
| JP | 2004-002416 A | 1/2004 | |
| JP | 2006-018229 A | 1/2006 | |
| JP | 2006-018230 A | 1/2006 | |
| JP | 2007-041146 A | 2/2007 | |
| JP | 2007206692 A | 8/2007 | |
| JP | 2008-225412 A | 9/2008 | |
| JP | 2008-281975 A | 11/2008 | |
| JP | 2009-025707 A | 2/2009 | |
| JP | 2009-235118 A | 10/2009 | |
| JP | 2009-237559 A | 10/2009 | |
| JP | 2009-244396 A | 10/2009 | |

(Continued)

OTHER PUBLICATIONS

Notice of Reasons for Rejection, mailed Nov. 19, 2013, issued in corresponding JP Application No. 2011-043393, 17 pages in English and Japanese.

(Continued)

*Primary Examiner* — Daborah Chacko Davis
(74) *Attorney, Agent, or Firm* — Sughrue Mion, PLLC

(57) ABSTRACT

Provided is a pattern forming method that is excellent in roughness performance such as line width roughness and exposure latitude, and an actinic-ray-sensitive or radiation-sensitive resin composition and a resist film used for the pattern forming method.

The pattern forming method includes (1) forming a film using an actinic-ray-sensitive or radiation-sensitive resin composition containing a resin that includes 65 mol % or more of a repeating unit having a group which generates a polar group by being degraded by the action of an acid based on all repeating units in the resin and at least one kind of repeating unit represented by the following General Formula (I) or (II), (2) exposing the film, and (3) developing the exposed film using a developer that contains an organic solvent.

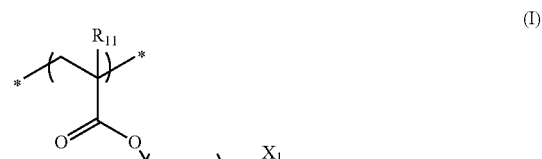

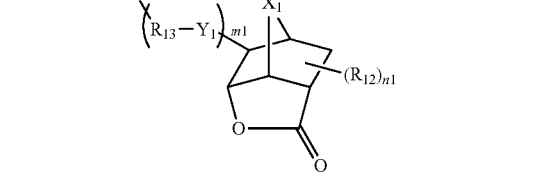

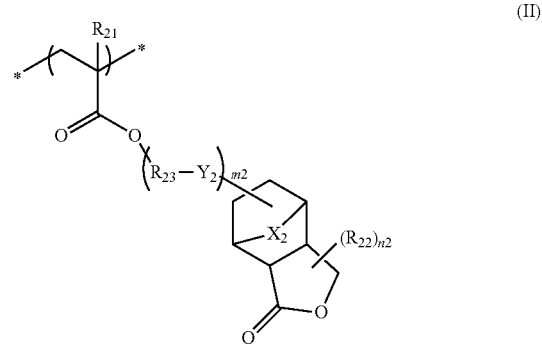

16 Claims, No Drawings

(56) References Cited

FOREIGN PATENT DOCUMENTS

| | | |
|---|---|---|
| JP | 2010-139996 A | 6/2010 |
| JP | 2010-164958 A | 7/2010 |
| JP | 2010-186176 A | 8/2010 |
| JP | 2010-186177 A | 8/2010 |
| JP | 2010-282189 A | 12/2010 |
| JP | 2010286670 A | 12/2010 |
| JP | 2011-039502 A | 2/2011 |
| JP | 2012-181287 A | 9/2012 |
| WO | 2007/116664 A1 | 10/2007 |
| WO | 2012/101942 A1 | 8/2012 |

OTHER PUBLICATIONS

Notice of Reasons for Rejection, dated Jan. 29, 2013, issued in corresponding JP Application No. 2011-043393, 11 pages in English and Japanese.
Office Action dated Aug. 24, 2015, issued by the Intellectual Property Office of Taiwan in counterpart Taiwanese Patent Application No. 101104112.
Office Action dated Aug. 25, 2015 from the Japanese Patent Office issued in corresponding Japanese Application No. 2014-239105.
Office Action dated Dec. 1, 2015 from the Japanese Patent Office issued in corresponding Japanese Application No. 2014-239105.

* cited by examiner

PATTERN FORMING METHOD, ACTINIC-RAY-SENSITIVE OR RADIATION-SENSITIVE RESIN COMPOSITION, AND RESIST FILM

BACKGROUND OF THE INVENTION

1. Field of the Invention

The present invention relates to a pattern forming method and an actinic-ray-sensitive or radiation-sensitive resin composition and a resist film used for the pattern forming method. More specifically, the present invention relates to a pattern forming method that is suitably used for a production process of a semiconductor such as IC, a production process of a circuit board of a liquid crystal, a thermal head, or the like, and other lithography processes of photofabrication, and relates to an actinic-ray-sensitive or radiation-sensitive resin composition and a resist film used for the pattern forming method. Particularly, the present invention relates to a pattern forming method that is suitably used for exposure performed by an ArF exposure apparatus and an ArF liquid immersion projection apparatus that use far-ultraviolet rays having a wavelength of 300 nm or less as a light source, and by an EUV exposure apparatus, and to an actinic-ray-sensitive or radiation-sensitive resin composition and a resist film used for the pattern forming method.

2. Description of the Related Art

Since a resist composition for a KrF excimer laser (248 nm) has been developed, a pattern forming method using chemical amplification has been used to compensate desensitization caused by the light absorption of the resist composition. For example, in positive type chemical amplification, first, a photoacid-generating agent that is included in an exposed portion in a resist composition is degraded by being irradiated with light and generates an acid. Thereafter, in a process such as PEB (Post Exposure Bake), by the catalytic action of the generated acid, an alkali-insoluble group included in the resist composition is changed to an alkali-soluble group. Subsequently, development is performed using, for example, an alkaline solution. In this manner, the exposed portion is removed, and a desired pattern is obtained (for example, see JP2009-235118A, JP2007-41146A, JP2009-237559A, and JP2000-159758).

In the above method, various alkaline developers have been suggested as the alkaline developer, and for example, an aqueous alkaline developer such as 2.38% by mass of aqueous TMAH (tetramethylammonium hydroxide) solution is widely used.

In order to miniaturize semiconductor elements, the wavelength of an exposure light source is being shortened, and a projection lens with a high numerical aperture (high NA) is being made. Currently, an exposure machine using an ArF excimer laser having a wavelength of 193 nm as a light source has been developed. As a technique for further improving resolving power, a method (that is, liquid immersion) of filling a liquid (also referred to as a "liquid for liquid immersion" hereinafter) having a high refractive index between a projection lens and a sample has been proposed. In addition, EUV lithography that performs exposure by using ultraviolet rays having a shorter wavelength (13.5 nm) has also been proposed.

However, in the current circumstances, it is very difficult to find out an appropriate combination of a resist composition, a developer, and a rinsing liquid, and the like, necessary for forming a pattern that has an excellent performance overall. Therefore, the further improvement of the performance is required.

In recent years, a pattern forming method that uses a developer containing an organic solvent has been undergoing development (for example, see JP2008-281975A, JP2010-139996A, JP2010-164958A, and JP2009-25707A). For example, JP2008-281975A discloses a pattern forming method that includes developing a resist composition that contains about 40 mol % of a repeating unit which has a group generating a polar group by being degraded by the action of an acid based on all repeating units in a resin and a repeating unit which has a norbornane lactone structure, by using a developer containing an organic solvent. JP2008-281975A discloses that according to this method, a fine pattern having small line width roughness (LWR) and high dimensional uniformity can be stably formed.

However, regarding the above-described composition, the LWR and exposure latitude (EL) are required to be further improved.

SUMMARY OF THE INVENTION

An object of the present invention is to provide a pattern forming method that is excellent in roughness performance such as line width roughness and exposure latitude, and to provide an actinic-ray-sensitive or radiation-sensitive resin composition and a resist film used for the pattern forming method.

The pattern forming method of the present invention that can achieve the above object includes (1) forming a film by using an actinic-ray-sensitive or radiation-sensitive resin composition containing a resin that includes 65 mol % or more of a repeating unit having a group which generates a polar group by being degraded by the action of an acid based on all repeating units in the resin and at least one kind of repeating unit represented by the following General Formula (I) or (II), (2) exposing the film, and (3) developing the exposed film using a developer that contains an organic solvent.

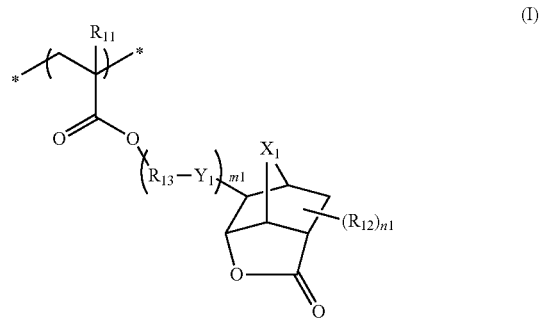

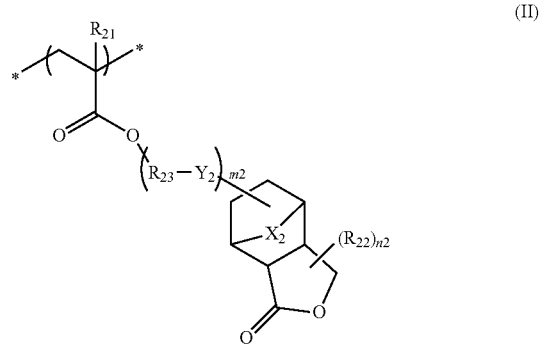

In General Formulae (I) and (II), each of $R_{11}$ and $R_{21}$ independently represents a hydrogen atom or an alkyl group.

Each of $R_{12}$ and $R_{22}$ independently represents an alkyl group, a cycloalkyl group, an alkoxy group, an alkoxycarbonyl group, a carboxyl group, a halogen atom, a hydroxyl group, or a cyano group.

Each of $R_{13}$ and $R_{23}$ independently represents an alkylene group, a cycloalkylene group, or a combination thereof. In a case that a plurality of $R_{13}$s are present, each $R_{13}$s may be the same as or different from each other. In a case that a plurality of $R_{23}$s are present, each $R_{23}$s may be the same as or different from each other.

Each of $Y_1$ and $Y_2$ independently represents a single bond, an ether bond, an ester bond, an amide bond, a urethane bond, or a ureylene bond. In a case that a plurality of $Y_1$s are present, each $Y_1$s may be the same as or different from each other. In a case that a plurality of $Y_2$s are present, each $Y_2$s may be the same as or different from each other.

Each of $X_1$ and $X_2$ independently represents a methylene group, a methyl methylene group, a dimethyl methylene group, an ethylene group, an oxygen atom, or a sulfur atom.

Each of m1 and m2 independently represents an integer of 0 to 4.

Each of n1 and n2 independently represents an integer of 0 to 4. In a case that n1 is 2 or greater, a plurality of $R_{12}$s may be the same as or different from each other or may form a ring by binding to each other. In a case that n2 is 2 or greater, a plurality of $R_{22}$s may be the same as or different from each other or may form a ring by binding to each other.

As a preferable embodiment of the present invention, the content of the organic solvent in the developer is 90% by mass to 100% by mass based on the total amount of the developer, and as the repeating unit having a group which generates a polar group, a repeating unit generating an eliminated substance having a molecular weight of 140 or less by the action of an acid is contained in the resin at 50 mol % or more based on all repeating units in the resin.

As another preferable embodiment, the resin further contains a repeating unit having a hydroxy adamantyl group or a dihydroxy adamantyl group but does not have an acid group, the actinic-ray-sensitive or radiation-sensitive resin composition further contains a hydrophobic resin, and the hydrophobic resin contains at least any one of a fluorine atom or a silicon atom.

As another preferable embodiment of the present invention, the developer contains at least one kind of organic solvent selected from a group consisting of a ketone-based solvent, an ester-based solvent, an alcohol-based solvent, an amide-based solvent, and an ether-based solvent, the pattern forming method further includes (4) washing the developed film using a rinsing liquid containing an organic solvent, and the exposing in (2) is liquid immersion exposure. The present invention includes an actinic-ray-sensitive or radiation-sensitive resin composition used for the pattern forming method described above.

The present invention also includes a resist film formed of the actinic-ray-sensitive or radiation-sensitive resin composition described above.

As a more preferable embodiment, in the pattern forming method of the present invention, the content of the repeating unit having a group which generates a polar group by being degraded by the action of an acid is 70 mol % to 90 mol % (more preferably more than 70 mol % and not more than 90 mol %) based on all repeating units in the resin; as the repeating unit having a group which generates a polar group, the repeating unit generating an eliminated substance having a molecular weight of 140 or less by the action of an acid is contained in the resin at 60 mol % to 90 mol % based on all repeating units in the resin; and the molecular weight of the eliminated substance is 100 or less.

As another preferable embodiment, the actinic-ray-sensitive or radiation-sensitive resin composition of the present invention is a chemical amplification type resist composition for organic solvent development or is for liquid immersion development.

According to the present invention, a pattern forming method that is excellent in roughness performance such as line width roughness and exposure latitude, and an actinic-ray-sensitive or radiation-sensitive resin composition and a resist film used for the pattern forming method can be provided.

DESCRIPTION OF THE PREFERRED EMBODIMENTS

Hereinafter, the embodiments of the present invention will be described in detail.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

The term "actinic ray" or "radiation" in this specification refers to, for example, a bright line spectrum of a mercury lamp, a far-ultraviolet ray represented by an excimer laser, an extreme ultraviolet (EUV) ray, an X-ray, or an electron beam (EB). In addition, the term "light" in the present invention refers to the actinic ray or the radiation.

Unless otherwise specified, the term "exposure" in this specification includes not only the exposure performed using a mercury lamp, a far-ultraviolet ray represented by an excimer laser, an extreme-ultraviolet ray, an X-ray, an EUV ray, and the like, but also drawing performed using a particle beam such as an electron beam or an ion beam. In the following description, "(from) xx to yy" means that it includes numerical values designated by "xx" and "yy" as a lower limit and an upper limit, respectively.

The pattern forming method of the present invention includes (1) forming a film by using an actinic-ray-sensitive or radiation-sensitive resin composition containing a resin that includes 65 mol % or more of a repeating unit having a group (hereinafter, also referred to as an "acid-degradable group") which generates a polar group by being degraded by the action of an acid based on all repeating units in the resin and at least one kind of repeating unit represented by the following General Formula (I) or (II), (2) exposing the film, and (3) developing the exposed film using a developer that contains an organic solvent.

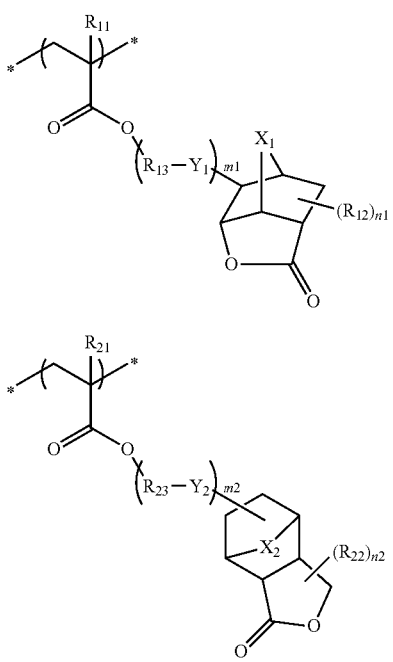

(I)

(II)

In General Formulae (I) and (II), each of $R_{11}$ and $R_{21}$ independently represents a hydrogen atom or an alkyl group.

Each of $R_{12}$ and $R_{22}$ independently represents an alkyl group, a cycloalkyl group, an alkoxy group, an alkoxycarbonyl group, a carboxyl group, a halogen atom, a hydroxyl group, or a cyano group.

Each of $R_{13}$ and $R_{23}$ independently represents an alkylene group, a cycloalkylene group, or a combination thereof. When there is a plurality of $R_{13}$s, $R_{13}$s may be the same as or different from each other. When there is a plurality of $R_{23}$s, $R_{23}$s may be the same as or different from each other.

Each of $Y_1$ and $Y_2$ independently represents a single bond, an ether bond, an ester bond, an amide bond, a urethane bond, or a ureylene bond. When there is a plurality of $Y_1$s, $Y_1$s may be the same as or different from each other. When there is a plurality of $Y_2$s, $Y_2$s may be the same as or different from each other.

Each of $X_1$ and $X_2$ independently represents a methylene group, a methyl methylene group, a dimethyl methylene group, an ethylene group, an oxygen atom, or a sulfur atom.

Each of m1 and m2 independently represents an integer of 0 to 4.

Each of n1 and n2 independently represents an integer of 0 to 4. When n1 is 2 or greater, a plurality of $R_{12}$s may be the same as or different from each other or may form a ring by binding to each other. When n2 is 2 or greater, a plurality of $R_{22}$s may be the same as or different from each other or may form a ring by binding to each other.

The reason why the pattern forming method of the present invention, which uses a resin that contains 65 mol % or more of a repeating unit having an acid-degradable group based on all repeating units in the resin and a repeating unit represented by the General Formula (I) and/or (II), is excellent in both roughness performance such as line width roughness and the exposure latitude in forming a negative pattern by using a developer that contains an organic solvent is unclear. However, the reason is assumed to be as follows.

When development is performed using a developer that contains an organic solvent, if dissolution contrast in a resist film is low, the boundary portion of a pattern is partially dissolved, whereby roughness performance such as line width roughness and the exposure latitude deteriorate. On the other hand, by using the resin that contains a repeating unit represented by the General Formula (I) and/or (II) and 65 mol % or more of a repeating unit having an acid-degradable group based on all repeating units in the resin, the dissolution contrast between an exposed portion and an unexposed portion in the resist film with respect to an organic solvent can be greater. As a result, roughness performance such as line width roughness and the exposure latitude are assumed to be further improved, though the reason is unclear.

In the pattern forming method of the present invention, the developer is preferably a developer containing at least one kind of organic solvent selected from a group consisting of a ketone-based solvent, an ester-based solvent, an alcohol-based solvent, an amide-based solvent, and an ether-based solvent.

The pattern forming method of the present invention preferably further includes (4) washing the developed film using a rinsing liquid containing an organic solvent.

The rinsing liquid is preferably a rinsing liquid containing at least one kind of organic solvent selected from a group consisting of a hydrocarbon-based solvent, a ketone-based solvent, an ester-based solvent, an alcohol-based solvent, an amide-based solvent, and an ether-based solvent.

The pattern forming method of the present invention preferably includes (5) baking after (2) exposing.

The resin in the pattern forming method of the present invention may be a resin of which the polarity increases due to the action of an acid and the solubility in an alkaline developer increases, and the pattern forming method of the present invention may further include (6) developing using an alkaline developer.

In the pattern forming method of the present invention, the (3) exposing may be performed a plurality of times.

In the pattern forming method of the present invention, the (5) baking may be performed a plurality of times.

The resist film of the present invention is a film that is formed using the actinic-ray-sensitive or radiation-sensitive resin composition. For example, the resist film is a film formed by coating the actinic-ray-sensitive or radiation-sensitive resin composition onto a substrate.

Hereinafter, the actinic-ray-sensitive or radiation-sensitive resin composition usable in the present invention will be described.

In addition, the present invention also includes the actinic-ray-sensitive or radiation-sensitive resin composition described below.

The actinic-ray-sensitive or radiation-sensitive resin composition according to the present invention is used for negative development (development in which solubility in a developer is decreased by exposure, and the exposed portion remains as a pattern while the unexposed portion is removed). That is, the actinic-ray-sensitive or radiation-sensitive resin composition according to the present invention is used as an actinic-ray-sensitive or radiation-sensitive resin composition for organic solvent development, which is used for development performed using a developer that contains an organic solvent. Herein, "for organic solvent development" means that the actinic-ray-sensitive or radiation-sensitive resin composition is at least provided to the developing using a developer that contains an organic solvent.

The actinic-ray-sensitive or radiation-sensitive resin composition of the present invention is typically a resist composition, and preferably a negative resist composition (that is, a resist composition for organic solvent development) since particularly greater effects can be obtained. Moreover, the composition according to the present invention is typically a chemical amplification type resist composition.

[1] (A) Resin that contains 65 mol % or more of a repeating unit having a group which generates a polar group by being degraded by the action of an acid based on all repeating units in the resin and a repeating unit represented by the General Formula (I) and/or (II).

The resin (hereinafter, also referred to as a "resin (A)") that contains 65 mol % or more of a repeating unit having a group which generates a polar group by being degraded by the action of an acid based on all repeating units in the resin and a repeating unit represented by the General Formula (I) and/or (II), which is used for the actinic-ray-sensitive or radiation-sensitive resin composition according to the present invention, is a resin of which the polarity increases by the action of an acid and the solubility in a developer containing an organic solvent decreases.

Examples of the resin (A) used for the actinic-ray-sensitive or radiation-sensitive resin composition according to the present invention include a resin (hereinafter, also referred to as an "acid-degradable resin") having a group (hereinafter, also referred to as an "acid-degradable group") that generates a polar group by being degraded by the action of an acid in a main chain or a side chain of the resin or in both the main and side chains of the resin.

In addition, this resin is a resin of which the polarity increases by the action of an acid and the solubility in an alkaline developer increases.

In the resin (A) of the present invention, the content (the total of the repeating units if the resin contains a plurality of types of the repeating unit) of the repeating unit having an acid-degradable group is 65 mol % or more based on all repeating units in the resin (A). However, from the viewpoint of more reliably producing the effects of the present invention, the content of the repeating unit is preferably 70 mol % or more, more preferably more than 70 mol %, even more preferably 72 mol % or more, and still more preferably 75 mol % or more, based on all repeating units in the resin (A). In addition, from the viewpoint of forming an excellent pattern, the upper limit of the content is preferably 90 mol % or less, and more preferably 85 mol % or less.

The acid-degradable group preferably has a structure in which a polar group is protected with a group (eliminated substance) that is degraded and eliminated by the action of an acid.

The polar group is not particularly limited so long as the polar group is a group that is poorly-soluble or insoluble in a developer containing an organic solvent. Examples of the polar group include an acidic group (a group dissociated in 2.38% by mass of an aqueous tetramethylammonium hydroxide solution which has been used as a resist developer in the related art) such as a carboxyl group or a sulfonic acid group, an alcoholic hydroxyl group, and the like.

The alcoholic hydroxyl group is a hydroxyl group that is bonded to a hydrocarbon group, and refers to a hydroxyl group other than a hydroxyl group (phenolic hydroxyl group) that is directly bonded to an aromatic ring. This alcoholic hydroxyl group does not include an aliphatic alcohol (for example, a fluorinated alcohol group (a hexafluoroisopropanol group or the like)) in which an α-position has been substituted with an electron-attracting group such as a fluorine atom, as an acid group. The alcoholic hydroxyl group is preferably a hydroxyl group having a pKa of 12 to 20.

As the acid-degradable group, groups obtained by substituting a hydrogen atom of the groups described above with a group eliminated by an acid are preferable.

Examples of the group eliminated by an acid include —$C(R_{36})(R_{37})(R_{38})$, —$C(R_{36})(R_{37})(OR_{39})$, —$C(R_{01})(R_{02})(OR_{39})$, and the like.

In the above general formulae, each of $R_{36}$ to $R_{39}$ independently represents an alkyl group, a cycloalkyl group, an aryl group, an aralkyl group, or an alkenyl group. $R_{36}$ and $R_{37}$ may form a ring by binding to each other.

Each of $R_{01}$ and $R_{02}$ independently represents a hydrogen atom, an alkyl group, a cycloalkyl group, an aryl group, an aralkyl group, or an alkenyl group.

The alkyl group of $R_{36}$ to $R_{39}$ and $R_{01}$ and $R_{02}$ is desirably an alkyl group having 1 to 8 carbon atoms, and examples thereof include a methyl group, an ethyl group, a propyl group, an n-butyl group, a sec-butyl group, a hexyl group, an octyl group, and the like.

The cycloalkyl group of $R_{36}$ to $R_{39}$ and $R_{01}$ and $R_{02}$ may be monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, a cyclooctyl group, and the like. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, an androstanyl group, and the like. In addition, at least one carbon atom in the cycloalkyl group may be substituted with a hetero atom such as an oxygen atom.

The aryl group of $R_{36}$ to $R_{39}$ and $R_{01}$ and $R_{02}$ is preferably an aryl group having 6 to 10 carbon atoms, and examples thereof include a phenyl group, a naphthyl group, an anthryl group, and the like.

The aralkyl group of $R_{36}$ to $R_{39}$ and $R_{01}$ and $R_{02}$ is preferably an aralkyl group having 7 to 12 carbon atoms, and examples thereof include a benzyl group, a phenethyl group, a naphthylmethyl group, and the like.

The alkenyl group of $R_{36}$ to $R_{39}$ and $R_{01}$ and $R_{02}$ is preferably an alkenyl group having 2 to 8 carbon atoms, and examples thereof include a vinyl group, an allyl group, a butenyl group, a cyclohexenyl group, and the like.

The ring that $R_{36}$ and $R_{37}$ form by binding to each other is preferably a (monocyclic or polycyclic) cycloalkyl group. As the cycloalkyl group, a monocyclic cycloalkyl group such as a cyclopentyl group or a cyclohexyl group, and a polycyclic cycloalkyl group such as a norbornyl group, a tetracyclodecanyl group, a tetracyclododecanyl group or an adamantyl group are preferable. A monocyclic cycloalkyl group having 5 to 6 carbon atoms is more preferable, and a monocyclic cycloalkyl group having 5 carbon atoms is particularly preferable.

As a repeating unit having an acid-degradable group, which can be contained in the resin (A), the repeating unit represented by the following General Formula (AI) is preferable.

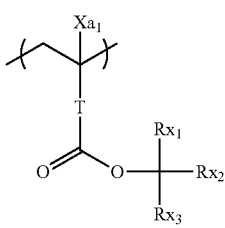

(AI)

In General Formula (AI), $Xa_1$ represents a hydrogen atom, a methyl group which may have a substituent, or a group represented by —$CH_2$—$R_9$. $R_9$ represents a hydrogen atom or a monovalent organic group. Examples of the monovalent organic group include an alkyl group having 5 or less carbon atoms and an acyl group having 5 or less carbon atoms. An alkyl group having 3 or less carbon atoms is preferable, and a methyl group is more preferable. $Xa_1$ preferably represents a hydrogen atom, a methyl group, a trifluoromethyl group, or a hydroxymethyl group.

T represents a single bond or a divalent linking group.

Each of $Rx_1$ to $Rx_3$ independently represents a (linear or branched) alkyl group or a (monocyclic or polycyclic) cycloalkyl group.

Two out of $Rx_1$ to $Rx_3$ may form a (monocyclic or polycyclic) cycloalkyl group by binding to each other.

Examples of the divalent linking group of T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$CH_2)_3$— group.

The alkyl group of $Rx_1$ to $Rx_3$ is preferably a methyl group, an ethyl group, an n-propyl group, an isopropyl group, an n-butyl group, an isobutyl group, or a t-butyl group having 1 to 4 carbon atoms.

The cycloalkyl group of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group that two out of $Rx_1$ to $Rx_3$ form by binding to each other is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. A monocyclic cycloalkyl group having 5 to 6 carbon atoms is particularly preferable.

As a preferable embodiment, $Rx_1$ is a methyl group or an ethyl group, and $Rx_2$ to $Rx_3$ form the above-described cycloalkyl group by binding to each other.

The respective groups described above may have a substituent, and examples of the substituent include an alkyl group (having 1 to 4 carbon atoms), a cycloalkyl group (having 3 to 8 carbon atoms), a halogen atom, a hydroxyl group, an alkoxy group (having 1 to 4 carbon atoms), a carboxyl group, an alkoxycarbonyl group (having 2 to 6 carbon atoms), and the like. The substituent preferably has 8 or less carbon atoms. Among these, from the viewpoint of further improving the dissolution contrast (dissolution contrast before and after acid degradation) between an exposed portion and an unexposed portion with respect to a developer containing an organic solvent, the substituent is preferably a substituent that does not have a hetero atom such as an oxygen atom, a nitrogen atom, or a sulfur atom (for example, the substituent is preferably not an alkyl group or the like substituted with a hydroxyl group), more preferably a group that includes only hydrogen atoms and carbon atoms, and particularly preferably a linear or branched alkyl group or cycloalkyl group.

Specific preferable examples of the repeating unit having an acid-degradable group will be shown below, but the present invention is not limited thereto.

In the specific examples, Rx and $Xa_1$ represent a hydrogen atom, $CH_3$, $CF_3$, or $CH_2OH$. Each of Rxa and Rxb represents an alkyl group having 1 to 4 carbon atoms. Z represents a substituent, and when there is a plurality of Zs, the plural Zs may be the same as or different from each other. p represents 0 or a positive integer. Specific and preferable examples of Z are the same as the specific and preferable examples of $R_{10}$ in General Formula (2-1) described later.

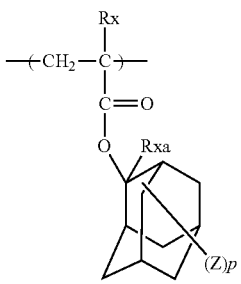

1

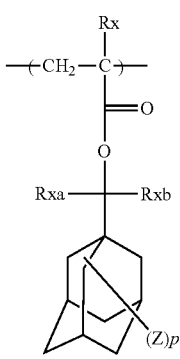

2

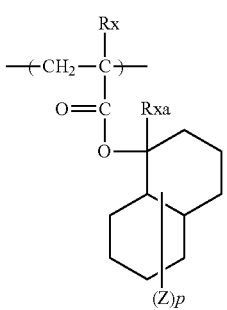

3

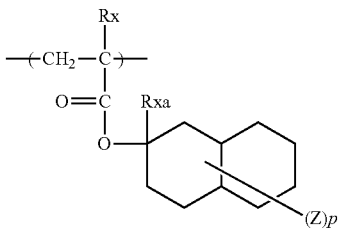

4

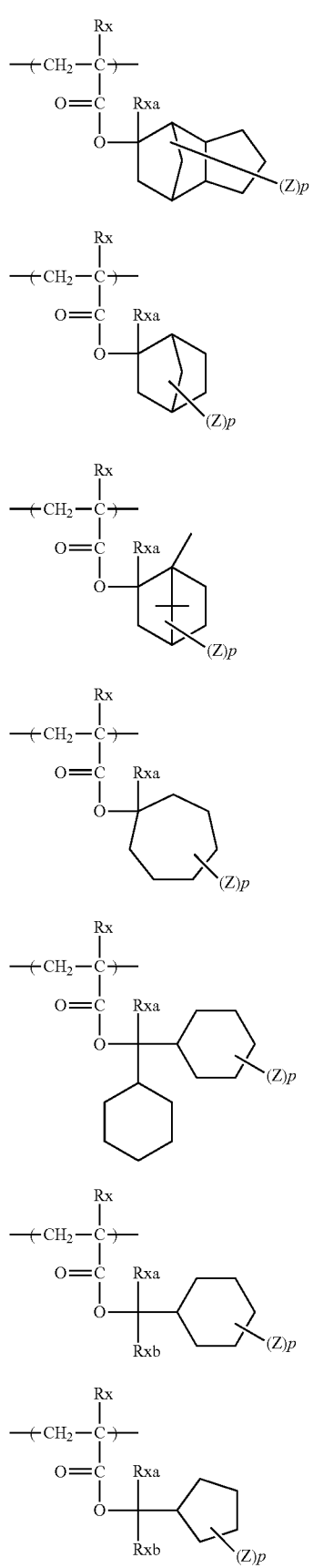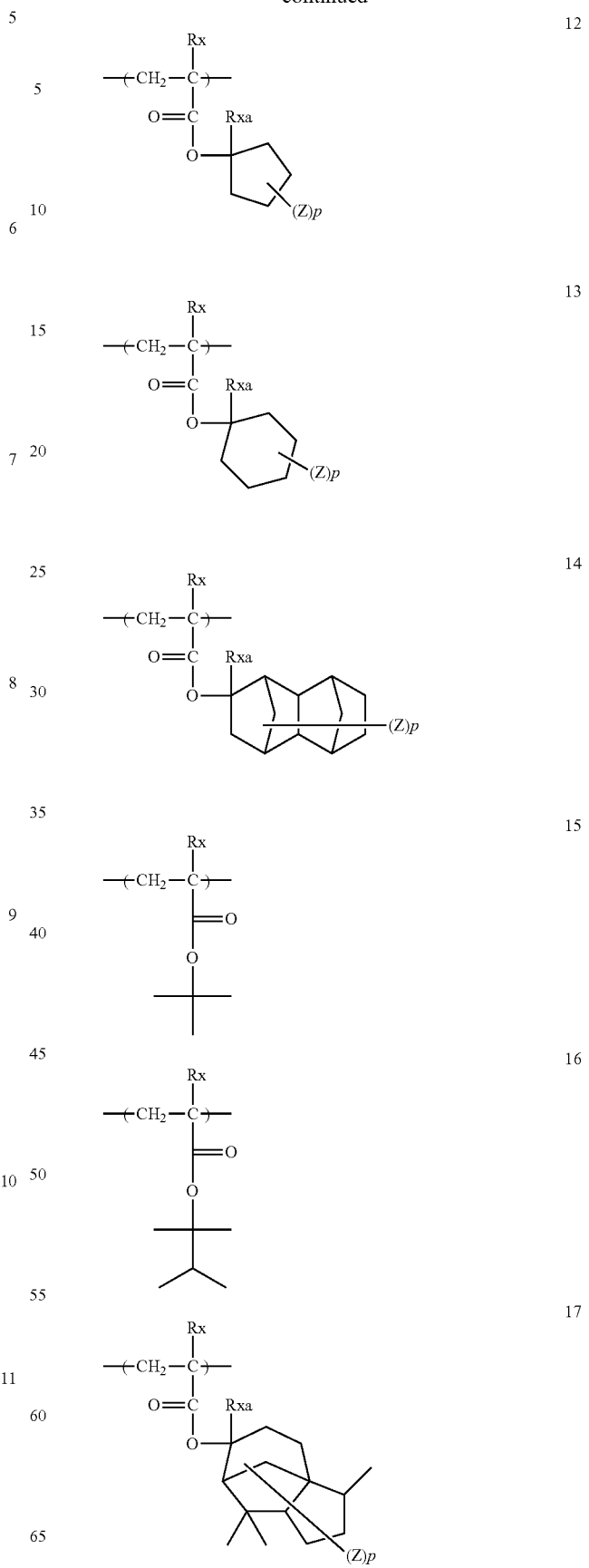

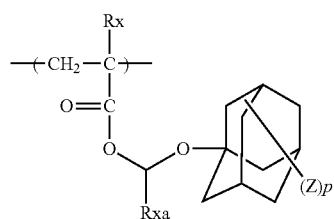
18
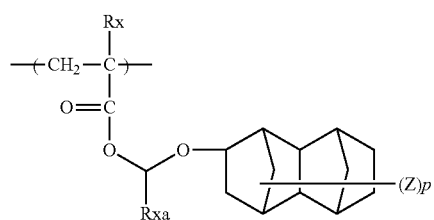
19
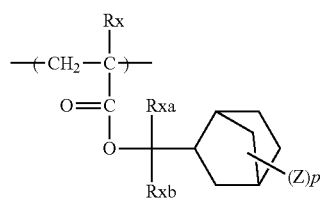
20
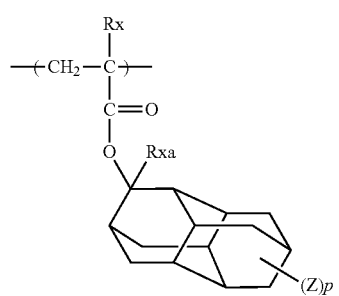
21
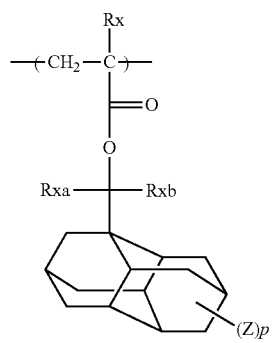
22
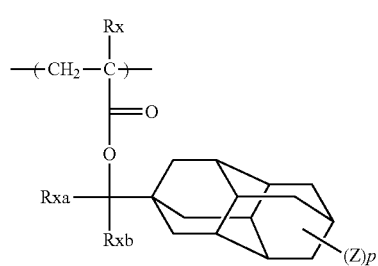
23
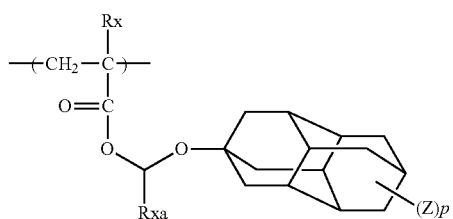
24
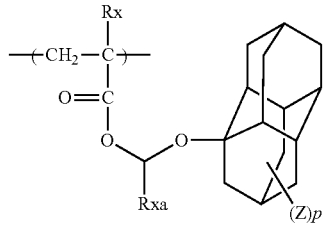
25
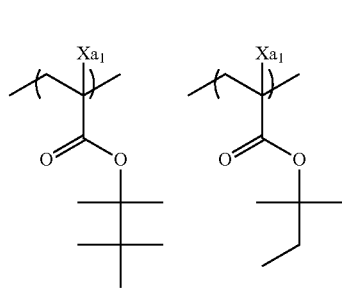
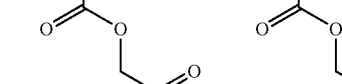
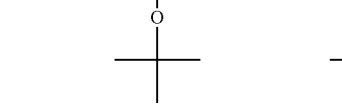
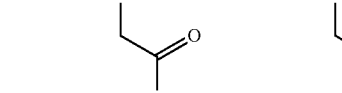
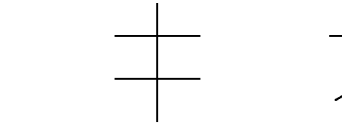

-continued
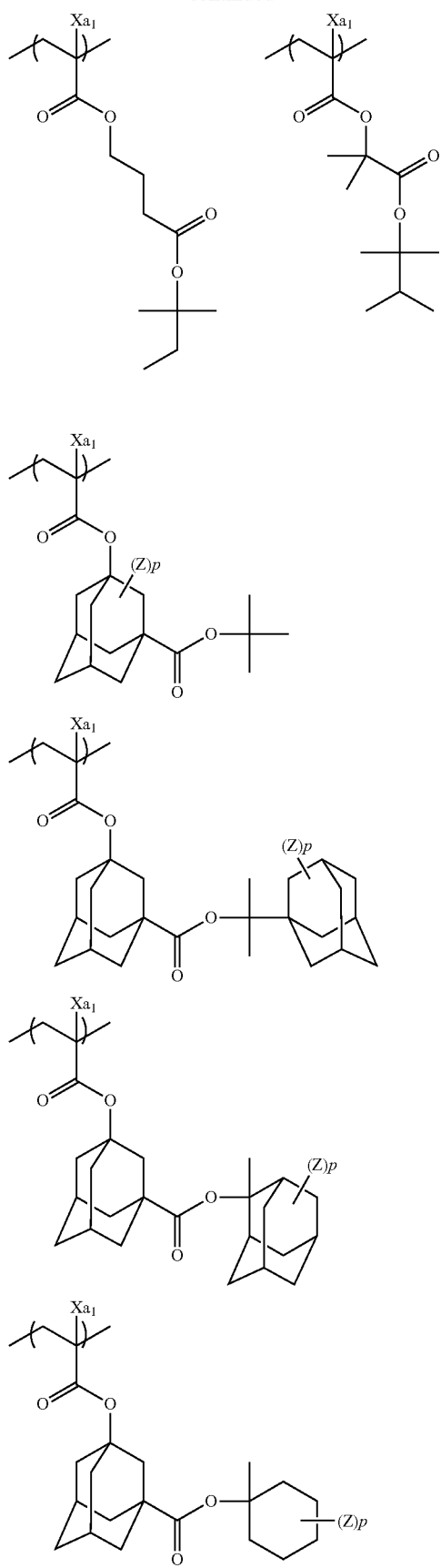
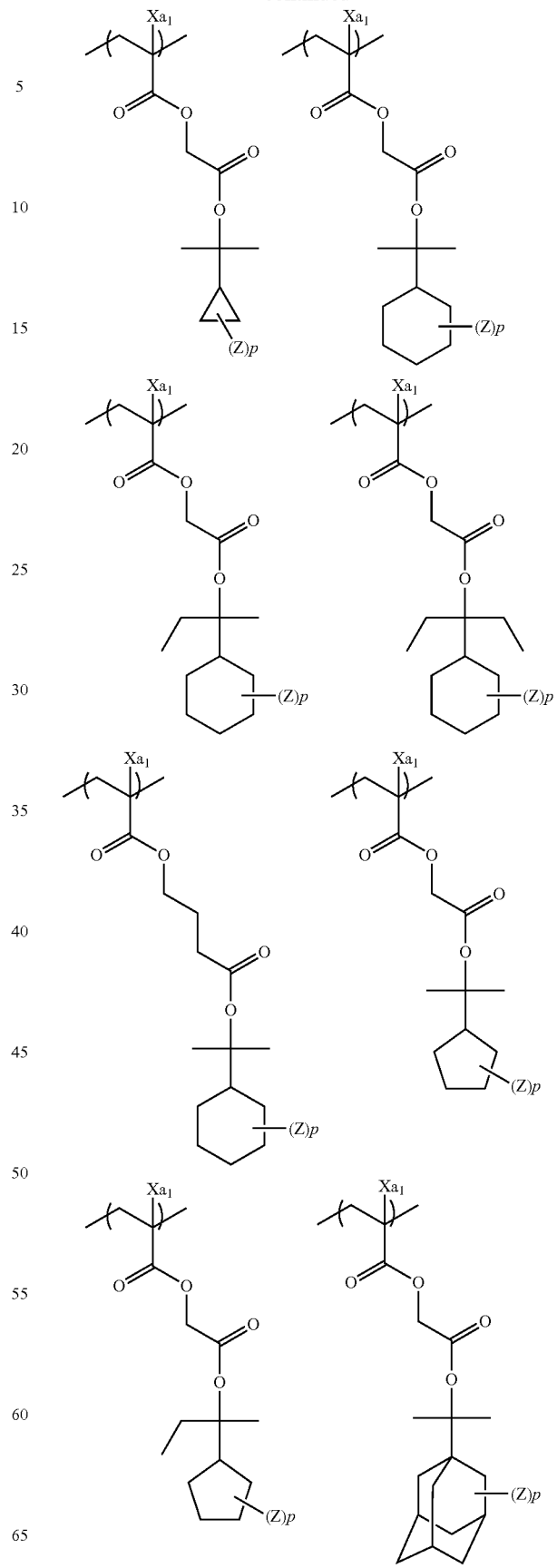

-continued
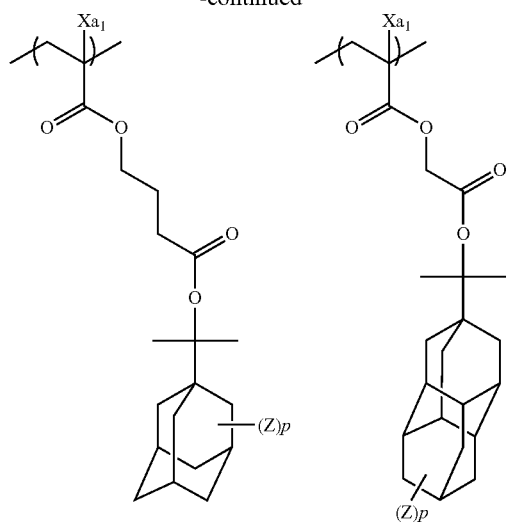
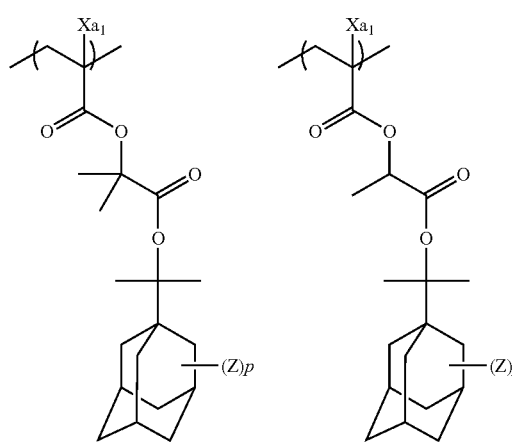
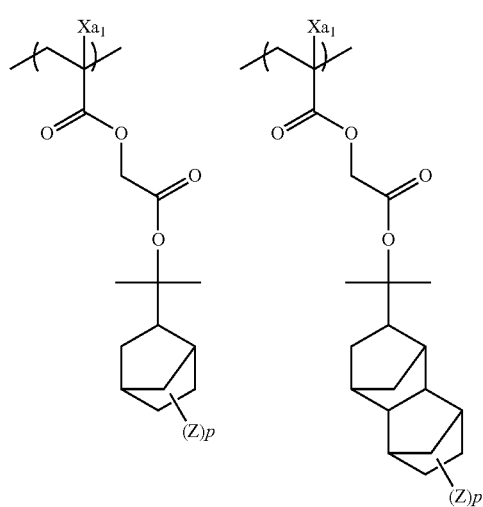
-continued
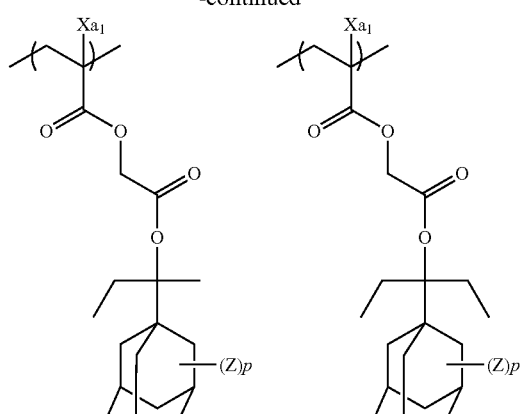
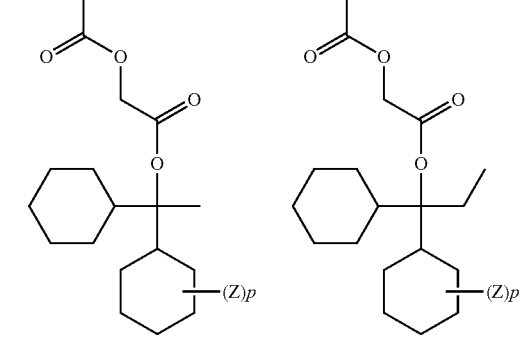
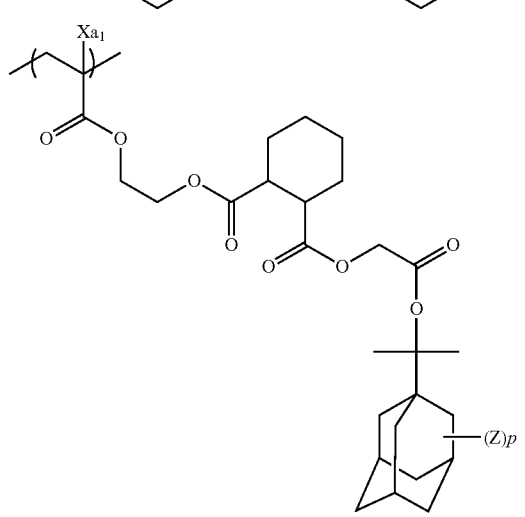
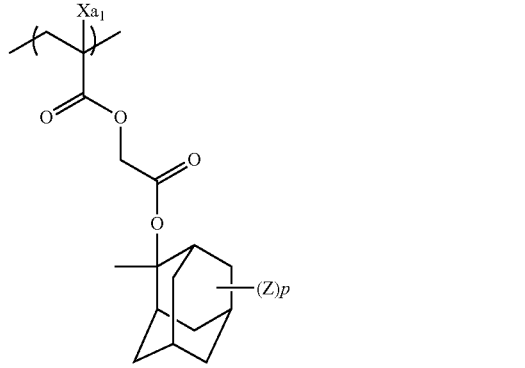

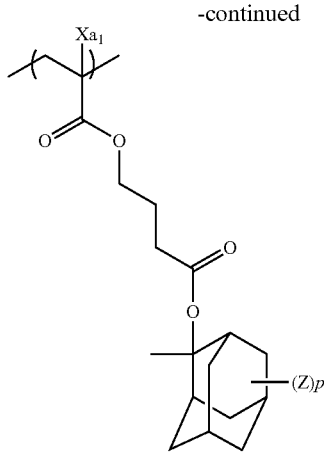
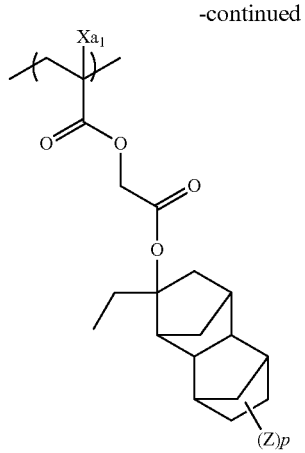
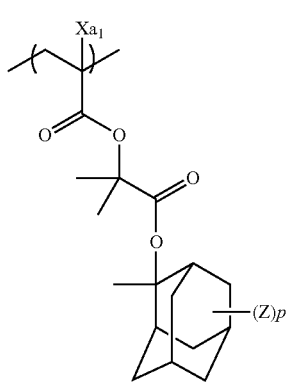
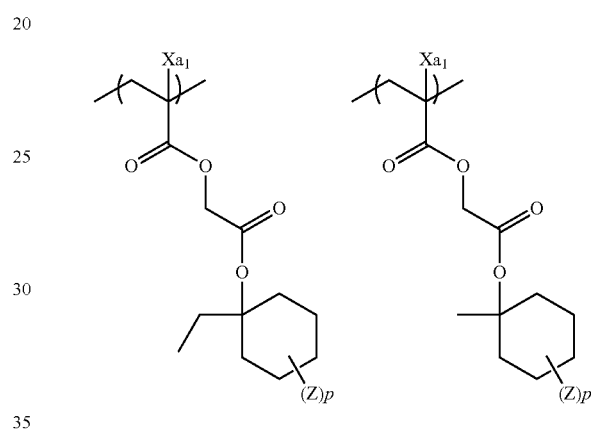
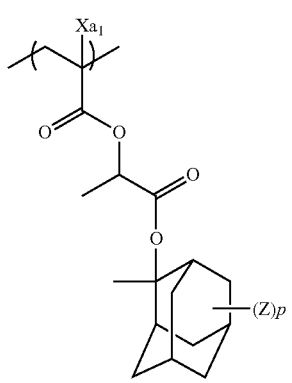
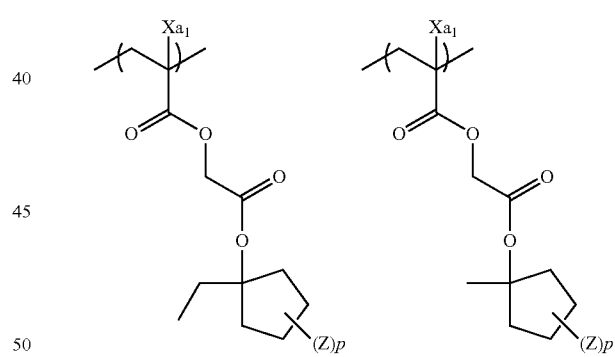
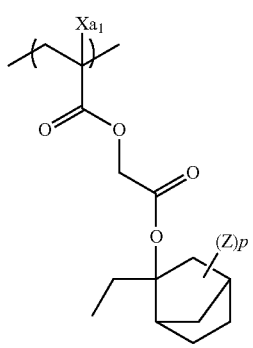
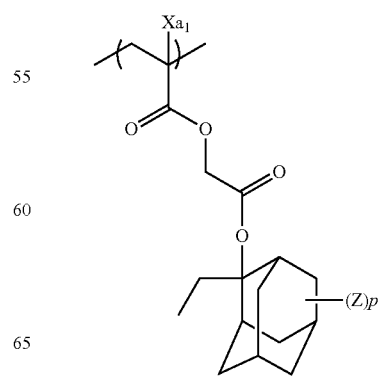

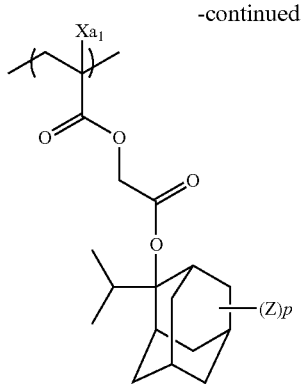

The resin (A) is more preferably a resin that has at least one of the repeating unit represented by General Formula (1) and the repeating unit represented by General Formula (2), as the repeating unit represented by General Formula (AI).

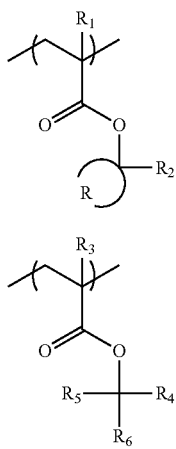

In General Formulae (1) and (2), each of $R_1$ and $R_3$ independently represents a hydrogen atom, a methyl group which may have a substituent, or a group represented by —CH—$R_9$. $R_9$ represents a hydroxyl group or a monovalent organic group.

Each of $R_2$, $R_4$, $R_5$, and $R_6$ independently represents an alkyl group or a cycloalkyl group.

R represents an atomic group that is necessary for forming an alicyclic structure with a carbon atom.

$R_1$ and $R_3$ preferably represent a hydrogen atom, a methyl group, a trifluoromethyl group, or a hydroxymethyl group. Specific and preferable examples of the monovalent organic group in $R_9$ are the same as those described for $R_9$ of General Formula (AI).

The alkyl group in $R_2$ may be linear or branched, and may have a substituent.

The cycloalkyl group in $R_2$ may be linear or branched, and may have a substituent.

$R_2$ is preferably an alkyl group, more preferably an alkyl group having 1 to 10 carbon atoms, and even more preferably an alkyl group having 1 to 5 carbon atoms. Examples of the alkyl group include a methyl group and an ethyl group.

R represents an atomic group necessary for forming an alicyclic structure with a carbon atom. The alicyclic structure that R forms with a carbon atom is preferably a monocyclic alicyclic structure, and this monocyclic alicyclic structure preferably has 3 to 7 carbon atoms, and more preferably has 5 or 6 carbon atoms.

The alkyl group in $R_4$, $R_5$, and $R_6$ may be linear or branched, and may have a substituent. The alkyl group is preferably a methyl group, an ethyl group, an n-propyl group, an isopropyl group, an n-butyl group, an isobutyl group, a t-butyl group, or the like having 1 to 4 carbon atoms.

The cycloalkyl group in $R_4$, $R_5$, and $R_6$ may be linear or branched, and may have a substituent. The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

Examples of the repeating unit represented by General Formula (1) include a repeating unit represented by the following General Formula (1-a).

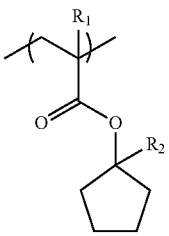

In the formula, $R_1$ and $R_2$ have the same definition as that of the respective $R_1$ and $R_2$ in General Formula (1).

The repeating unit represented by General Formula (2) is preferably the repeating unit represented by the following General Formula (2-1).

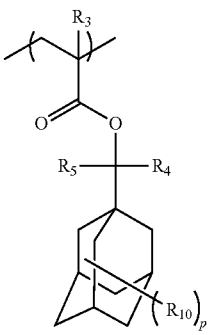

In Formula (2-1), each of $R_3$ to $R_5$ has the same definition as that in General Formula (2).

$R_{10}$ represents a substituent including a polar group. When there is a plurality of $R_{10}$s, $R_{10}$s may be the same as or different from each other. Examples of the substituent include a group including only hydrogen atoms and carbon atoms, from the viewpoint of increasing the dissolution contrast (dissolution contrast before and after acid degradation) between an exposed portion and an unexposed portion with respect to a developer containing an organic solvent, and for example, a linear or branched alkyl group or cycloalkyl group is preferable as the substituent.

p represents an integer of 0 to 15. p is preferably 0 to 2, and more preferably 0 or 1.

The resin (A) is more preferably a resin that includes at least one of the repeating unit represented by General Formula (1) and the repeating unit represented by General Formula (2), as the repeating unit represented by General Formula (AI). In addition, as another embodiment, the resin (A) is more preferably a resin that includes at least two kinds of the repeating units represented by General Formula (1), as the repeating unit represented by General Formula (AI).

The repeating unit of the resin (A) that has an acid-degradable group may be used alone, or two or more kinds of the repeating unit may be concurrently used. As combinations in case of the concurrent use, the following are preferable. In the following formulae, each R independently represents a hydrogen atom or a methyl group.

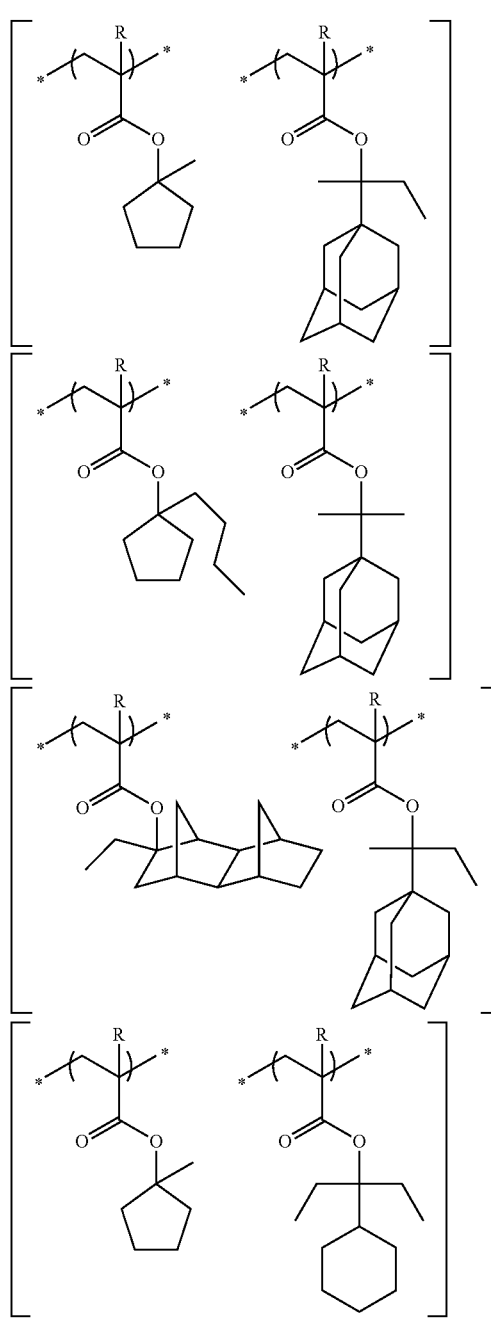

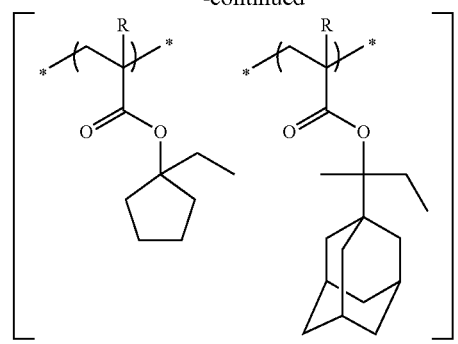

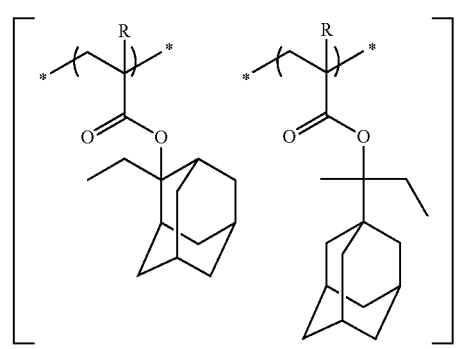

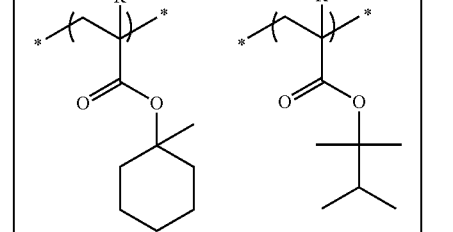

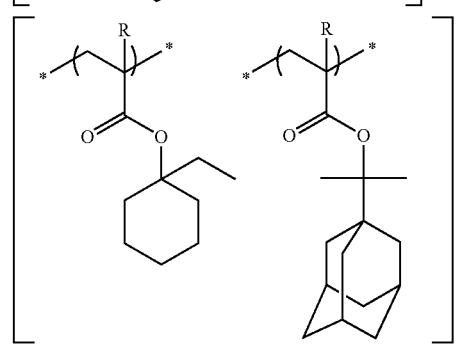

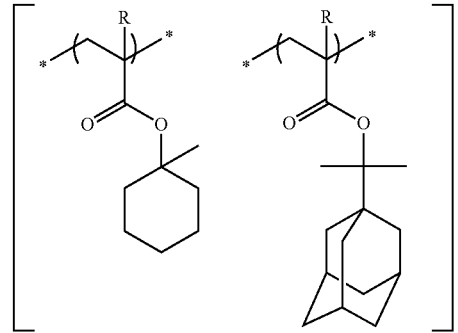

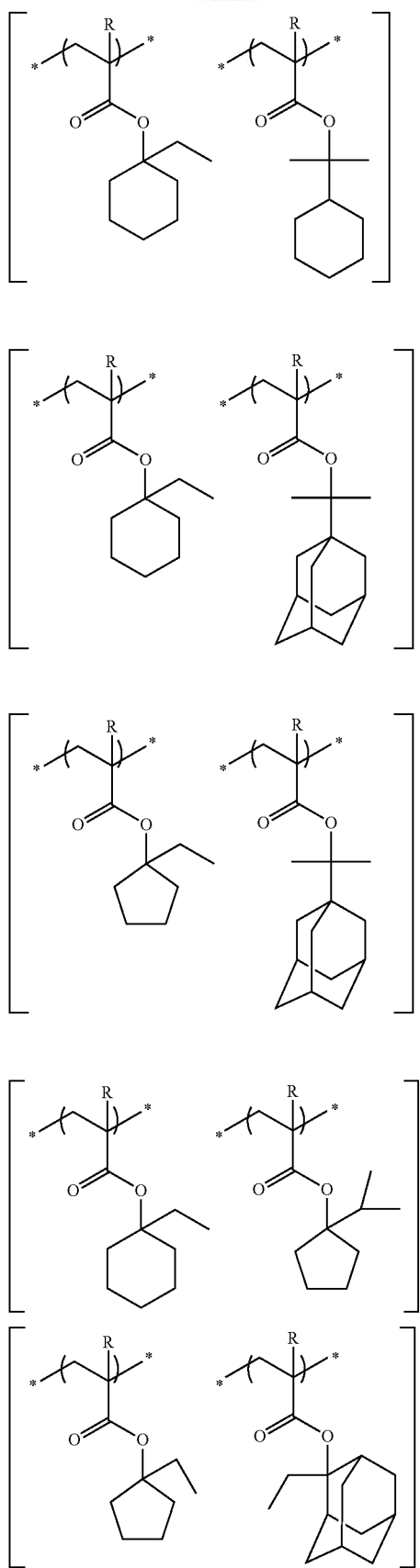
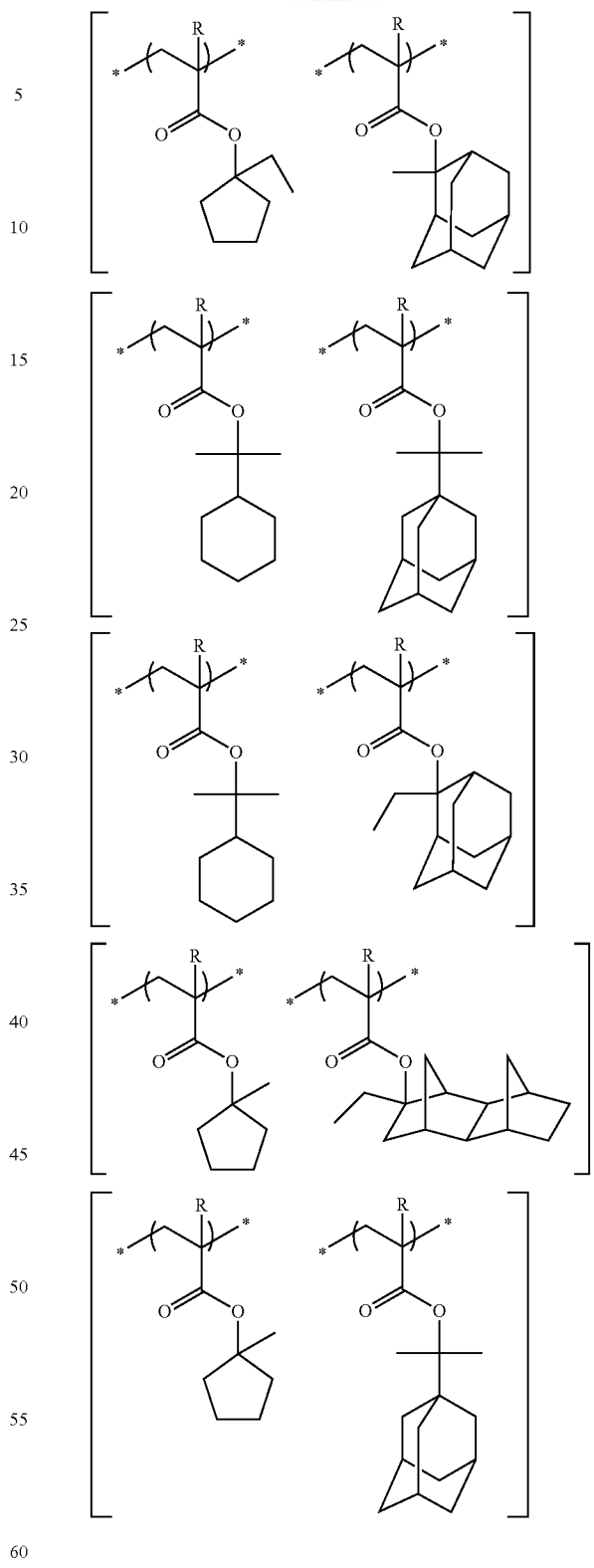
As embodiments different from the repeating units exemplified above, the following repeating units that generate an alcoholic hydroxyl group are also preferable.
In the following specific examples, $Xa_1$ represents a hydrogen atom, $CH_3$, $CF_3$, or $CH_2OH$.

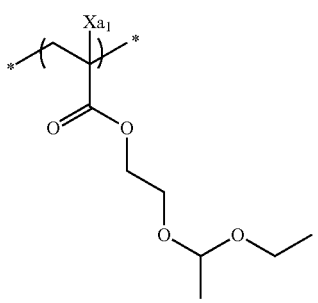
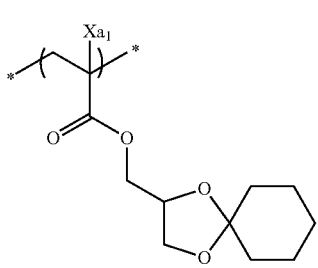
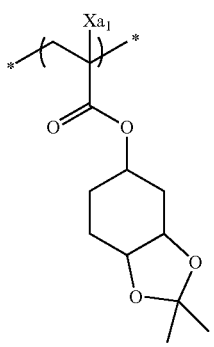
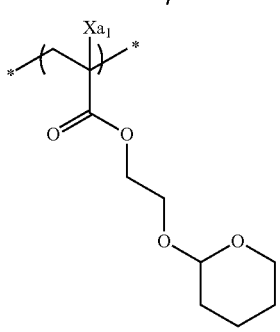
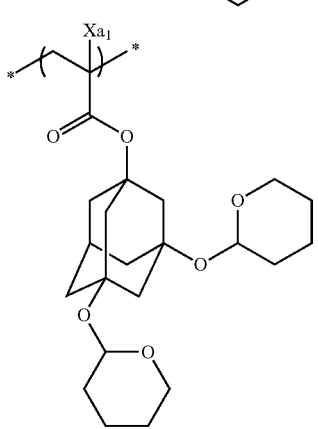
-continued
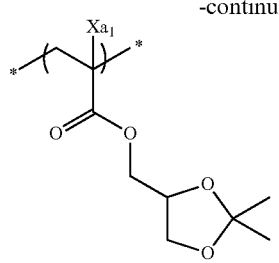
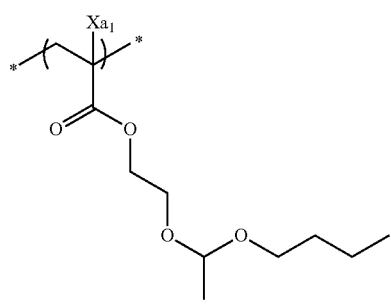
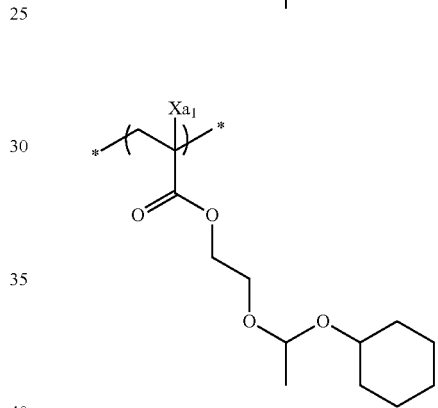
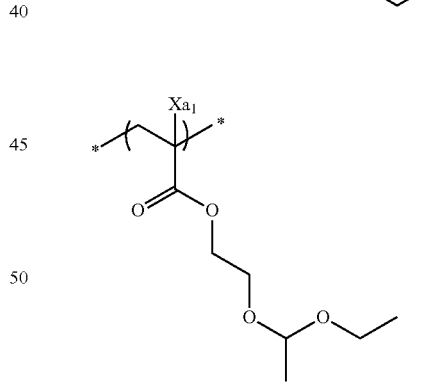
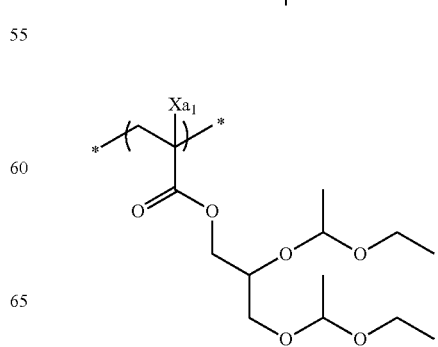

-continued

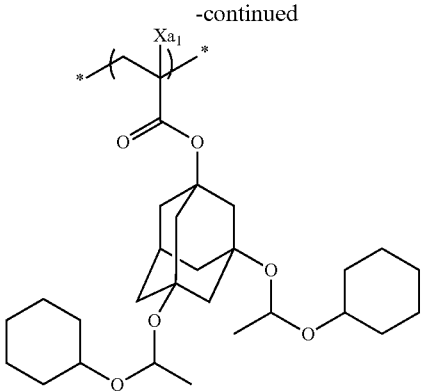

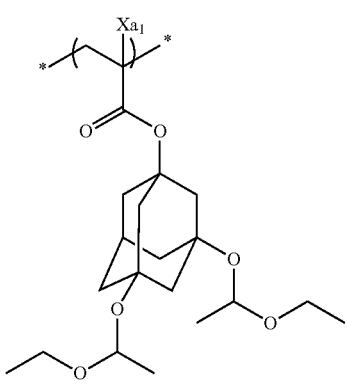

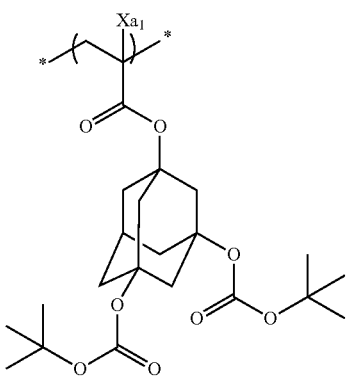

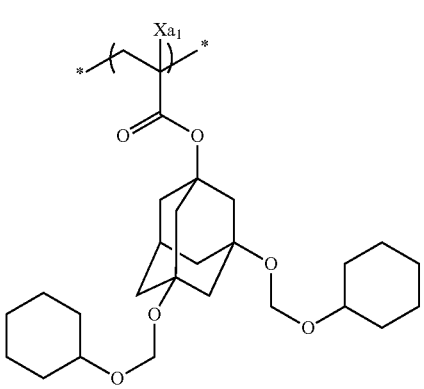

-continued

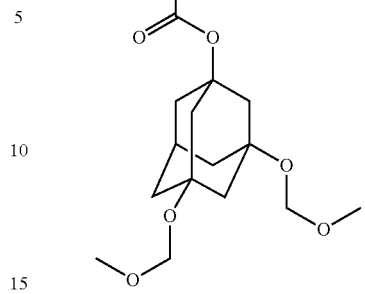

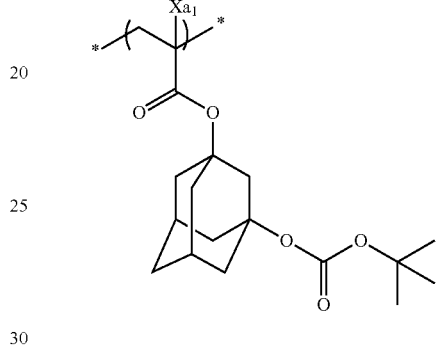

In the present invention, the resin (A) preferably contains, as the repeating unit having a group (acid-degradable group) which generates a polar group by being degraded by the action of an acid, 50 mol % or more of a repeating unit (total of the repeating units if the resin contains a plurality of types of the repeating unit) which generates an eliminated substance having a molecular weight (a weighted average value of a molecular weight based on mol % (hereinafter, also referred to as a molar average value) when a plurality of types of the eliminated substance is generated) of 140 or less by the degradation of the acid-degradable group, based on all repeating units in the resin. Particularly, when a negative image is formed using the resin composition of the present invention, by reducing the molecular weight of the eliminated substance, the reduction of the exposed portion caused by the developer is inhibited, and accordingly, the reduction in film thickness of the pattern portion is prevented.

In the present invention, the "eliminated substance generated by the degradation of the acid-degradable group" refers to a substance that is degraded and eliminated by the action of an acid, which is a substance corresponding to the group degraded and eliminated by the action of an acid. For example, in a case of a repeating unit (a) (a repeating unit at the very left at the top among those exemplified later) which will be described later, the eliminated substance refers to an alkene ($H_2C=C(CH_3)_2$) generated by the degradation of a t-butyl moiety.

In the present invention, the molecular weight (molar average value when a plurality of types of the eliminated substance is generated) of the eliminated substance generated by the degradation of the acid-degradable group is preferably 100 or less, from the viewpoint of preventing the reduction in film thickness of the pattern portion.

Though not particularly limited, the molecular weight (average value when a plurality of types of the eliminated substance is generated) of the eliminated substance generated by the degradation of the acid-degradable group is preferably 45 or more, and more preferably 55 or more, from the viewpoint of causing the acid-degradable group to carry out its function.

From the viewpoint of more reliably maintaining the film thickness of the pattern portion which is an exposed portion, the resin used in the present invention contains preferably 60 mol % or more, more preferably 65 mol % or more, and even more preferably 70 mol % or more of the repeating unit (total of the repeating units if the resin contains a plurality of types of the repeating unit) having an acid-degradable group, which can generate an eliminated substance having a molecular weight of 140 or less by the degradation of the acid-degradable group. In addition, though not particularly limited, the upper limit of the amount is preferably 90 mol % or less, and more preferably 85 mol % or less.

Specific examples of the repeating unit having an acid-degradable group, which generates an eliminated substance having a molecular weight of 140 or less by the degradation of the acid-degradable group, will be shown below. However, the present invention is not limited to the examples.

In the specific examples shown below, $Xa_1$ represents a hydrogen atom, $CH_3$, $CF_3$, or $CH_2OH$.

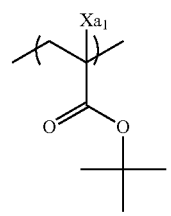

Repeating unit (α)
Molecular weight of eliminated substance: 56

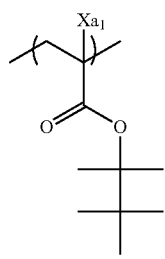

Molecular weight of eliminated substance: 98

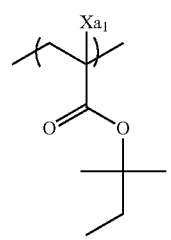

Molecular weight of eliminated substance: 70

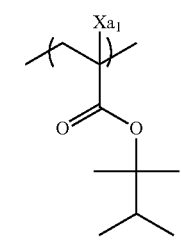

Molecular weight of eliminated substance: 84

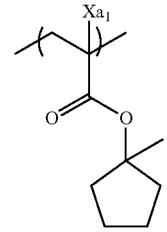

Molecular weight of eliminated substance: 82

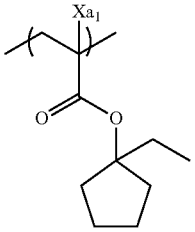

Molecular weight of eliminated substance: 96

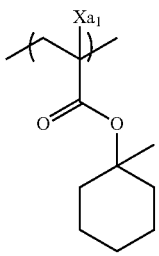

Molecular weight of eliminated substance: 96

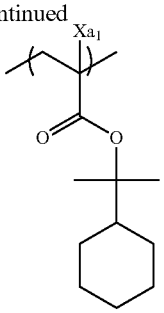

Molecular weight of eliminated substance: 124

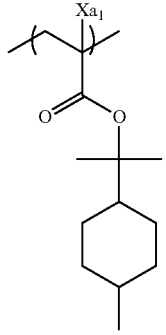

Molecular weight of eliminated substance: 138

Next, the repeating unit represented by the General Formula (I) or (II) will be described.

The resin (A) in the present invention contains the repeating unit represented by the General Formula (I) and/or (II) as described above.

In the General Formulae (I) and (II), the alkyl group represented by $R_{11}$ and $R_{21}$ is preferably an alkyl group having 1 to 4 carbon atoms, more preferably a methyl group or an ethyl group, and particularly preferably a methyl group.

Each of $R_{12}$ and $R_{22}$ independently represents a hydrogen atom, an alkyl group, a cycloalkyl group, an alkoxy group, an alkoxycarbonyl group, a carboxyl group, a halogen atom, a hydroxyl group, a cyano group, or an acid-degradable group.

The alkyl group represented by $R_{12}$ and $R_{22}$ is preferably an alkyl group having 1 to 8 carbon atoms, and examples thereof include a methyl group, an ethyl group, and the like.

The cycloalkyl group represented by $R_{12}$ and $R_{22}$ is preferably a cycloalkyl group having 3 to 8 carbon atoms, and examples thereof include a cyclopentyl group, a cyclohexyl group, and the like.

The alkoxy group represented by $R_{12}$ and $R_{22}$ is preferably an alkoxy group having 1 to 8 carbon atoms, and examples thereof include a methoxy group, and ethoxy group, and the like.

The alkoxycarbonyl group represented by $R_{12}$ and $R_{22}$ is preferably an alkoxycarbonyl group having 2 to 8 carbon atoms, and examples thereof include a methoxy carbonyl group, an ethoxy carbonyl group, and the like.

Specific and preferable examples of the acid-degradable group represented by $R_{12}$ and $R_{22}$ include the same ones as those described above as the acid-degradable group in the resin (A).

$R_{12}$ and $R_{22}$ are more preferably an alkyl group having 1 to 4 carbon atoms, a cyano group, or an acid-degradable group.

Each of n1 and n2 is independently preferably an integer of 0 to 2, and more preferably 0 or 1.

Each of $R_{13}$ and $R_{23}$ independently represents an alkylene group, a cycloalkylene group, or a combination thereof. When there is a plurality of $R_{13}$s, $R_{13}$s may be the same as or different from each other. When there is a plurality of $R_{23}$s, $R_{23}$s may be the same as or different from each other.

The alkylene group and cycloalkylene group represented by $R_{13}$ and $R_{23}$ may have a substituent.

The alkylene group represented by $R_{13}$ and $R_{23}$ is preferably chain-like alkylene having 1 to 10 carbon atoms, and more preferably chain-like alkylene having 1 to 5 carbon atoms, and examples thereof include a methylene group, an ethylene group, a propylene group, and the like.

The cycloalkylene group represented by $R_{13}$ and $R_{23}$ is preferably a cycloalkylene group having 3 to 20 carbon atoms, and examples thereof include a cyclohexylene group, a cyclopentylene group, a norbornylene group, an adamantylene group, and the like. In order to bring about the effects of the present invention, a chain-like alkylene group is more preferably, and a methylene group is particularly preferable.

The alkylene group and cycloalkylene group represented by $R_{13}$ and $R_{23}$ and the alkyl group represented by $R_{11}$ and $R_{21}$ may be substituted respectively, and examples of the substituent include a halogen atom such as a fluorine atom, a chlorine atom, or a bromine atom; a mercapto group; a hydroxyl group; an alkoxy group such as a methoxy group, an ethoxy group, an isopropoxy group, a t-butoxy group, or an benzyloxy group; and an acyloxy group such as an acetyloxy group or a propionyloxy group.

Each of $Y_1$ and $Y_2$ independently represents a single bond, an ether bond, an ester bond, an amide bond, a urethane bond (a group represented by

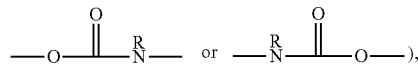

or a ureylene bond (a group represented by

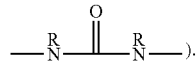

Herein, each R independently represents a hydrogen atom, an alkyl group, a cycloalkyl group, or an aryl group.

When there is a plurality of $Y_1$s, $Y_1$s may be the same as or different from each other. When there is a plurality of $Y_2$s, $Y_2$s may be the same as or different from each other.

$X_1$ and $X_2$ are preferably a methylene group or an oxygen atom.

m1 is a repeating number of a structure represented by —$R_{13}$—$Y_1$—, and represents an integer of 0 to 4. m1 is preferably 0 or 1, and more preferably 0. When m1 is 0, —$R_{13}$—$Y_1$— does not exist, and a single bond is formed.

m2 is a repeating number of a structure represented by —$R_{23}$—$Y_2$—, and represents an integer of 0 to 4. m2 is preferably 0 or 1, and more preferably 0. When m2 is 0, —$R_{23}$—$Y_2$-does not exist, and a single bond is formed.

Each of R11 and R21 is independently preferably a hydrogen atom, a methyl group, a trifluoromethyl group, or a hydroxymethyl group.

The repeating unit represented by the General Formula (I) or (II) has a lactone structure. Accordingly, the repeating unit has optical isomers, and any of the optical isomers may be used. Furthermore, one kind of optical isomer may be used alone, or a plurality of optical isomers may be used in combination. When one kind of optical isomer is mainly used, the optical purity (ee) thereof is preferably 90% or higher, and more preferably 95% or higher.

In the resin (A) of the present invention, the content (total of repeating units when the resin contains a plurality of types of the repeating unit) of the repeating unit represented by the General Formula (I) or (II) is preferably 3 mol % to 40 mol %, more preferably 3 mol % to 35 mol %, even more preferably 5 mol % to 33 mol %, and still more preferably 10 mol % to 30 mol %, based on all repeating units in the resin (A).

Specific examples of the repeating unit represented by the General Formula (I) or (II) will be shown below, but the present invention is not limited thereto.

In the following specific examples, Rx represents an alkyl group which may have a substituent, and preferably represents a hydrogen atom, a methyl group, a hydroxymethyl group, or an acetyloxymethyl group.

(In the formulae, Rx represents H, $CH_3$, $CH_2OH$, or $CF_3$)

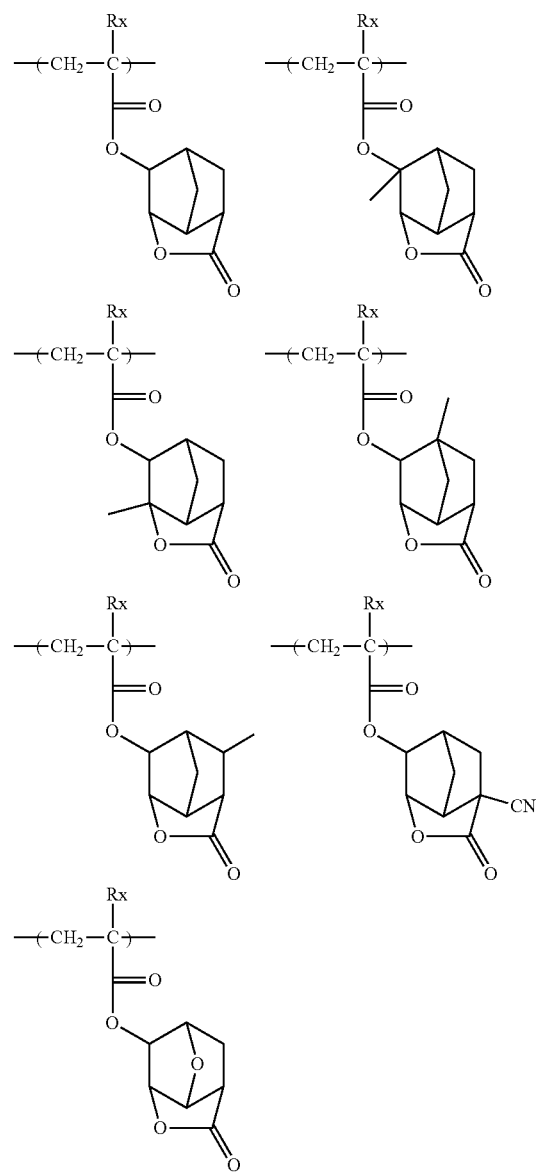

35
-continued
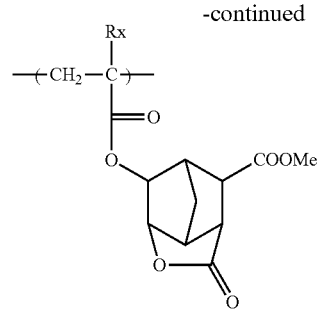
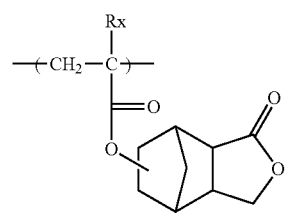
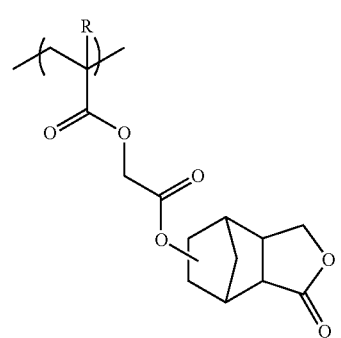
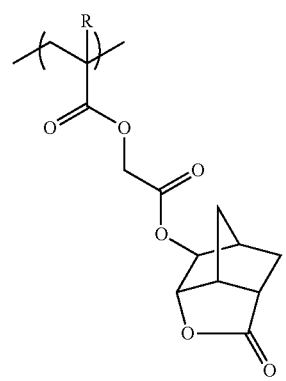
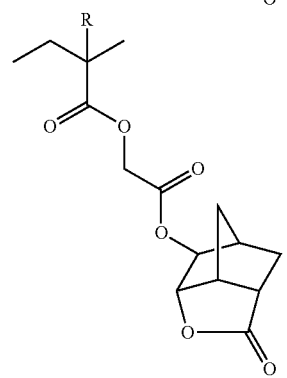
36
-continued
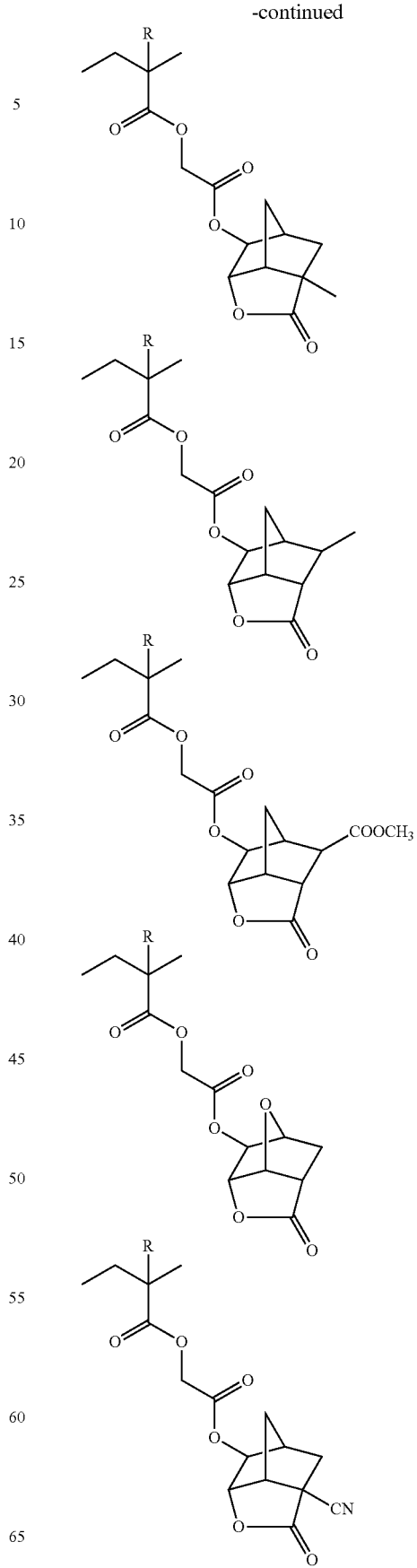

37
-continued
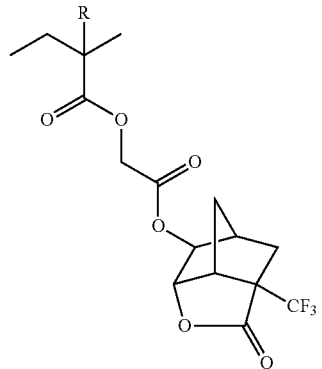
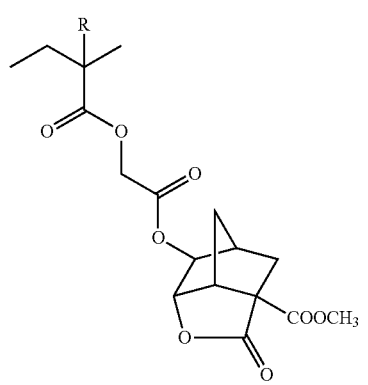
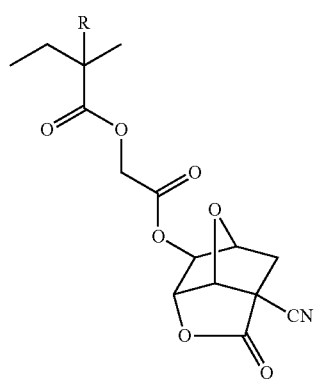
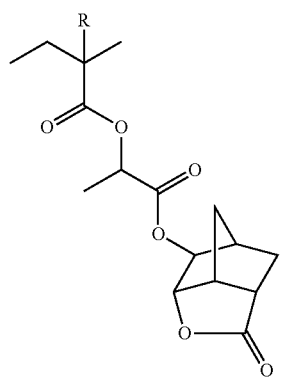
38
-continued
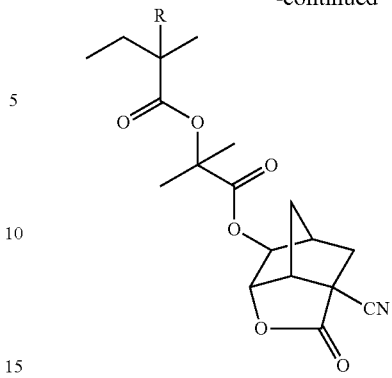
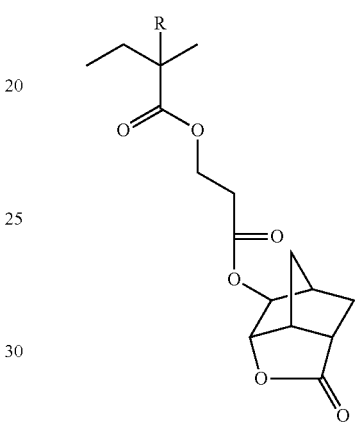
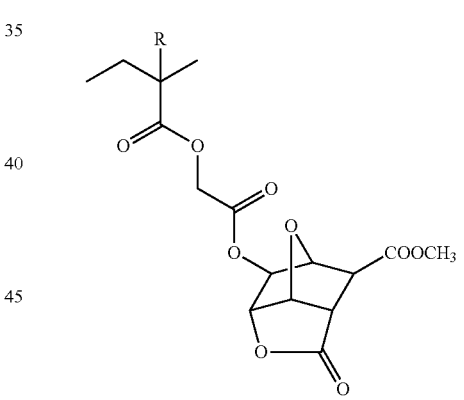
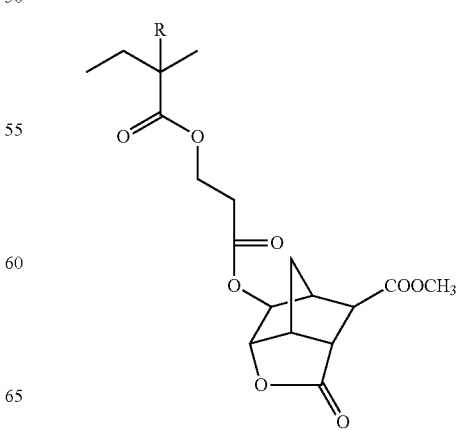

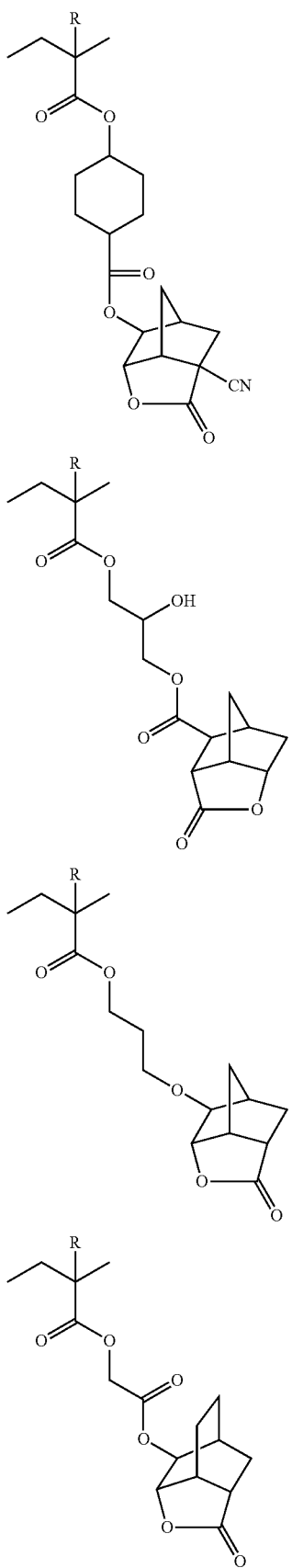

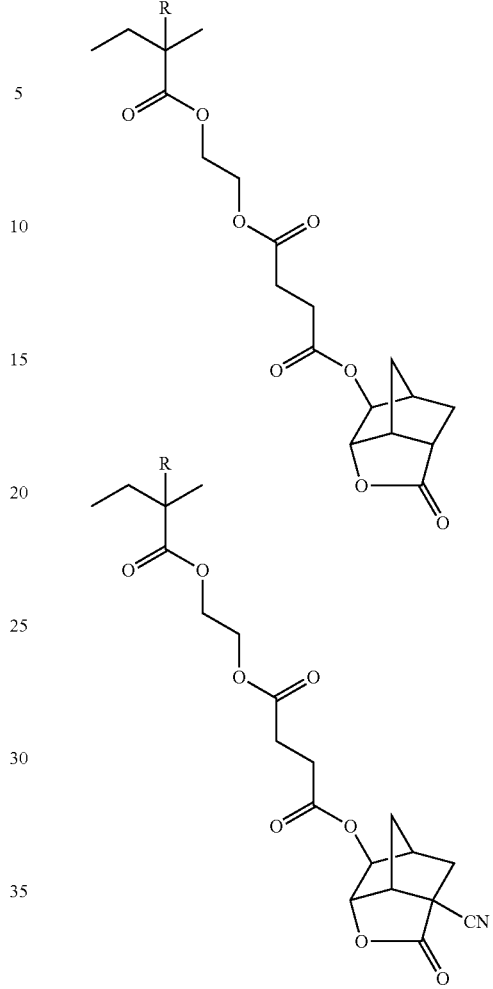

The resin (A) may further contain a repeating unit having a lactone structure (hereinafter, simply referred to as a "concurrently used lactone structure" in some cases) other than the repeating unit represented by the General Formula (I) or (II).

As the concurrently used lactone structure, any structure can be used so long as the structure has a lactone structure.

Specific examples of the repeating unit having a concurrently used lactone structure will be shown below, but the present invention is not limited thereto.

In the following specific examples, Rx represents a hydrogen atom, an alkyl group which may have a substituent, or a halogen atom, and preferably represents a hydrogen atom, a methyl group, a hydroxymethyl group, or an acetyloxymethyl group.

(In formulae, Rx represents H, $CH_3$, $CH_2OH$, or $CF_3$)

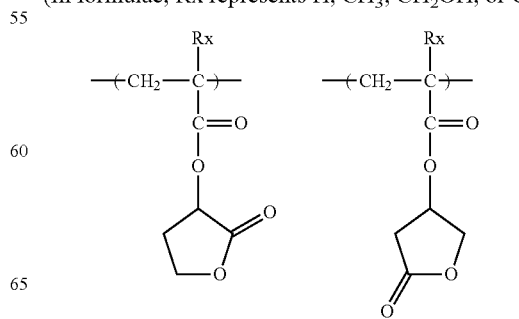

-continued
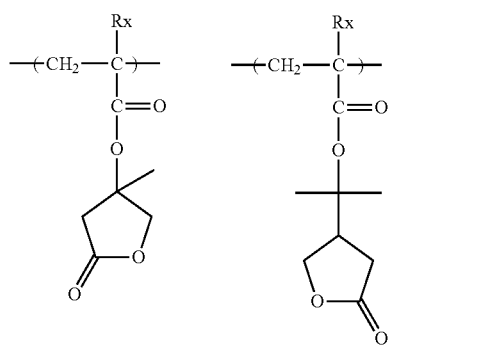
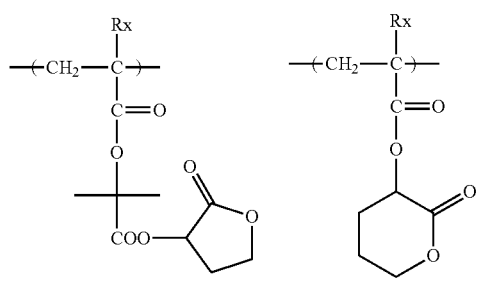
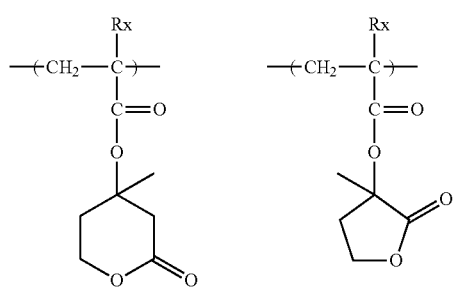
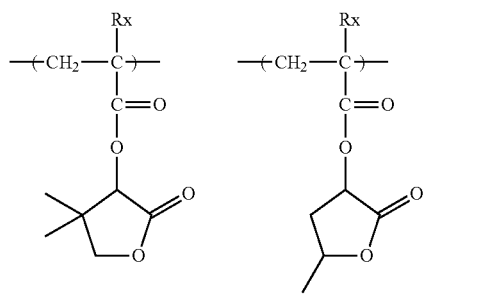
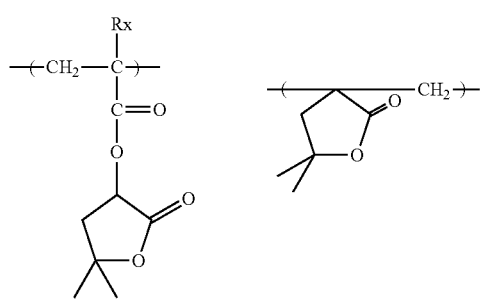
-continued
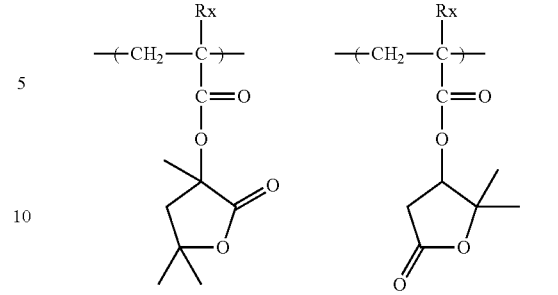
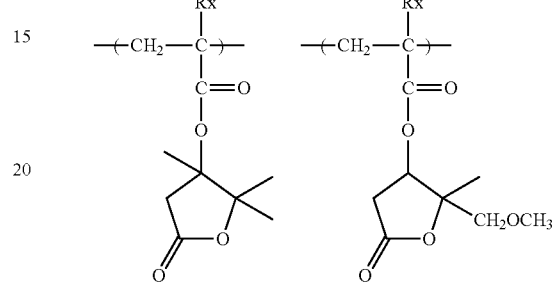
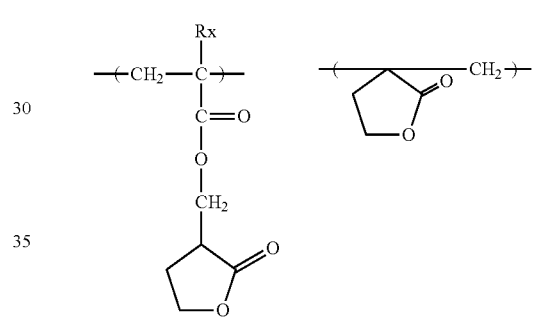
(In formulae, Rx represents H, CH$_3$, CH$_2$OH, or CF$_3$)
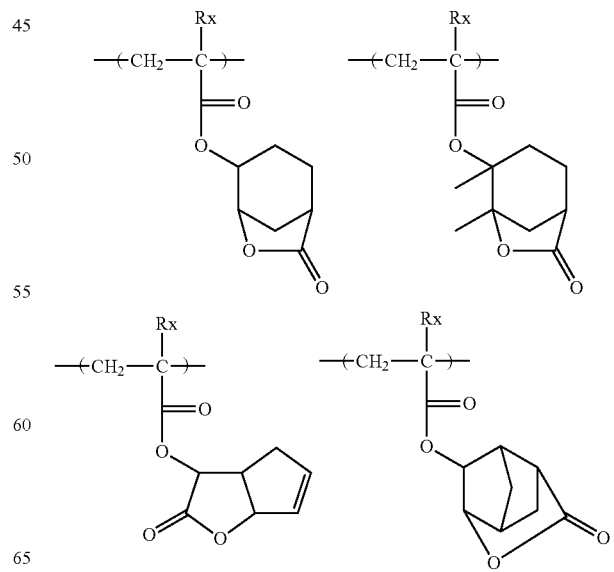

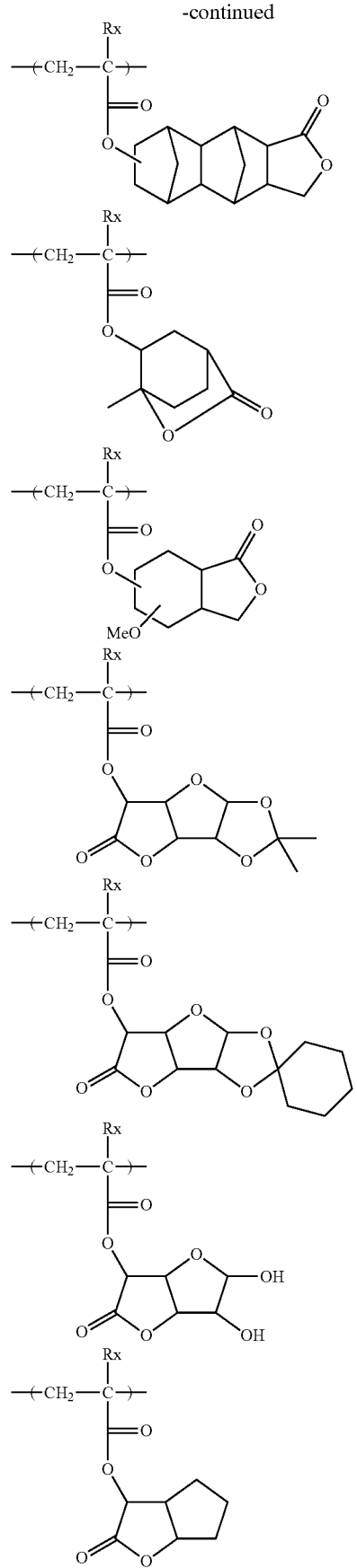
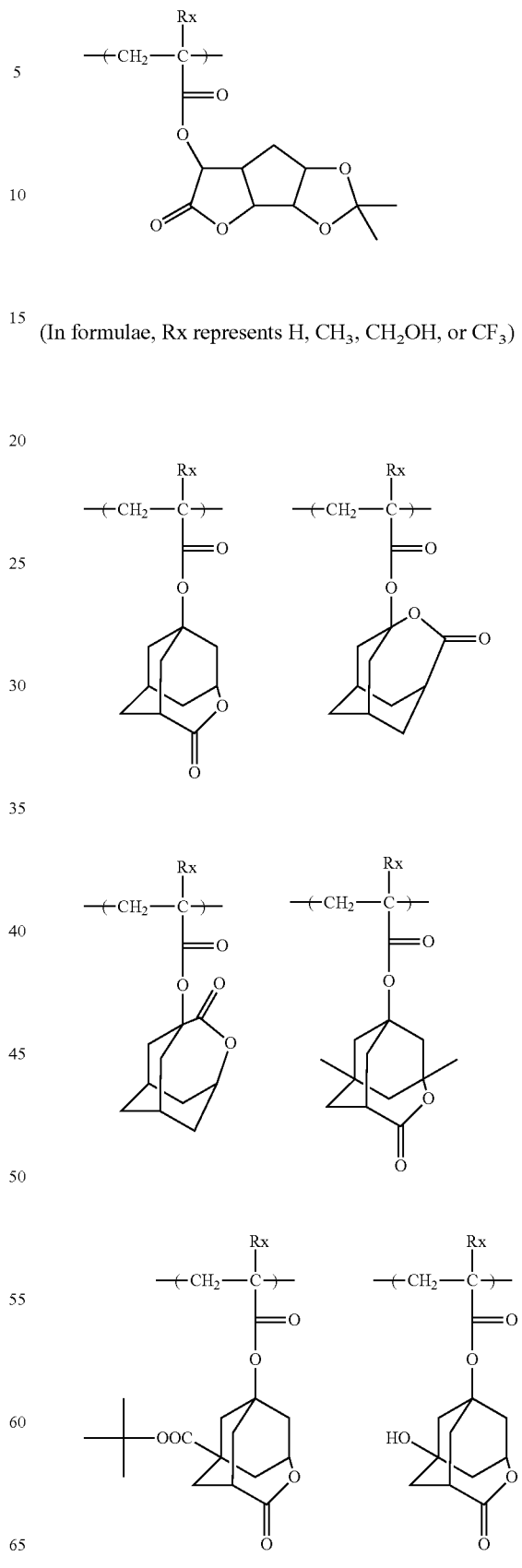
(In formulae, Rx represents H, CH$_3$, CH$_2$OH, or CF$_3$)

-continued

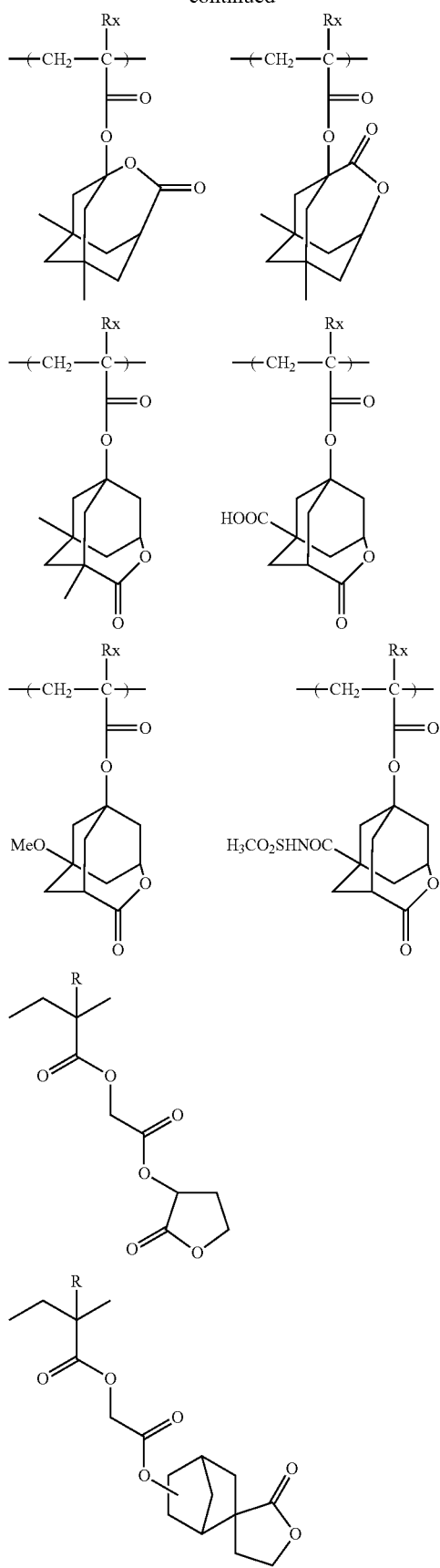

-continued

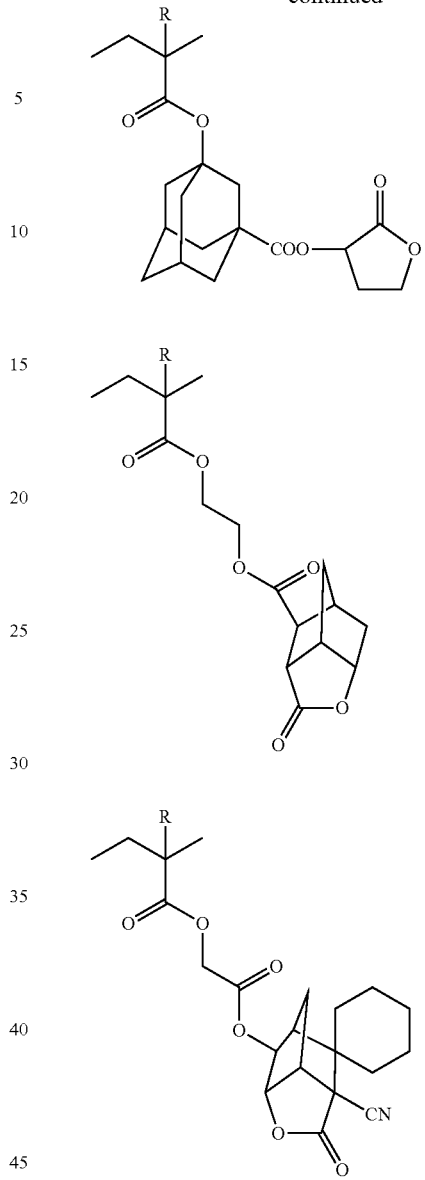

In the present invention, a repeating unit having two or more kinds of the concurrently used lactone structure may be contained.

The resin (A) may or may not contain the repeating unit having a concurrently used lactone structure. However, when the resin (A) contains such a repeating unit, the content of the repeating unit having a concurrently used lactone structure is preferably 1 mol % to 10 mol %, more preferably 2 mol % to 8 mol %, and even more preferably 3 mol % to 7 mol %, based on all repeating units in the resin (A).

The resin (A) preferably contains a repeating unit having a hydroxyl group or a cyano group other than General Formula (III). In this manner, adhesion to a substrate and affinity with a developer are improved. The repeating unit having a hydroxyl group or a cyano group is preferably a repeating unit having an alicyclic hydrocarbon structure that has been substituted with a hydroxyl group or a cyano group, and preferably does not include an acid-degradable group. The alicyclic hydrocarbon structure that has been substituted with a hydroxyl group or a cyano group is preferably an adamantyl group, a diadamantyl group, or a norbornane group, and more preferably an adamantyl group. Moreover, the resin (A) is preferably substituted with a hydroxyl group, and more preferably contains a repeating unit having an adamantyl group substituted with at least one hydroxyl group. Particularly, from the viewpoint of inhibiting diffusion of the generated acid, the resin (A) most preferably contains a repeating unit having a hydroxyadamantyl group or a dihydroxyadamantyl group.

As the alicyclic hydrocarbon structure that has been preferably substituted with a hydroxyl group or a cyano group, partial structures represented by the following General Formulae (VIIa) to (VIId) are preferable, and a partial structure represented by the following General Formula (VIIa) is more preferable.

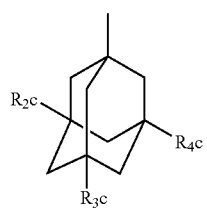

(VIIa)

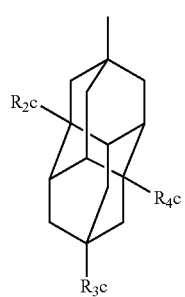

(VIIb)

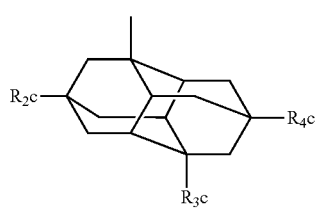

(VIIc)

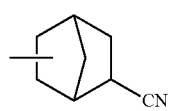

(VIId)

In General Formulae (VIIa) to (VIId), each of $R_2c$ to $R_4c$ independently represents a hydrogen atom, a hydroxyl group, or a cyano group. Here, at least one of $R_2c$ to $R_4c$ represents a hydroxyl group or a cyano group. Preferably, one or two out of $R_2c$ to $R_4c$ are hydroxyl groups, and the remainder is a hydrogen atom. In General Formula (VIIa), it is more preferable that two out of $R_2c$ to $R_4c$ be hydroxyl groups, and the remainder be a hydrogen atom.

Examples of the repeating unit having the partial structure represented by General Formulae (VIIa) to (VIId) include repeating units represented by the following General Formulae (AIIa) to (AIId).

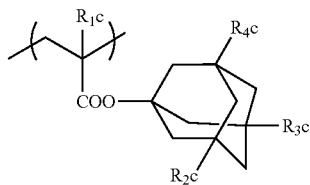

(AIIa)

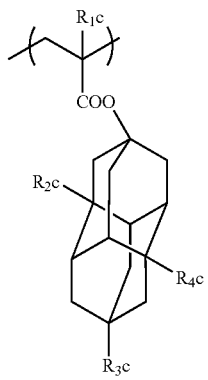

(AIIb)

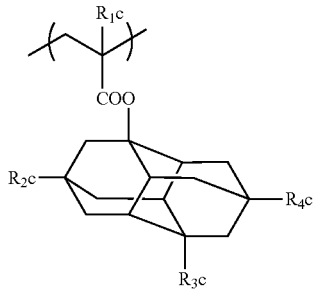

(AIIc)

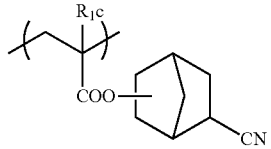

(AIId)

In General Formulae (AIIa) to (AIId),

R1c represents a hydrogen atom, a methyl group, a trifluoromethyl group, or a hydroxymethyl group.

$R_2c$ to $R_4c$ have the same definition as that of $R_2c$ to $R_4c$ in General Formulae (VIIa) to (VIIc).

The resin (A) may or may not contain the repeating unit having a hydroxyl group or a cyano group. However, when the resin (A) contains such a repeating unit, the content of the repeating unit having a hydroxyl group or a cyano group is preferably 1 mol % to 20 mol %, more preferably 2 mol % to 15 mol %, and even more preferably 5 mol % to 10 mol %, based on all repeating units in the resin (A).

Specific examples of the repeating unit having a hydroxyl group or a cyano group will be shown below, but the present invention is not limited thereto.

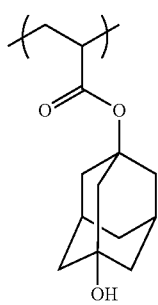
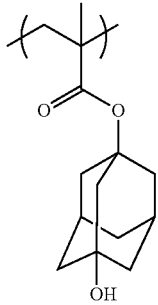
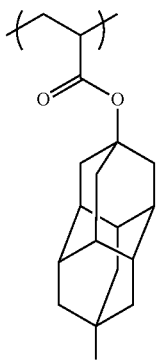

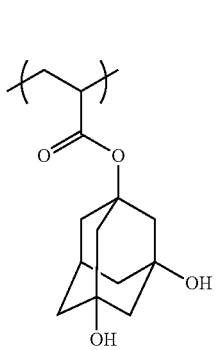
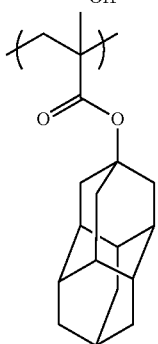

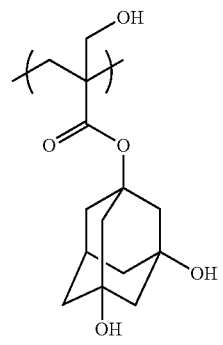
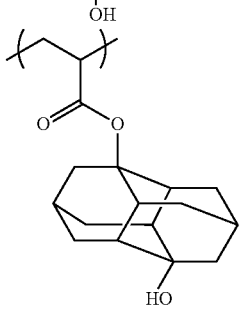

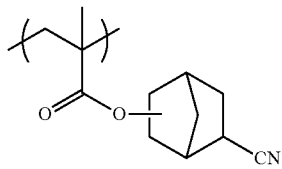
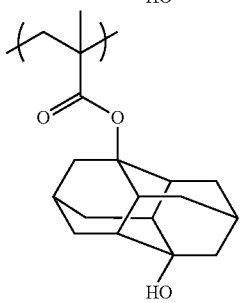

-continued

From the viewpoint of making greater dissolution contrast between an exposed portion and an unexposed portion in a resist film with respect to an organic solvent, the resin (A) preferably does not have an acid group such as a carboxyl group, a sulfonamide group, a sulfonylimide group, a bissulfonylimide group, or an aliphatic alcohol (such as a hexafluoroisopropanol group) in which an α-position has been substituted with an electron-attracting group if possible (specifically, the content of the repeating unit having an acid group is preferably 1 mol % or less, more preferably 0.5 mol % or less, even more preferably 0.01 mol % or less, and particularly preferably 0 mol %, based on all repeating units in the resin (A)).

The resin (A) of the present invention can also have an alicyclic hydrocarbon structure that does not include a polar group (for example, a hydroxyl group or a cyano group), and can contain a repeating unit that does not exhibit acid-degradability. In this manner, the elution of components having a low molecular weight to a liquid for liquid immersion from the resist film can be reduced during liquid immersion exposure, and the solubility of the resin can be appropriately adjusted during development performed using a developer containing an organic solvent. Examples of such a repeating unit include a repeating unit represented by General Formula (IV).

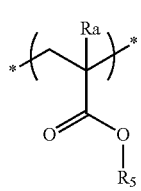

(IV)

In General formula (IV), $R_5$ represents a hydrocarbon group that has at least one cyclic structure and does not include a polar group. Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure of $R_5$ includes a monocyclic hydrocarbon group and a polycyclic hydrocarbon group. Examples of the monocyclic hydrocarbon group include cycloalkyl groups having 3 to 12 carbon atoms such as a cyclopentyl group, a cyclohexyl group, a cycloheptyl group, and a cyclooctyl group and cycloalkenyl groups having 3 to 12 carbon atoms such as a cyclohexenyl group. Examples of the preferable monocyclic hydrocarbon group include a monocyclic hydrocarbon group having 3 to 7 carbon atoms, and a cyclopentyl group and a cyclohexyl group are more preferable examples.

The polycyclic hydrocarbon group includes a ring-aggregated hydrocarbon group and a crosslinked cyclic hydrocarbon group. Examples of the ring-aggregated hydrocarbon group include a bicyclohexyl group, a perhydronaphthalenyl group, and the like. Examples of the crosslinked cyclic hydrocarbon ring include bicyclic hydrocarbon rings such as a pinane ring, a bornane ring, a norpinane ring, a norbornane ring, and a bicyclooctane ring (bicyclo[2.2.2]octane ring, bicyclo[3.2.1]octane ring, and the like); tricyclic hydrocarbon rings such as a homobrendane ring, an adamantane ring, a tricyclo[5.2.1.0$^{2,6}$]decane ring, and a tricyclo[4.3.1.1$^{2,5}$] undecane ring; and tetracyclic hydrocarbon rings such as a tetracyclo[4.4.0.1$^{2,5}$.1$^{7,10}$]dodecane ring and a perhydro-1,4-methano-5,8-methanonaphthalene ring. The crosslinked cyclic hydrocarbon ring also includes a condensed hydrocarbon ring, for example, a condensed ring in which a plurality of 5 to 8-membered cycloalkane rings such as a perhydronaphthalene ring (decalin), a perhydroanthracene ring, a perhydrophenanthrene ring, a perhydroacenaphthene ring, a perhydrofluorene ring, a perhydroindene ring, and a perhydrophenalene ring are condensed.

Examples of a preferable crosslinked cyclic hydrocarbon ring include a norbornyl group, an adamantyl group, a bicyclooctanyl group, a tricyclo[5,2,1,0$^{2,6}$]decanyl group, and the like. Examples of the more preferable crosslinked cyclic hydrocarbon ring include a norbornyl group, and an adamantyl group.

These alicyclic hydrocarbon groups may have a substituent, and examples of preferable substituents include a halogen atom, an alkyl group, a hydroxyl group in which a hydrogen atom has been substituted, an amino group in which a hydrogen atom has been substituted, and the like. Examples of a preferable halogen atom include a bromine atom, a chlorine atom, and a fluorine atom, and examples of a preferable alkyl group include a methyl group, an ethyl group, a butyl group, and a t-butyl group. This alkyl group may further have a substituent, and examples of this substituent that the alkyl group may further have include a halogen atom, an alkyl group, a hydroxyl group in which a hydrogen atom has been substituted, and an amino group in which a hydrogen atom has been substituted.

Examples of the substituent of the above hydrogen atom include an alkyl group, a cycloalkyl group, an aralkyl group, a substituted methyl group, a substituted ethyl group, an alkoxycarbonyl group, and an aralkyloxycarbonyl group. Examples of a preferable alkyl group include an alkyl group having 1 to 4 carbon atoms; examples of a preferable substituted methyl group include a methoxymethyl group, a methoxythiomethyl group, a benzyloxymethyl group, a t-butoxymethyl group, and a 2-methoxyethoxymethyl group; examples of a preferable substituted ethyl group include 1-ethoxyethyl and 1-methyl-1-methoxyethyl; examples of a preferable acyl group include an aliphatic acyl group having 1 to 6 carbon atoms such as a formyl group, an acetyl group, a propionyl group, a butyryl group, an isobutyryl group, a valeryl group, and a pivaloyl group; and examples of the alkoxycarbonyl group include an alkoxycarbonyl group having 1 to 4 carbon atoms.

The resin (A) may or may not contain a repeating unit that has an alicyclic hydrocarbon structure not including a polar group and does not exhibit acid-degradability. When the resin (A) contains such a repeating unit, the content of the repeating unit is preferably 1 mol % to 10 mol %, and more preferably 2 mol % to 5 mol %, based on all repeating units in the resin (A).

Specific examples of the repeating unit that has an alicyclic hydrocarbon structure not including a polar group and does not exhibit acid-degradability will be shown below, but the present invention is not limited thereto. In the formulae, Ra represents H, $CH_3$, $CH_2OH$, or $CF_3$.

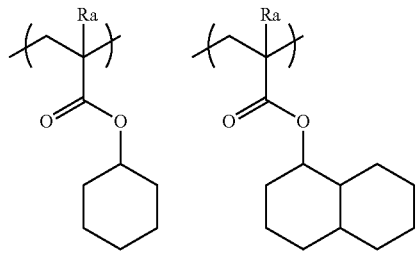

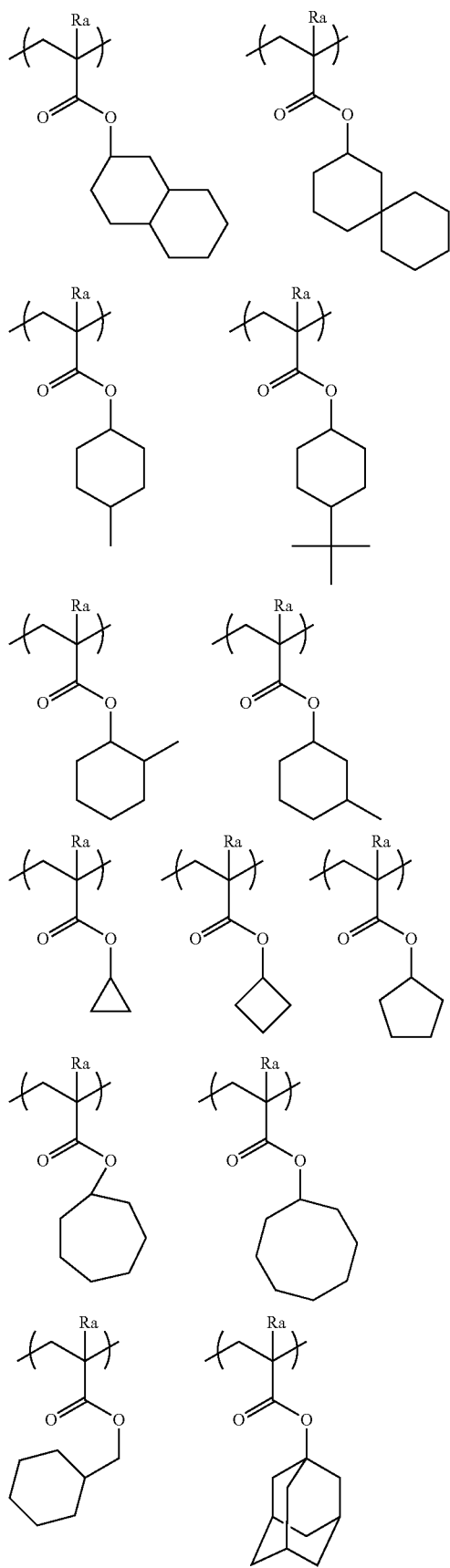
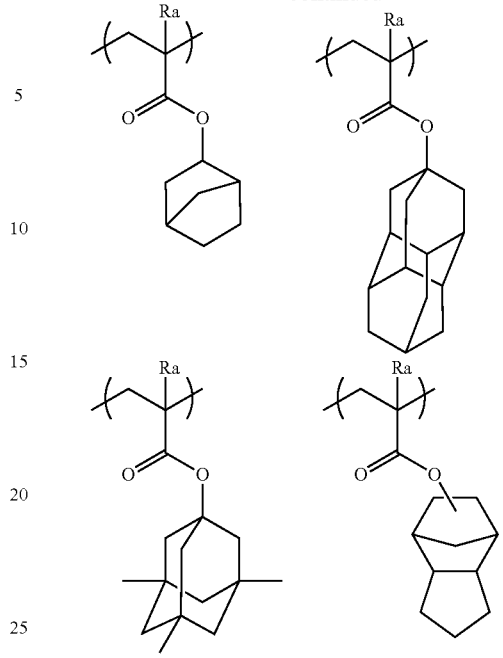

The resin (A) used for the composition of the present invention can contain various repeating structural units in addition to the repeating structural unit described above, for adjusting dry etching resistance, suitability with a standard developer, adhesion to a substrate, resist profile, and properties that are generally required for an actinic-ray-sensitive or radiation-sensitive resin composition, such as resolving power, heat resistance, sensitivity, and the like.

Examples of such repeating structural units include repeating structural units corresponding to the monomers described below, but the present invention is not limited thereto.

If the resin (A) contains such repeating structural units, performances required for the resin used for the composition of the present invention are, particularly, (1) solubility in a coating solvent,
(2) film formability (glass transition point),
(3) alkali developability,
(4) film thinning (selection of a hydrophilic or hydrophobic group and an alkali-soluble group),
(5) adhesion of an unexposed portion to a substrate,
(6) dry etching resistance, and the like can be finely adjusted.

Examples of such monomers include compounds having one addition-polymerizable unsaturated bond selected from acrylic acid esters, methacrylic acid esters, acrylamides, methacrylamides, allyl compounds, vinyl ethers, vinyl esters, and the like.

In addition, other addition-polymerizable unsaturated compounds may be copolymerized so long as these compounds are copolymerizable with the monomers corresponding to the various repeating structural units described above.

The molar ratio of the respective repeating structural units contained in the resin (A) used for the composition of the present invention is appropriately set so as to adjust the dry etching resistance, and the suitability with a standard developer of the actinic-ray-sensitive or radiation-sensitive resin composition, adhesion to a substrate, resist profile, resolving power, and properties that are generally required for an actinic-ray-sensitive or radiation-sensitive resin composition, such as resolving power, heat resistance, sensitivity, and the like. Here, needless to say, the total content of the respective repeating structural units does not exceed 100 mol %.

When the composition of the present invention is for ArF exposure, it is preferable that the resin (A) used for the composition of the present invention substantially do not contain an aromatic ring (specifically, the proportion of the repeating unit having an aromatic group in the resin is preferably 5 mol % or less, more preferably 3 mol % or less, and ideally 0 mol %, that is, it is desirable that the resin do not contain an aromatic group), in respect of transparency to ArF light. It is preferable that the resin (A) have a monocyclic or polycyclic alicyclic hydrocarbon structure.

When the composition of the present invention contains a resin (E) described later, it is desirable that the resin (A) do not contain a fluorine atom and a silicon atom, from a viewpoint of the compatibility between the resin (A) and the resin (E).

As the resin (A) used for the composition of the present invention, a resin in which all repeating units are constituted with a (meth)acrylate-based repeating unit is preferable. In this case, any of a resin in which all repeating units are methacrylate-based repeating units, a resin in which all repeating units are acrylate-based repeating units, and a resin in which all repeating units are methacrylate-based repeating units and acrylate-based repeating units can be used, but the acrylate-based repeating units are preferably 50 mol % or less of all repeating units. It is also preferable to use a copolymer which includes 20 mol % to 50 mol % of (meth)acrylate-based repeating units having an acid-degradable group, 20 mol % to 50 mol % of (meth)acrylate-based repeating units having a lactone group, 5 mol % to 30 mol % of (meth)acrylate-based repeating units having an alicyclic hydrocarbon structure substituted with a hydroxyl group or a cyano group, and 0 mol % to 20 mol % of other (meth)acrylate-based repeating units.

When the composition of the present invention is irradiated with KrF excimer laser light, electron beams, X-rays, or high energy light rays (EUV and the like) having a wavelength of 50 nm or less, the resin (A) preferably further contains a hydroxystyrene-based repeating unit. More preferably, the resin (A) contains the hydroxystyrene-based repeating unit, a hydroxystyrene-based repeating unit protected with an acid-degradable group, and an acid-degradable repeating unit such as (meth)acrylic acid tertiary alkyl ester.

Examples of a preferable hydroxystyrene-based repeating unit having an acid-degradable group include t-butoxycarbonyloxystyrene, 1-alkoxyethoxystyrene, a repeating unit of (meth)acrylic acid tertiary alkyl ester, and the like, and repeating units of 2-alkyl-2-adamantyl (meth)acrylate and dialkyl (1-adamantyl)methyl (meth)acrylate are more preferable.

The resin (A) of the present invention can be synthesized by a common method (for example, radical polymerization). Examples of the general synthesis method include batch polymerization in which polymerization is performed by dissolving monomer materials and initiators in a solvent and heating the resultant, and drop polymerization in which a solution including monomer materials and initiators is added dropwise to a heated solvent for 1 to 10 hours. A preferable method is the drop polymerization. Examples of a reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents dissolving the composition of the present invention, such as propylene glycol monomethyl ether acetate, propylene glycol monomethyl ether, and cyclohexanone described later. It is more preferable to perform polymerization by using the same solvents as those used in the actinic-ray-sensitive or radiation-sensitive resin composition of the present invention, and by doing this, the generation of particles during storage can be inhibited.

It is preferable to perform the polymerization reaction in an atmosphere of inert gas such as nitrogen or argon. As the polymerization initiator, a commercially available radical initiator (azo-based initiator, peroxide, or the like) is used to initiate the polymerization. As the radical initiator, an azo-based initiator is preferable, and an azo-based initiator having an ester group, a cyano group, or a carboxyl group is preferable. Examples of preferable initiators include azobisisobutyronitrile, azobisdimethylvaleronitrile, dimethyl 2,2'-azobis (2-methylpropionate), and the like. The initiator is added as desired or added in divided portions, and then introduced to a solvent after the reaction ends, thereby allowing recovery of desired polymers by methods of recovering powder or solids. The concentration of reaction is 5% by mass to 50% by mass, and preferably 10% by mass to 30% by mass. The reaction temperature is generally 10° C. to 150° C., preferably 30° C. to 120° C., and more preferably 60° C. to 100° C.

After the reaction ends, the temperature is cooled to room temperature, and purification is performed. For the purification, general methods such as liquid-liquid extraction in which residual monomer or oligomer components are removed by washing with water or by appropriately combined solvents; a purification method implemented in a solution state, such as ultrafiltration in which only components having a certain level of molecular weight or less are removed by extraction; reprecipitation in which residual monomers or the like are removed by clotting a resin in a poor solvent by means of adding the resin solution dropwise to the poor solvent; and a purification method implemented in a solid state in which a resin slurry is washed with a poor solvent can be used. For example, by bringing the resin into contact with a solvent (poor solvent) that poorly dissolves or does not dissolve the resin, in such an amount that the volume of the resin is 10 times or less, and preferably 10 to 5 times the reaction solution, the resin is precipitated as a solid.

As a solvent (solvent for precipitation or reprecipitation) used for performing precipitation or reprecipitation from a polymer solution, any solvent may be used as long as the solvent is a poor solvent of the polymer. The solvent to be used can be appropriately selected from hydrocarbon, halogenated hydrocarbon, a nitro compound, ether, ketone, ester, carbonate, alcohols, carboxylic acid, water, and a mixed solvent containing these solvents, depending on the type of the polymer. Among these, as a solvent for precipitation or reprecipitation, a solvent containing at least alcohol (particularly, methanol or the like) or water is preferable.

The amount of the solvent for precipitation or reprecipitation to be used can be appropriately selected in consideration of efficiency, yield, or the like, but generally, the amount is 100 parts by mass to 10000 parts by mass, preferably 200 parts by mass to 2000 parts by mass, and more preferably 300 parts by mass to 1000 parts by mass, based on 100 parts by mass of a polymer solution.

The temperature in the precipitation or reprecipitation can be appropriately selected in consideration of efficiency, yield, or the like, but the temperature is generally about 0° C. to 50° C., and preferably around room temperature (for example, about 20° C. to 35° C.). The precipitation or reprecipitation can be carried out by a well-known method such as a batch method, a continuous method, or the like and using a widely used mixing container such as a stirring tank.

The precipitated or reprecipitated polymer is generally subjected to widely used solid-liquid separation such as filtration or centrifugation, followed by drying, and then used. The filtration is performed preferably under reduced pressure by using a solvent-resistant filtering medium. The drying is performed under normal pressure or reduced pressure (preferably reduced pressure) at about 30° C. to 100° C., and preferably about 30° C. to 50° C.

In addition, once the resin is precipitated and separated, the resin may be dissolved again in a solvent and brought into contact with a solvent that poorly dissolves or does not dissolve the resin. That is, a method may also be used which includes (step a) precipitating the resin by bringing the polymer into contact with a solvent that poorly dissolves or does not dissolve the polymer after the above-described radical polymerization reaction is completed, (step b) separating the resin from the solution, (step c) preparing a resin solution A by dissolving the resin again in a solvent, (step d) then precipitating a resin solid by bringing the resin solution A into contact with a solvent that poorly dissolves or does not dissolve the resin, in such an amount that the volume of the solvent is less than 10 times (preferably 5 times or less) the resin solution A, and (step e) separating the precipitated resin.

In order to inhibit the resin from aggregating after the composition is prepared, for example, a step of preparing a solution by dissolving the synthesized resin in a solvent and heating the solution at about 30° C. to 90° C. for about 30 minutes to 4 hours may be added as described in JP2009-037108A.

The weight average molecular weight of the resin (A) of the present invention is preferably 1,000 to 200,000, more preferably 2,000 to 20,000, even more preferably 3,000 to 18,000, and particularly preferably 5,000 to 16,000, in terms of a polystyrene-converted value measured by GPC. If the weight average molecular weight is 1,000 to 200,000, the deterioration of heat resistance, dry etching resistance, developability, and the deterioration of film formability caused by the viscosity increase can be prevented.

The degree of dispersion (molecular weight distribution) is generally in a range of from 1.0 to 3.0, preferably from 1.0 to 2.6, more preferably from 1.0 to 2.0, and particularly preferably from 1.4 to 2.0. The smaller the molecular weight distribution, the better the resolution, resist shape, and roughness, and the smoother the side wall of a resist pattern.

In the actinic-ray-sensitive or radiation-sensitive resin composition of the present invention, the content of the resin (A) in the whole composition is preferably 30% by mass to 99% by mass, and more preferably 60% by mass to 95% by mass, based on the total solid content.

In addition, in the present invention, one kind of the resin (A) may be used, or a plurality of kinds of the resin (A) may be used concurrently.

The actinic-ray-sensitive or radiation-sensitive resin composition of the present invention may further contain an acid-degradable resin (a resin of which the polarity increases by the action of an acid and the solubility in a developer containing an organic solvent decreases) other than the resin (A), in addition to the resin (A). The acid-degradable resin other than the resin (A) is an acid-degradable resin that is constituted with the same repeating units as the repeating units which may be contained in the resin (A). The preferable range of the repeating units and the content of the repeating units in the resin are the same as those that were described for the resin (A). When the acid-degradable resin other than the resin (A) is contained, the content of the acid-degradable resin in the composition according to the present invention may be in such an amount that the total content of the resin (A) and the acid-degradable resin other than the resin (A) is in the above-described range. The mass ratio between the resin (A) and the acid-degradable resin other than the resin (A) can be appropriately adjusted within a range in which the effects of the present invention are excellently exerted. The mass ratio is preferably in a range of [resin (A)/acid-degradable resin other than resin (A)]=99.9/0.1 to 10/90, and more preferably in a range of 99.9/0.1 to 60/40.

The actinic-ray-sensitive or radiation-sensitive resin composition of the present invention preferably contains only the resin (A) as an acid-degradable resin, from the viewpoints of LWR and EL.

[2] Compound (B) Generating an Acid by being Irradiated with Actinic Rays or Radiations.

The composition of the present invention preferably further contains a compound (B) (hereinafter, also referred to as an "acid-generating agent") that generates an acid by being irradiated with actinic rays or radiations.

As the acid-generating agent, a photocationic polymerization initiator, a photoradical polymerization initiator, a decolorizer of pigments, an optical discoloring agent, or a well-known compound which is used for a microresist or the like and generates an acid by being irradiated with actinic rays or radiations and a mixture thereof can be appropriately selected and used.

Examples of the acid-generating agent include a diazonium salt, a phosphonium salt, a sulfonium salt, an iodonium salt, an imidosulfonate, an oxime sulfonate, a diazodisulfone, a disulfone, and o-nitrobenzyl sulfonate.

Among the acid-generating agents, examples of preferable compounds include compounds represented by the following General Formulae (ZI), (ZII), and (ZIII).

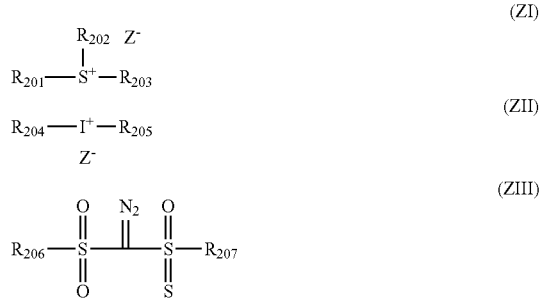

In the General Formula (ZI), each of $R_{201}$, $R_{202}$, and $R_{203}$ independently represents an organic group.

The organic group represented by $R_{201}$, $R_{202}$, and $R_{203}$ generally has 1 to 30 carbon atoms, and preferably has 1 to 20 carbon atoms.

In addition, two out of $R_{20}$ to $R_{203}$ may form a ring structure by binding to each other, and the ring may contain an oxygen atom, a sulfur atom, an ester bond, an amide bond, or a carbonyl group in the ring. Examples of the group that two out of $R_{201}$ to $R_{203}$ form by binding to each other include an alkylene group (for example, a butylene group or a pentylene group).

$Z^-$ represents a non-nucleophilic anion.

Examples of the non-nucleophilic anion represented by $Z^-$ include a sulfonic acid anion, a carboxylic acid anion, a sulfonylimide anion, a bis(alkylsulfonyl)imide anion, a tris(alkylsulfonyl)methyl anion, and the like.

The non-nucleophilic anion is an anion with a very low ability of causing a nucleophilic reaction, which is an anion that can inhibit temporal degradation caused by an intramolecular nucleophilic reaction. Due to this property, the temporal stability of the resist composition is improved.

Examples of the sulfonic acid anion include an aliphatic sulfonic acid anion, an aromatic sulfonic acid anion, a camphorsulfonic acid anion, and the like.

Examples of the carboxylic acid anion include an aliphatic carboxylic acid anion, an aromatic carboxylic acid anion, an aralkyl carboxylic acid anion, and the like.

The aliphatic moiety in the aliphatic sulfonic acid anion and the aliphatic carboxylic acid anion may be an alkyl group or a cycloalkyl group, and is preferably an alkyl group having 1 to 30 carbon atoms and a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a bornyl group, and the like.

As the aromatic group in the aromatic sulfonic acid anion and the aromatic carboxylic acid anion, an aryl group having 6 to 14 carbon atoms is preferable. Examples thereof include a phenyl group, a tolyl group, a naphthyl group, and the like.

The alkyl group, cycloalkyl group, and aryl group in the aliphatic sulfonic acid anion and aromatic sulfonic acid anion may have a substituent. Examples of the substituent of the alkyl group, cycloalkyl group, and aryl group in the aliphatic sulfonic acid anion and aromatic sulfonic acid anion include a nitro group, a halogen atom (a fluorine atom, a chlorine atom, a bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxy sulfonyl group (preferably having 7 to 20 carbon atoms), a cycloalkylaryloxy sulfonyl group (preferably having 10 to 20 carbon atoms), an alkyloxy alkyloxy group (preferably having 5 to 20 carbon atoms), a cycloalkylalkyloxy alkyloxy group (preferably having 8 to 20 carbon atoms), and the like. Regarding the aryl group and the ring structure of the respective groups, an alkyl group (preferably having 1 to 15 carbon atoms), and a cycloalkyl group (preferably having 3 to 15 carbon atoms) can be further exemplified as a substituent.

The aralkyl group in the aralkyl carboxylic acid anion is preferably an aralkyl group having 7 to 12 carbon atoms, and examples thereof include a benzyl group, a phenethyl group, a naphthyl methyl group, a naphthyl ethyl group, a naphthyl butyl group, and the like.

The alkyl group, cycloalkyl group, aryl group, and aralkyl group in the aliphatic carboxylic acid anion, aromatic carboxylic acid anion, and aralkyl carboxylic acid anion may have a substituent. Examples of the substituent include the same halogen atom, alkyl group, cycloalkyl group, alkoxy group, alkylthio group, and the like as those in the aromatic sulfonic acid anion.

Examples of the sulfonylimide anion include a saccharin anion.

The alkyl group in the bis(alkylsulfonyl)imide anion and tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, a neopentyl group, and the like. Examples of a substituent of these alkyl groups include a halogen atom, an alkyl group substituted with a halogen atom, an alkoxy group, an alkylthio group, an alkyloxysulfonyl group, an aryloxysulfonyl group, a cycloalkylaryloxy sulfonyl group, and the like, and an alkyl group substituted with a fluorine atom is preferable.

As other non-nucleophilic anions, fluorinated phosphorous, fluorinated boron, fluorinated antimony, and the like can be exemplified.

As the non-nucleophilic anion of $Z^-$, an aliphatic sulfonic acid anion in which at least an α-position of the sulfonic acid has been substituted with a fluorine atom, an aromatic sulfonic acid anion substituted with a fluorine atom or a group having a fluorine atom, a bis(alkylsulfonyl)imide anion in which the alkyl group has been substituted with a fluorine atom, and a tris(alkylsulfonyl)methide anion in which the alkyl group has been substituted with a fluorine atom are preferable. The non-nucleophilic anion is more preferably a perfluoroaliphatic sulfonic acid anion having 4 to 8 carbon atoms or a benzenesulfonic acid anion having a fluorine atom, and even more preferably a nonafluorobutanesulfonic acid anion, a perfluorooctanesulfonic acid anion, a pentafluorobenzenesulfonic acid anion, or a 3,5-bis(trifluoromethyl)benzenesulfonic acid anion.

The acid-generating agent may be a compound generating sulfonic acid represented by the following Formula (BI). When the acid-generating agent is, for example, a compound represented by General Formula (ZI) or (ZII), the aromatic sulfonic acid anion described above can be an anion generating aryl sulfonic acid represented by the following Formula (BI).

(BI)

In Formula (BI),

Ar represents an aromatic ring and may further have a substituent other than a sulfonic acid group and an A group.

p represents an integer of 0 or greater.

A represents a group containing a hydrocarbon group.

When p is 2 or greater, a plurality of A groups may be the same as or different from each other.

General Formula (BI) will be described in more detail.

The aromatic ring represented by Ar is preferably an aromatic ring having 6 to 30 carbon atoms, more preferably a benzene ring, a naphthalene ring, or an anthracene ring, and even more preferably a benzene ring.

Examples of the substituent other than a sulfonic acid group and an A group that the aromatic ring can have include a halogen atom (an fluorine atom, a chlorine atom, a bromine atom, an iodine atom), a hydroxyl group, a cyano group, a nitro group, a carboxyl group, and the like. When the aromatic ring has two or more substituents, at least two substituents may form a ring by binding to each other.

Examples of the group having a hydrocarbon group that is represented by A include an alkoxy group, an aryloxy group, an alkylthioxy group, an arylthioxy group, an alkoxycarbonyl group, an acetoxy group, linear and branched alkyl groups, an alkenyl group, an alkynyl group, an aryl group, an acyl group, and the like.

Examples of the hydrocarbon group in the group having a hydrocarbon group, which is represented by A, include an acyclic hydrocarbon group or a cyclic aliphatic group, and the hydrocarbon group preferably has 3 or more carbon atoms.

The A group is preferably a group in which a carbon atom adjacent to Ar is a tertiary or quaternary carbon atom.

Examples of the acyclic hydrocarbon group in the A group include an isopropyl group, a t-butyl group, a t-pentyl group, a neopentyl group, an s-butyl group, an isobutyl group, an isohexyl group, a 3,3-dimethylpentyl group, a 2-ethylhexyl group, and the like. The upper limit of the number of carbon atoms that the acyclic hydrocarbon group has is preferably 12 or less, and more preferably 10 or less.

Examples of the cyclic aliphatic group in the A group include a cycloalkyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group, a pinenyl group, and the like, and the cyclic aliphatic group may have a substituent. The upper limit of the number of carbon atoms of the cyclic aliphatic group is preferably 15 or less, and more preferably 12 or less.

When the acyclic hydrocarbon group or cyclic aliphatic group has a substituent, examples of the substituent include a halogen atom, an alkoxy group, an aryloxy group, an alkylthioxy group, an arylthioxy group, an alkoxycarbonyl group, an acetoxy group, linear and branched alkyl groups, a cycloalkyl group, an alkenyl group, an alkynyl group, an aryl group, a hydroxyl group, a carboxyl group, a sulfonic acid group, a carbonyl group, a cyano group, and the like.

p represents an integer of 0 or greater, and the upper limit thereof is not particularly limited so long as the integer is a chemically possible number. From the viewpoint of inhibiting the diffusion of acid, p represents generally 0 to 5, preferably 1 to 4, more preferably 2 to 3, and most preferably 3.

From the viewpoint of inhibiting the diffusion of acid, the A group preferably has a structure in which at least one o-position of a sulfonic acid group has been substituted, and more preferably has a structure in which two o-positions have been substituted.

The acid-generating agent is preferably a compound generating sulfonic acid represented by the following General Formula (I). The sulfonic acid represented by General Formula (I) has a cyclic organic group. Accordingly, for the same reason as described above, resolving properties of the resist film and roughness performance can be further improved.

Accordingly, when the acid-generating agent is, for example, a compound represented by General Formula (ZI) or (ZII), the aromatic sulfonic acid anion is preferably an anion generating an acid represented by the following Formula (I).

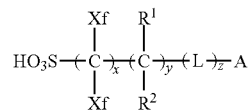

(I)

In the formula, each Xf independently represents a fluorine atom or an alkyl group substituted with at least one fluorine atom.

Each of $R_1$ and $R_2$ independently represents a hydrogen atom, a fluorine atom, or an alkyl group. When there is a plurality of $R_1$s and $R_2$s, each of the $R_1$s and $R_2$s may be the same as or different from each other.

L represents a divalent linking group, and when there is a plurality of Ls, the Ls may be the same as or different from each other.

A represents cyclic organic group.

x represents an integer of 1 to 20, y represents an integer of 0 to 10, and z represents an integer of 0 to 10.

General Formula (I) will be described in more detail.

The alkyl group of Xf, which is substituted with a fluorine atom, preferably has 1 to 10 carbon atoms, and more preferably has 1 to 4 carbon atoms. Moreover, the alkyl group of Xf, which is substituted with a fluorine atom, is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, a fluorine atom and $CF_3$ are preferable. Particularly, Xfs at both sides are preferably fluorine atoms.

The alkyl group of $R_1$ and $R_2$ may have a substituent (preferably a fluorine atom) and preferably has 1 to 4 carbon atoms. The alkyl group is more preferably a perfluoroalkyl group having 1 to 4 carbon atoms. Specific examples of the alkyl group of $R_1$ and $R_2$ that has a substituent include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R_1$ and $R_2$ are preferably a fluorine atom or $CF_3$.

y is preferably 0 to 4, and more preferably 0. x is preferably 1 to 8, more preferably 1 to 4, and particularly preferably 1. z is preferably 0 to 8, and more preferably 0 to 4.

The divalent linking group of L is not particularly limited, and examples of the divalent linking group include —COO—, —COO—, —CONR—, —NRCO— (R is a hydrogen atom or an alkyl group (preferably having 1 to 6 carbon atoms), a cycloalkyl group (preferably having 3 to 10 carbon atoms), —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a linking group in which a plurality of the above groups are combined, and a linking group having 12 or less carbon atoms in total is preferable. Among these, —COO—, —COO—, —CONR—, —NRCO—, —CO—, —O—, —SO$_2$—, a —COO-alkylene group-, —OCO-alkylene group-, —CONR-alkylene group-, —NRCO-alkylene group- are more preferable, and —COO—, —COO—, and —SO$_2$— are even more preferable.

The cyclic organic group of A is not particularly limited so long as the group has a cyclic structure. Examples of the cyclic organic group include an alicyclic group, an aryl group, a heterocyclic group (including both the groups having and not having aromaticity, such as a tetrahydropirane ring and a lactone ring structure), and the like.

The alicyclic group may be monocyclic or polycyclic. A monocyclic cycloalkyl group such as a cyclopentyl group, a cyclohexyl group, and a cyclooctyl group and a polycyclic cycloalkyl group such as a norbornyl group, a tricyclodecanyl group, a tetracyclodecanyl group, a tetracyclododecanyl group, and an adamantyl group are preferable. Among these, alicyclic groups with a bulky structure having 7 or more carbon atoms, such as norbornyl group, a tricyclodecanyl group, a tetracyclodecanyl group, a tetracyclododecanyl group, and an adamantyl group, are preferable, from the viewpoint that diffusivity in a film can be inhibited during a PEB (Post Exposure Bake) process, and that a MEEF (Mask Error Enhancement Factor) can be improved.

The aryl group may be monocyclic or polycyclic. Examples of the aryl group include a benzene ring, a naphthalene ring, a phenanthrene ring, an anthracene ring, and the like. Among these, naphthalene showing low light absorbance is preferable from the viewpoint of light absorbance at 193 nm.

The heterocyclic group may be monocyclic or polycyclic. Examples of the heterocyclic group include heterocyclic groups derived from a furan ring, a thiophene ring, a benzofuran ring, a benzothiophene ring, a dibenzofuran ring, a dibenzothiophene ring, a pyridine ring, and a decahydroisoquinoline ring. Among these, heterocyclic groups derived from a furan ring, a thiophene ring, pyridine ring, and a decahydroisoquinoline ring are preferable.

As the cyclic organic group, a lactone structure can also be exemplified.

The cyclic organic group may have a substituent. Examples of the substituent include an alkyl group (which may be linear, branched, or cyclic and preferably has 1 to 12 carbon atoms), a cycloalkyl group (which may be monocyclic, polycyclic, or a spiro ring and preferably has 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, a sulfonic acid ester group, and the like. In addition, the carbon (which helps the formation of a ring) constituting the cyclic organic group may be carbonyl carbon.

Examples of the organic group represented by $R_{201}$, $R_{202}$, and $R_{203}$ include groups corresponding to compounds (ZI-1), (ZI-2), (ZI-3), and (ZI-4) described later.

In addition, the organic group may be a compound having a plurality of the structures represented by General Formula (ZI). For example, the organic group may be a compound having a structure in which at least one of $R_{201}$ to $R_{203}$ of the compound represented by General Formula (ZI) binds to at least one of $R_{201}$ to $R_{203}$ of another compound represented by General Formula (ZI) via a single bond or a linking group.

As more preferable (ZI) components, the compounds (ZI-1), (ZI-2), (ZI-3), and (ZI-4) described later can be exemplified.

The compound (ZI-1) is an aryl sulfonium compound in which at least one of $R_{201}$ to $R_{203}$ of the General formula (ZI) is an aryl group, that is, a compound having aryl sulfonium as a cation.

In the aryl sulfonium compound, all of $R_{201}$ to $R_{203}$ may be aryl groups; alternatively, a portion of $R_{201}$ to $R_{203}$ may be an aryl group, and the remaining group may be an alkyl group or a cycloalkyl group.

Examples of the aryl sulfonium compound include a triaryl sulfonium compound, a diaryl alkyl sulfonium group, an aryl dialkyl sulfonium compound, a diaryl cycloalkyl sulfonium compound, and an aryl dicycloalkyl sulfonium compound.

As the aryl group of the aryl sulfonium compound, a phenyl group and a naphthyl group are preferable, and a phenyl group is more preferable. The aryl group may be an aryl group having a heterocyclic structure containing an oxygen atom, a nitrogen atom, a sulfur atom, and the like. Examples of the heterocyclic structure include a pyrrole residue, a furan residue, a thiophene residue, an indole residue, a benzofuran residue, a benzothiophene residue, and the like. When the aryl sulfonium compound has two or more aryl groups, the two or more aryl groups may be the same as or different from each other.

The alkyl group or cycloalkyl group that the aryl sulfonium compound optionally has is preferably a linear or branched alkyl group having 1 to 15 carbon atoms and a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, a cyclohexyl group, and the like.

The aryl group, alkyl group, and cycloalkyl group of $R_{201}$ to $R_{203}$ may have an alkyl group (having 1 to 15 carbon atoms, for example), a cycloalkyl group (having 3 to 15 carbon atoms, for example), an aryl group (having 6 to 14 carbon atoms, for example), an alkoxy group (having 1 to 15 carbon atoms, for example), a halogen atom, a hydroxyl group, or a phenylthio group as a substituent, in addition to the polymerizable group. The substituent is preferably a linear or branched alkyl group having 1 to 12 carbon atoms, a cycloalkyl group having 3 to 12 carbon atoms, a linear, branched, or cyclic alkoxy group having 1 to 12 carbon atoms, and more preferably an alkyl group having 1 to 4 carbon atoms or an alkoxy group having 1 to 4 carbon atoms. The substituent may be substituted with at least one out of three of $R_{201}$ to $R_{203}$, or may be substituted with all of three. When $R_{201}$ to $R_{203}$ are aryl groups, the substituent is preferably substituted with a p-position of the aryl group.

Next, the compound (ZI-2) will be described.

The compound (ZI-2) is a compound in which each of $R_{201}$ to $R_{203}$ in Formula (ZI) independently represents an organic group not having an aromatic ring. The aromatic ring herein also includes an aromatic ring containing a hetero atom.

The organic group not containing an aromatic ring represented by $R_{201}$ to $R_{203}$ has generally 1 to 30 carbon atoms, and preferably 1 to 20 carbon atoms.

Each of $R_{201}$ to $R_{203}$ is independently an alkyl group, a cycloalkyl group, an allyl group, or a vinyl group preferably, and more preferably a linear or branched 2-oxoalkyl group, a 2-oxocycloalkyl group, or an alkoxycarbonyl methyl group, and particularly preferably a linear or branched 2-oxoalkyl group.

Preferable examples of the alkyl group and cycloalkyl group of $R_{201}$ to $R_{203}$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms. More preferable examples of the alkyl group include a 2-oxoalkyl group and an alkoxycarbonyl methyl group. More preferable examples of the cycloalkyl group include a 2-oxocycloalkyl group.

The 2-oxoalkyl group may be linear or branched, and more preferable examples thereof include a group having >C=O in the second position of the above alkyl group.

Preferable examples of the 2-oxocycloalkyl group include a group having >C=O in the second position of the above cycloalkyl group.

Preferable examples of the alkoxy group in the alkoxycarbonyl methyl group include an alkoxy group (a methoxy group, an ethoxy group, a propoxy group, a butoxy group, or a pentoxy group) having 1 to 5 carbon atoms.

$R_{201}$ to $R_{203}$ may be further substituted with a halogen atom, an alkoxy group (having 1 to 5 carbon atoms, for example), a hydroxyl group, a cyano group, or a nitro group.

Next, the compound (ZI-3) will be described.

The compound (ZI-3) is a compound represented by the following General formula (ZI-3), which is a compound having a phenacyl sulfonium salt structure.

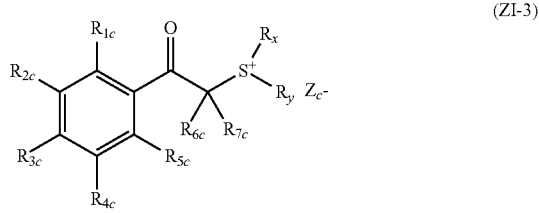

(ZI-3)

In General formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkyl carbonyloxy group, a cycloalkyl carbonyloxy group, a halogen atom, a hydroxyl group, a nitro group, an alkylthio group, or an arylthio group.

Each of $R_{6c}$ and $R_{7c}$ independently represents a polymerizable group, a hydrogen atom, an alkyl group, a cycloalkyl group, a halogen atom, a cyano group, or an aryl group.

Each of $R_x$ and $R_y$ independently represents an alkyl group, a cycloalkyl group, a 2-oxoalkyl group, a 2-oxocycloalkyl group, an alkoxycarbonyl alkyl group, an aryl group, or a vinyl group.

Any two or more out of $R_{1c}$ to $R_{5c}$, $R_{5c}$ and $R_{6c}$, $R_{6c}$ and $R_{7c}$, $R_{5c}$ and $R_x$, and $R_x$ and $R_y$ may form a ring structure by binding to each other respectively, and this ring structure may include an oxygen atom, a sulfur atom, a ketone group, an ester bond, or an amide bond.

Examples of the ring structure include an aromatic or non-aromatic hydrocarbon ring, an aromatic or non-aromatic hetero ring, and a polycyclic condensed ring formed of a combination of two or more of these rings. Examples of the ring structure include a 3- to 10-membered ring, and the ring structure is preferably a 4- to 8-membered ring and more preferably a 5- to 6-membered ring.

Examples of the group that any two or more out of $R_{1c}$ to $R_{5c}$, $R_{6c}$ and $R_{7c}$, and $R_x$ and $R_y$ form by binding to each other include a butylene group, a pentylene group, and the like.

The group that $R_{5c}$ and $R_{6c}$, and $R_{5c}$ and $R_x$ form by binding to each other is preferably a single bond or an alkylene group, and examples of the alkylene group include a methylene group, an ethylene group, and the like.

$Zc^-$ represents a non-nucleophilic anion, and examples thereof include the same non-nucleophilic anion represented by $Z^-$ in General formula (ZI).

The alkyl group represented by $R_{1c}$ to $R_{7c}$ may be linear or branched. Examples of the alkyl group include an alkyl group having 1 to 20 carbon atoms, and preferably include a linear or branched alkyl group (for example, a methyl group, an ethyl group, a linear or branched propyl group, a linear or branched butyl group, or a linear or branched pentyl group) having 1 to 12 carbon atoms. Examples of the cycloalkyl group include a cycloalkyl group (for example, a cyclopentyl group or a cyclohexyl group) having 3 to 10 carbon atoms.

The aryl group represented by $R_{1c}$ and $R_{5c}$ preferably has 5 to 15 carbon atoms, and examples thereof include a phenyl group and a naphthyl group.

The alkoxy group represented by $R_{1c}$ to $R_{5c}$ may be linear, branched, or cyclic. Examples of the alkoxy group include an alkoxy group having 1 to 10 carbon atoms, and preferably include a linear or branched alkoxy group (for example, a methoxy group, an ethoxy group, a linear or branched propoxy group, a linear or branched butoxy group, or a linear or branched pentoxy group) having 1 to 5 carbon atoms and a cyclic alkoxy group (for example, a cyclopentyloxy group or a cyclohexyloxy group) having 3 to 10 carbon atoms.

Specific examples of the alkoxy group in the alkoxycarbonyl group represented by $R_{1c}$ to $R_{5c}$ are the same as the above specific examples of the alkoxy group represented by $R_{1c}$ to $R_{5c}$.

Specific examples of the alkyl group in the alkylcarbonyloxy group and the alkylthio group represented by $R_{1c}$ to $R_{5c}$ are the same as the above specific examples of the alkyl group represented by $R_{1c}$ to $R_{5c}$.

Specific examples of the cycloalkyl group in the cycloalkyl carbonyloxy group represented by $R_{1c}$ to $R_{5c}$ are the same as the above specific examples of the cycloalkyl group represented by $R_{1c}$ to $R_{5c}$.

Specific examples of the aryl group in the aryloxy group and the arylthio group represented by $R_{1c}$ to $R_{5c}$ are the same as the above specific examples of the aryl group represented by $R_{1c}$ to $R_{5c}$.

Any one of $R_{1c}$ to $R_{5c}$ is preferably a linear or branched alkyl group, a cycloalkyl group, or a linear, branched, or cyclic alkoxy group. More preferably, the sum of the number of carbon atoms of $R_{1c}$ to $R_{5c}$ is 2 to 15. In this structure, solvent solubility of the compound (B) is further improved, and the generation of particles during storage is inhibited.

Examples of the ring structure that any two out of $R_{1c}$ to $R_{5c}$ may form by binding to each other preferably include a 5- or 6-membered ring, and particularly preferably include a 6-membered ring (for example, a phenyl ring).

Examples of the ring structure that $R_{5c}$ and $R_{6c}$ may form by binding to each other include a 4- or more membered ring (particularly preferably a 5- to 6-membered ring) that is formed in a manner in which $R_{5c}$ and $R_{6c}$ constitute a single bond or an alkylene group (a methylene group, an ethylene group, or the like) by binding to each other, and this single bond or alkylene group forms the 4- or more membered ring together with a carbonyl carbon atom and a carbon atom in General Formula (I).

The aryl group represented by $R_6$, and $R_{7c}$ preferably includes 5 to 15 carbon atoms, and examples thereof include a phenyl group and a naphthyl group.

As an embodiment of $R_{6c}$ and $R_{7c}$, a case where both the $R_{6c}$ and $R_{7c}$ are alkyl groups is preferable. Particularly, a case where each of $R_{6c}$ and $R_{7c}$ is a linear or branched alkyl group having 1 to 4 carbon atoms is preferable, and particularly, a case where both the $R_{6c}$ and $R_{7c}$ are methyl groups is preferable.

When $R_{6c}$ and $R_{7c}$ form a ring by binding to each other, the group that $R_{6c}$ and $R_{7c}$ form by binding to each other is preferably an alkylene group having 2 to 10 carbon atoms, and examples thereof include an ethylene group, a propylene group, a butylene group, a pentylene group, a hexylene group, and the like. The ring that $R_{6c}$ and $R_{7c}$ form by binding to each other may include a hetero atom such as oxygen atoms and the like in the ring.

Examples of the alkyl group and the cycloalkyl group represented by $R_x$ and $R_y$ include the same alkyl group and cycloalkyl group as those in $R_{1c}$ to $R_{7c}$.

Examples of the 2-oxoalkyl group and the 2-oxocycloalkyl group represented by $R_x$ and $R_y$ include the group having >C=O in the second position of the alkyl group and the cycloalkyl group represented by $R_{1c}$ to $R_{7c}$.

Examples of the alkoxy group in the alkoxycarbonyl alkyl group represented by $R_x$ and $R_y$ include the same alkoxy group as those in $R_{1c}$ to $R_{5c}$. Examples of the alkyl group include an alkyl group having 1 to 12 carbon atoms, and preferably include a linear alkyl group (for example, a methyl group or an ethyl group) having 1 to 5 carbon atoms.

The aryl group represented by $R_x$ and $R_y$ is not particularly limited, but this aryl group is preferably an unsubstituted aryl group or an aryl group substituted with a monocyclic or polycyclic cycloalkyl group (preferably a cycloalkyl group having 3 to 10 carbon atoms).

The vinyl group represented by $R_x$ and $R_y$ is not particularly limited, but this vinyl group is preferably an unsubstituted vinyl group or a vinyl group substituted with a monocyclic or polycyclic cycloalkyl group (preferably a cycloalkyl group having 3 to 10 carbon atoms).

Examples of the ring structure that $R_{5c}$ and $R_x$ may form by binding to each other include a 5- or more membered ring (particularly preferably a 5-membered ring) that is formed in a manner in which $R_{5c}$ and $R_x$ constitute a single bond or an alkylene group (a methylene group, an ethylene group, or the like) by binding to each other, and this single bond or alkylene group forms the 5- or more membered ring together with a sulfur atom and a carbonyl carbon atom in General Formula (I).

Examples of the ring structure that $R_x$ and $R_y$ may form by binding to each other include a 5- or 6-membered ring, and particularly preferably include a 5-membered ring (that is, a tetrahydrothiophene ring) that the divalent $R_x$ and $R_y$ (for example, a methylene group, an ethylene group, a propylene group, or the like) form together with a sulfur atom in General Formula (ZI-3).

$R_x$ and $R_y$ are an alkyl group or a cycloalkyl group having preferably 4 or more carbon atoms, more preferably 6 or more carbon atoms, and even more preferably 8 or more carbon atoms.

$R_{1c}$ to $R_{7c}$ and $R_x$ and $R_y$ may further have a substituent, and examples of the substituent include a halogen atom (for example, a fluorine atom), an hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, an aryloxycarbonyloxy group, and the like.

In the General Formula (ZI-3), it is more preferable that each of $R_{1c}$, $R_{2c}$, $R_{4c}$, and $R_{5c}$ independently represent a hydrogen atom, and that $R_{1c}$ represent a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Specific examples of the cation of the compound represented by General Formula (ZI-2) or (ZI-3) in the present invention include the following.

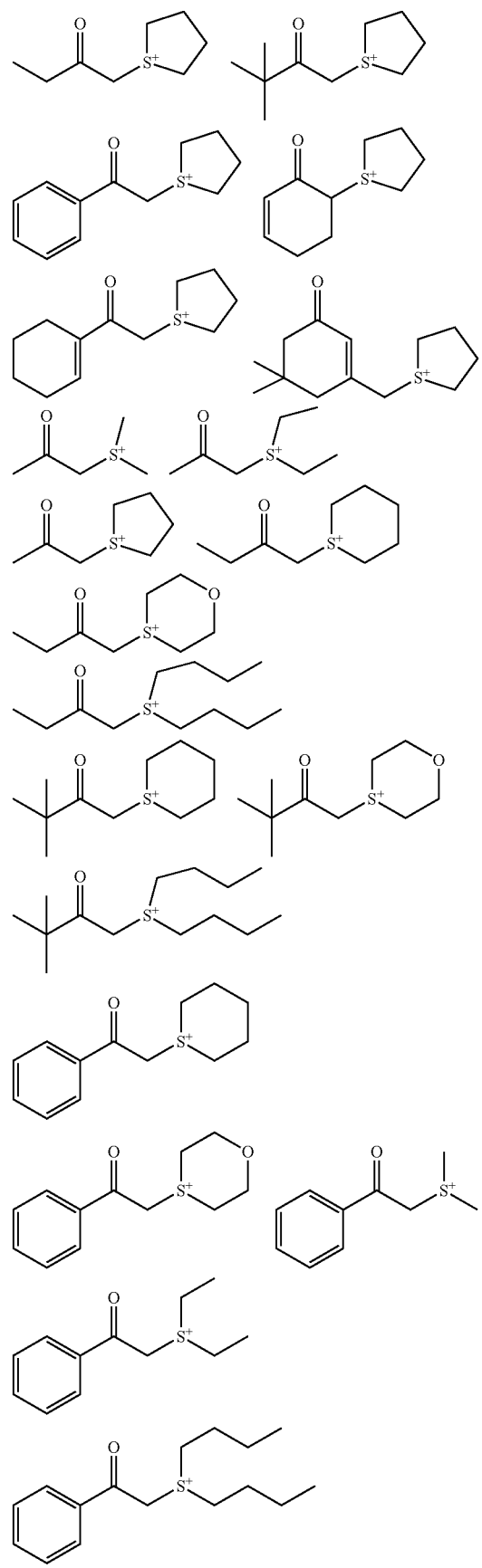

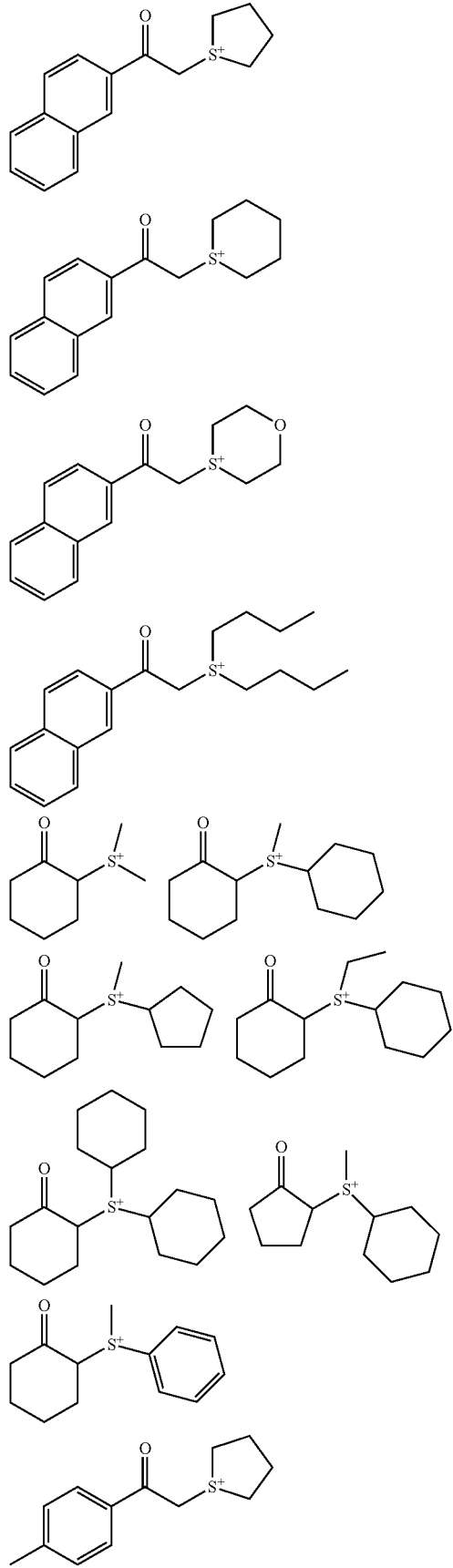
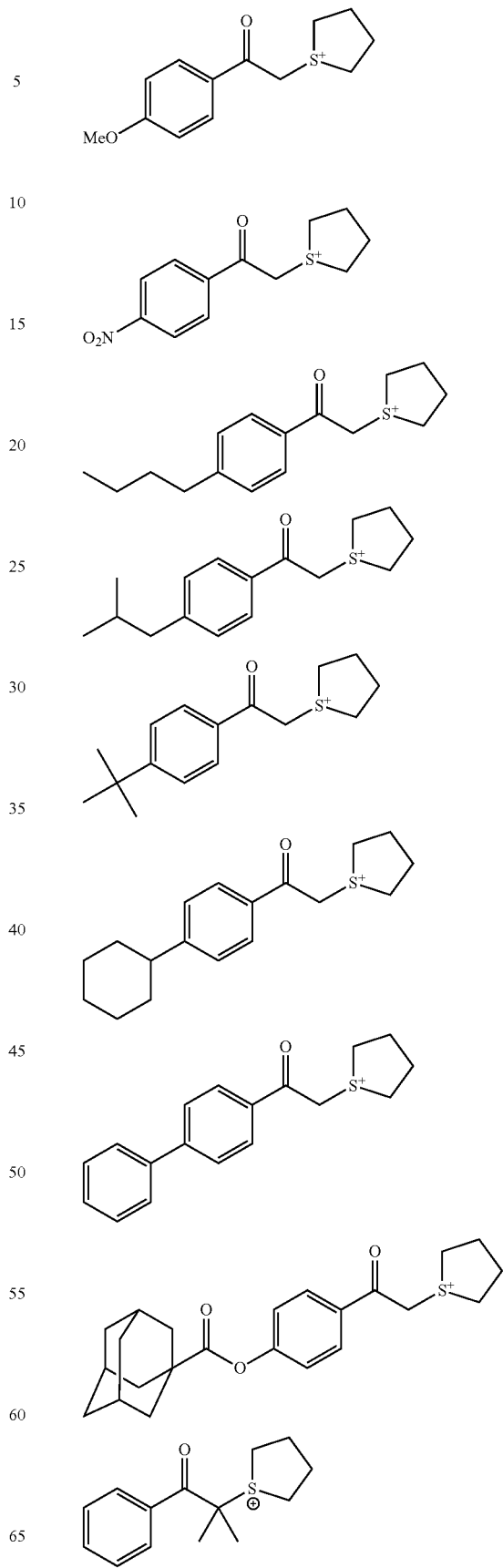

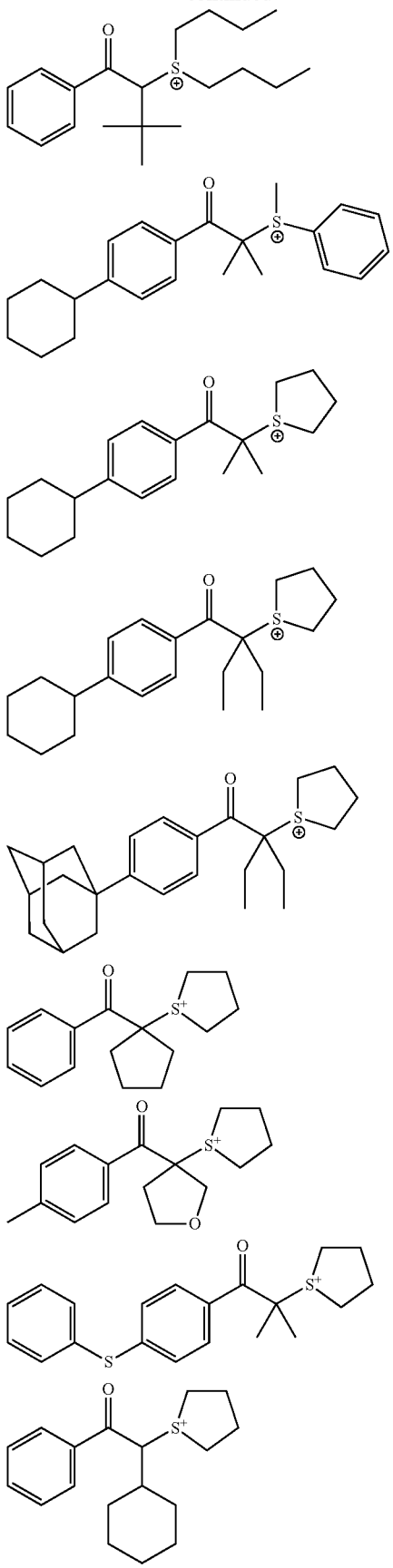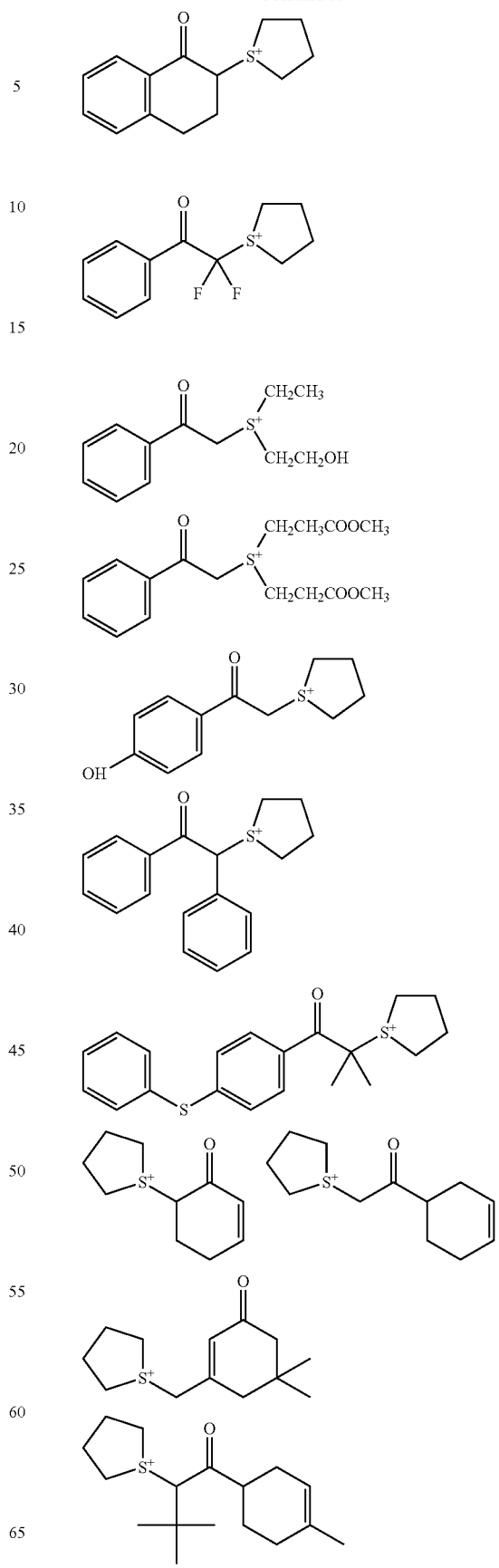

-continued

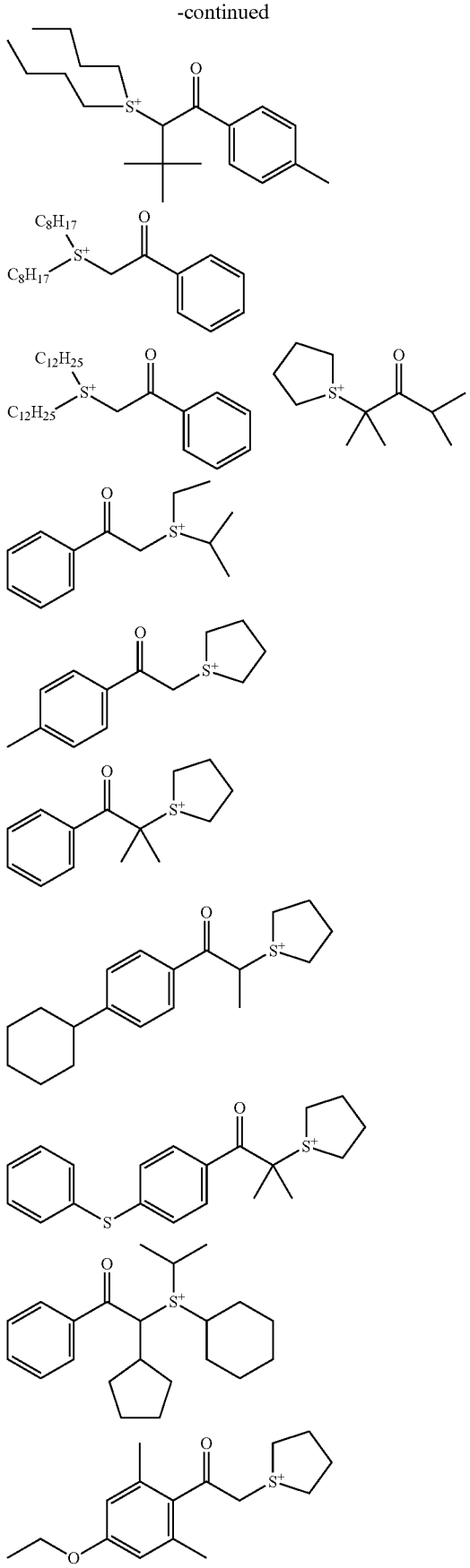

-continued

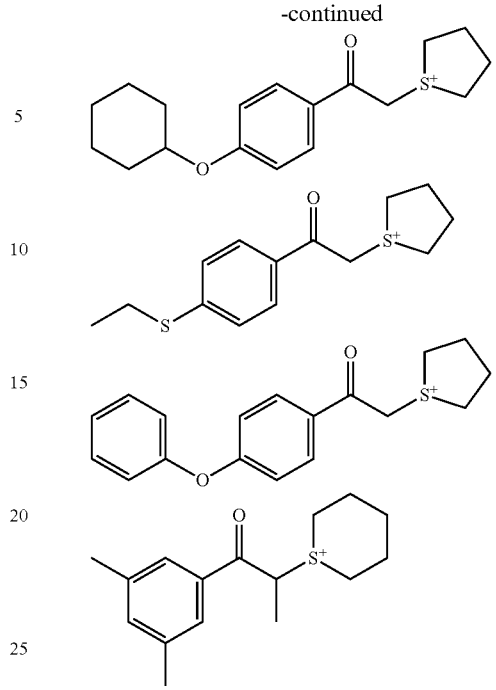

Next, the compound (ZI-4) will be described.
The compound (ZI-4) is represented by the following General Formula (ZI-4).

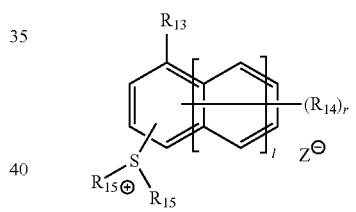

(ZI-4)

In General formula (ZI-4),
$R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

When there is a plurality of $R_{14}$s, each $R_{14}$ independently represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group, or a naphthyl group. Two $R_{15}$s may form a ring by binding to each other. These groups may have a substituent.

l represents an integer of 0 to 2.
r represents an integer of 0 to 8.
$Z^-$ represents a non-nucleophilic anion, and examples thereof include the same non-nucleophilic anion as represented by $Z^-$ in General formula (ZI).

In General formula (Z-14), the alkyl group of $R_{13}$, $R_{14}$, and $R_{15}$ is preferably a linear or branched alkyl group having 1 to 10 carbon atoms, and a methyl group, an ethyl group, an n-butyl group, a t-butyl group, and the like are preferable.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly, cyclopropyl, cyclopentyl, cyclohexyl, cycloheptyl, and cyclooctyl are preferable.

Examples of the alkoxy group of $R_{13}$ and $R_{14}$ include linear or branched alkoxy groups having 1 to 10 carbon atoms, and a methoxy group, an ethoxy group, an n-propoxy group, an n-butoxy group, and the like are preferable.

The alkoxycarbonyl group of $R_{13}$ and $R_{14}$ is linear or branched, and preferably has 2 to carbon atoms. As the alkoxycarbonyl group, a methoxycarbonyl group, an ethoxycarbonyl group, an n-butoxycarbonyl group, and the like are preferable.

Examples of the cycloalkyl group of $R_{13}$ and $R_{14}$ include monocyclic or polycyclic cycloalkyl groups (preferably a cycloalkyl group having 3 to 20 carbon atoms) such as a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has 7 or more carbon atoms in total, and more preferably has 7 to 15 carbon atoms in total. In addition, the cycloalkyloxy group preferably has a monocyclic cycloalkyl group. Examples of the monocyclic cycloalkyloxy group having 7 or more carbon atoms in total include a cycloalkyloxy group such as a cyclopropyloxy group, a cyclobutyloxy group, a cyclopentyloxy group, a cyclohexyloxy group, a cycloheptyloxy group, a cyclooctyloxy group, a cyclododecanyloxy group, or the like which arbitrarily has a substituent including an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, or an iso-amyl group; a hydroxyl group; a halogen atom (fluorine, chlorine, bromine, or iodine); a nitro group; a cyano group; an amide group; a sulfonamide group; an alkoxy group such as a methoxy group, an ethoxy group, a hydroxyethoxy group, a propoxy group, a hydroxypropoxy group, or a butoxy group; an alkoxycarbonyl group such as a methoxycarbonyl group, or an ethoxycarbonyl group; an acyl group such as a formyl group, an acetyl group, or a benzoyl group; an acyloxy group such as an acetoxy group, a butyryloxy group, or the like; and a carboxyl group. The total number of the carbon atoms of the monocyclic or polycyclic cycloalkyloxy group is 7 or more including an arbitrary substituent on the cycloalkyl group.

Examples of the polycyclic cycloalkyloxy group having 7 or more carbon atoms in total include a norbornyloxy group, a tricyclodecanyloxy group, a tetracyclodecanyloxy group, an adamantyloxy group, and the like.

The alkoxy group of $R_{13}$ and $R_{14}$, which has a monocyclic or polycyclic cycloalkyl group, preferably has 7 or more carbon atoms in total, and more preferably has 7 to 15 carbon atoms in total. In addition, this alkoxy group is preferably an alkoxy group having a monocyclic cycloalkyl group. The alkoxy group that has 7 or more carbon atoms in total and a monocyclic cycloalkyl group is a group that is obtained by substituting a monocyclic cycloalkyl group which may have the substituent described above with an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, or iso-amyloxy. The substituent is also included in the total 7 or more carbon atoms. Examples of this alkoxy group include a cyclohexyl methoxy group, a cyclopentyl ethoxy group, a cyclohexyl ethoxy group, and the like, and among these, a cyclohexyl methoxy group is preferable.

Examples of the alkoxy group having a polycyclic cycloalkyl group that has 7 or more carbon atoms in total include a norbornyl methoxy group, a norbornyl ethoxy group, a tricyclodecanyl methoxy group, a tricyclodecanyl ethoxy group, a tetracyclodecanyl methoxy group, a tetracyclodecanyl ethoxy group, an adamantyl methoxy group, an adamantyl ethoxy group, and the like. Among these, a norbornyl methoxy group, a norbornyl ethoxy group, and the like are preferable.

Examples of the alkyl group of the alkylcarbonyl group of $R_{14}$ include the same specific examples as the alkyl group represented by $R_{13}$ to $R_{15}$ described above.

The alkylsolfonyl group and cycloalkylsulfonyl group of $R_{14}$ are preferably linear, branched, or cyclic, and preferably have 1 to 10 carbon atoms. As the alkylsolfonyl group and cycloalkylsulfonyl group, for example, a methanesulfonyl group, an ethanesulfonyl group, an n-propanesulfonyl group, an n-butanesulfonyl group, a cyclopentanesulfonyl group, a cyclohexanesulfonyl group, and the like are preferable.

Examples of the substituent that the respective groups described above may have include a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group, and the like.

Examples of the alkoxy group include linear, branched, or cyclic alkoxy groups having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include linear, branched, or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched, or cyclic alkoxycarbonyloxy groups having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

The ring structure that two $R_{15}$s may form by binding to each other is desirably a group that forms a 5- or 6-membered ring, and particularly preferably a 5-membered ring (that is, a tetrahydrothiophene ring) together with a sulfur atom in General Formula (ZI-4). The ring structure may be condensed with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group, and the like. There may be a plurality of substituents for the ring structure, and these substituents may form a ring (an aromatic or non-aromatic hydrocarbon ring, an aromatic or non-aromatic hetero ring, and a polycyclic condensed ring formed of a combination of two or more of these rings) by binding to each other.

R₁₅ in General Formula (ZI-4) is preferably a methyl group, an ethyl group, a naphthyl group, a divalent group in which two $R_{15}$s bind to each other and form a tetrahydrothiophene ring together with a sulfur atom, or the like.

The substituent that $R_{13}$ and $R_{14}$ may have is preferably a hydroxyl group, an alkoxy group, an alkoxycarbonyl group, or a halogen atom (particularly, a fluorine atom).

l is preferably 0 or 1, and more preferably 1.

r is preferably 0 to 2.

Specific examples of the cation of the compound represented by General Formula (ZI-4) in the present invention will be shown below.

-continued

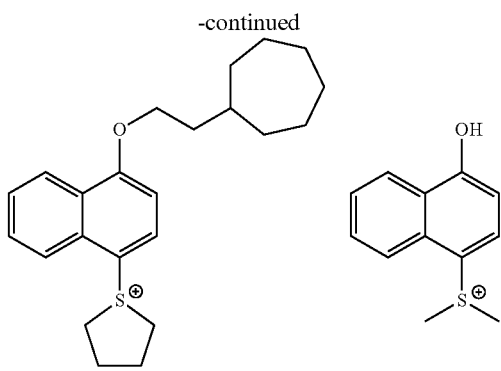

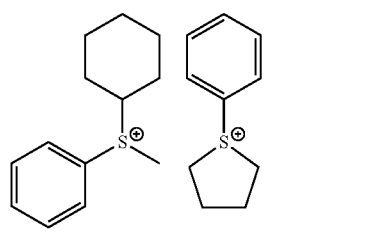

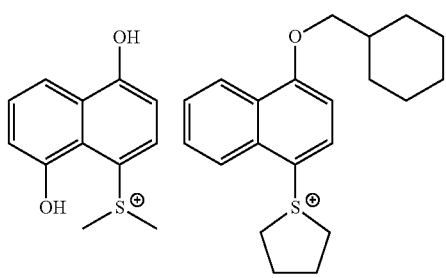

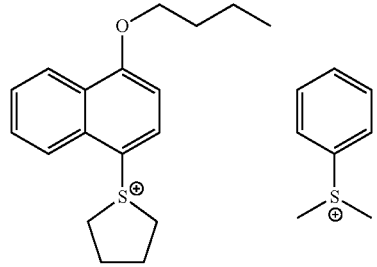

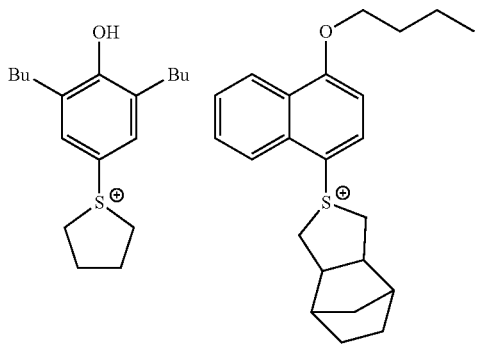

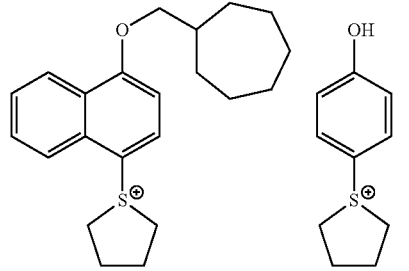

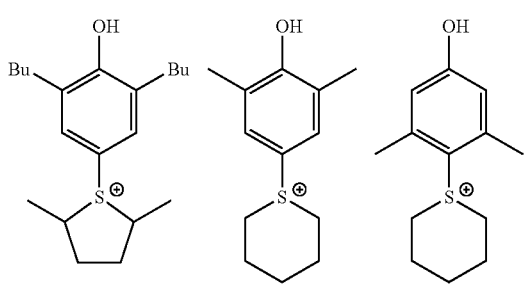

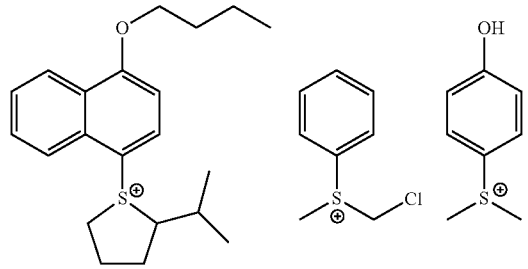

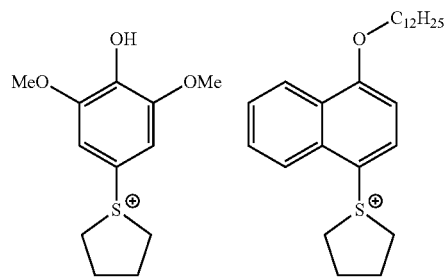

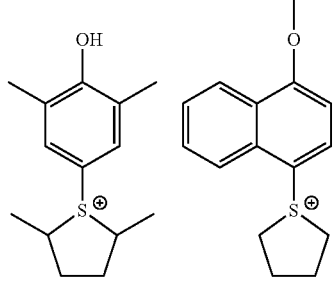

79
-continued
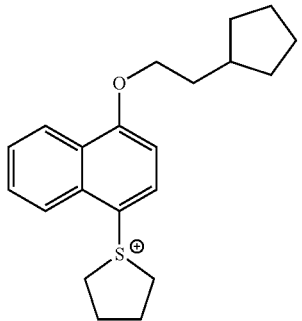
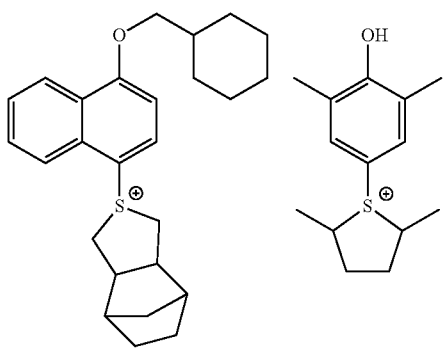
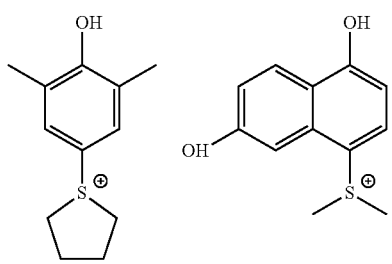
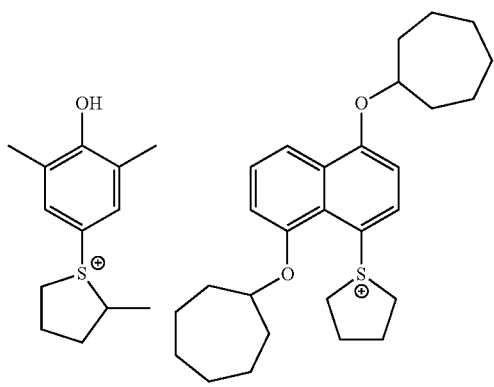
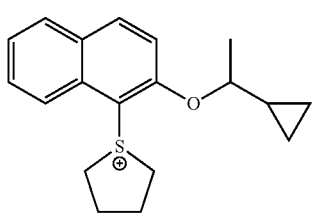
80
-continued
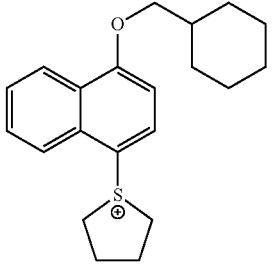
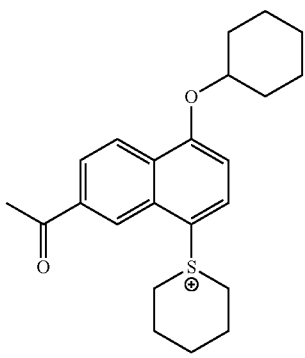
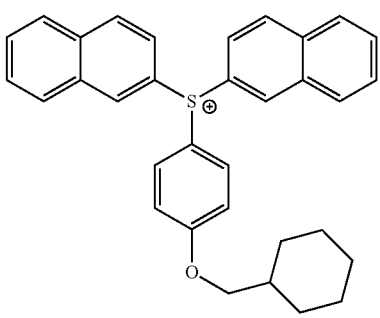
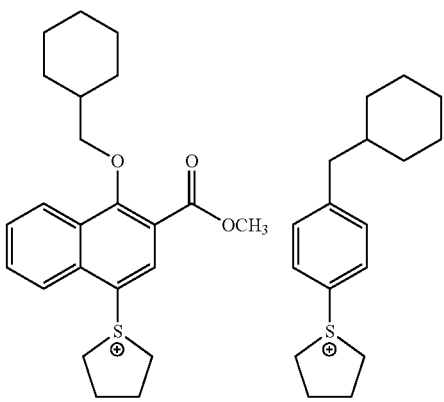
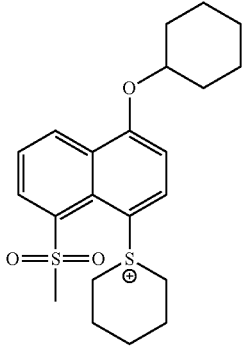

81
-continued
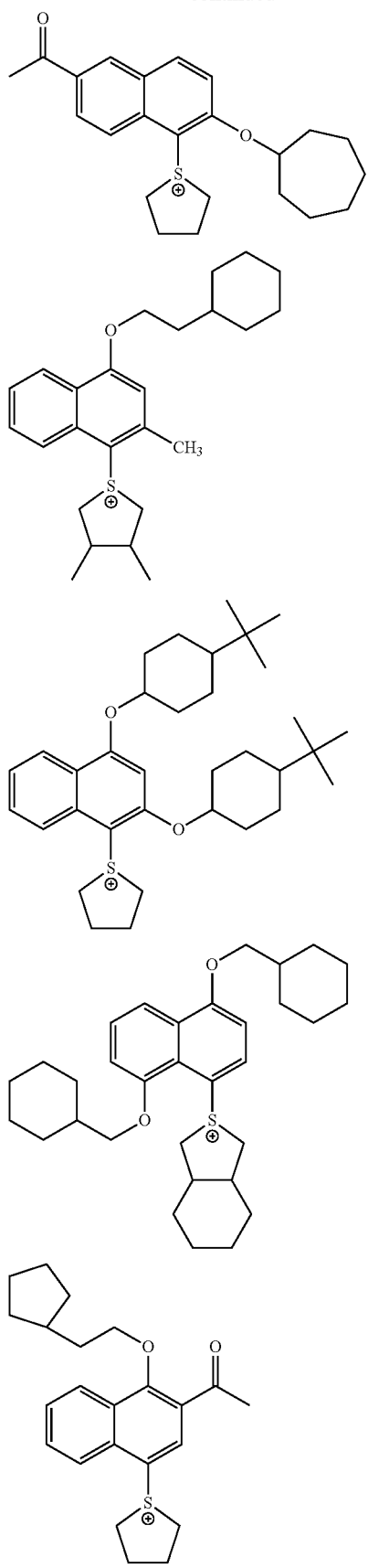
82
-continued
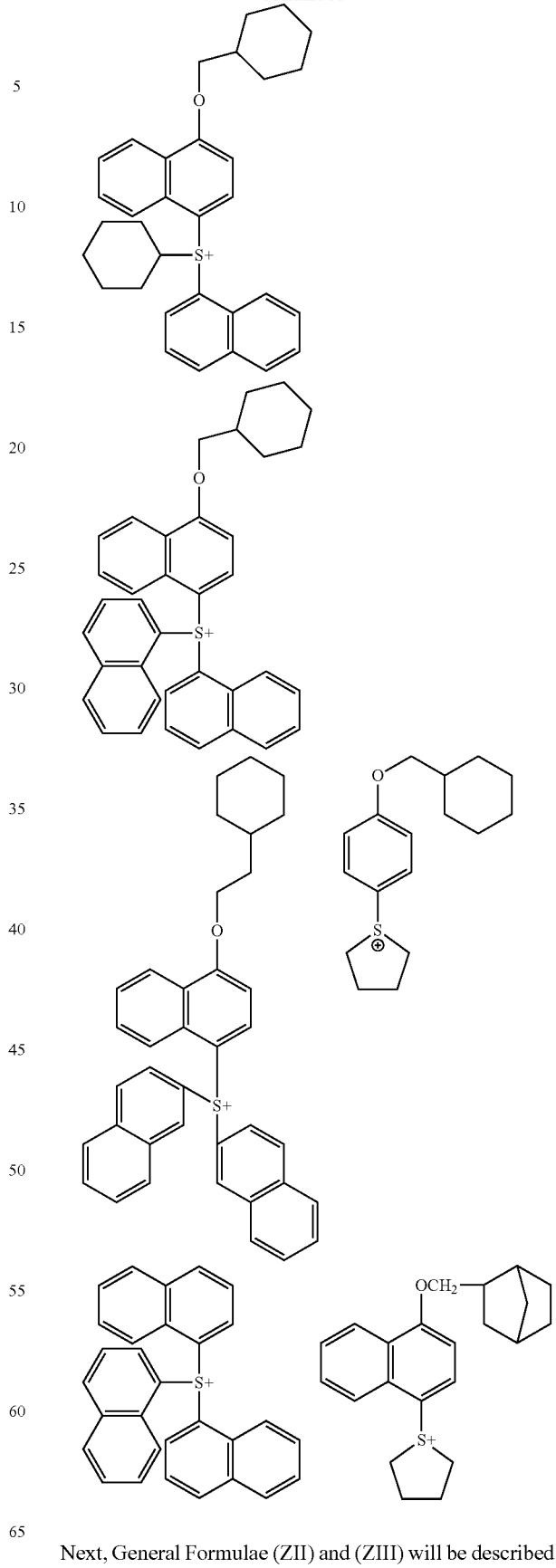
Next, General Formulae (ZII) and (ZIII) will be described.
In General Formulae (ZII) and (ZIII), each of $R_{204}$ to $R_{207}$ independently represents an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure that includes an oxygen atom, a nitrogen atom, a sulfur atom, or the like. Examples of the skeleton of the aryl group having a heterocyclic structure include pyrrole, furan, thiophene, indole, benzofuran, benzothiophene, and the like.

Preferable examples of the alkyl group and cycloalkyl group in $R_{204}$ to $R_{207}$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms.

The aryl group, alkyl group, and cycloalkyl group of $R_{204}$ to $R_{207}$ may have a substituent. Examples of the substituent that the aryl group, alkyl group, and cycloalkyl group of $R'_{204}$ to $R'_{207}$ may have include an alkyl group (having 1 to 15 carbon atoms, for example), a cycloalkyl group (having 3 to 15 carbon atoms, for example), an aryl group (having 6 to 15 carbon atoms, for example), an alkoxy group (having 1 to 15 carbon atoms, for example), a halogen atom, a hydroxyl group, a phenylthio group, and the like.

$Z^-$ represents a non-nucleophilic anion, and has the same definition as that of the non-nucleophilic anion represented by $Z^-$ in the General Formula (ZI).

Examples of the acid-generating agent further include compounds represented by the following General Formulae (ZIV), (ZV), and (ZVI).

$$Ar_3-SO_2-SO_2-Ar_4 \quad (ZIV)$$

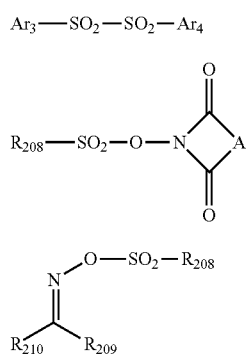

(ZV)

(ZVI)

In General Formulae (ZIV) to (ZVI), each of $Ar_3$ and $Ar_4$ independently represents an aryl group.

Each of $R_{208}$, $R_{209}$, and $R_{210}$ independently represents an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$, and $R_{210}$ include the same ones as the specific examples of the aryl group represented by $R_{201}$, $R_{202}$, and $R_{203}$ in the General Formula (ZI-1).

Specific examples of the alkyl group and the cycloalkyl group of $R_{208}$, $R_{209}$, and $R_{210}$ include the same ones as the specific examples of the alkyl group and the cycloalkyl group represented by $R_{201}$, $R_{202}$, and $R_{203}$ in the General Formula (ZI-2).

Examples of the alkylene group of A include an alkylene group (for example, a methylene group, an ethylene group, a propylene group, an isopropylene group, a butylene group, an isobutylene group, or the like) having 1 to 12 carbon atoms; examples of the alkenylene group of A' include an alkenylene group (for example, an ethenylene group, a propenylene group, a butenylene group, or the like) having 2 to 12 carbon atoms; and examples of the arylene group of A' include an arylene group (for example, a phenylene group, a tolylene group, a naphthylene group, or the like) having 6 to 10 carbon atoms.

Among the acid-generating agents, compounds represented by General Formulae (ZI) to (ZIII) are preferable.

The acid-generating agent is preferably a compound that has one sulfonic acid group or an imide group and generates an acid, more preferably a compound generating monovalent perfluoroalkane sulfonic acid, a compound generating an aromatic sulfonic acid substituted with a monovalent fluorine atom or with a group containing a fluorine atom, or a compound generating an imidic acid substituted with a monovalent fluorine atom or with a group containing a fluorine atom, and even more preferably a sulfonium salt of a fluorine-substituted alkanesulfonic acid, a fluorine-substituted benzenesulfonic acid, a fluorine-substituted imidic acid, or a fluorine-substituted methidic acid. The usable acid-generating agent is particularly preferably a fluorine-substituted alkanesulfonic acid, a fluorine-substituted benzenesulfonic acid, or a fluorine-substituted imidic acid generating acid of $pKa=-1$ or less, and this acid-generating agent improves the sensitivity of a resist film.

Among the acid-generating agents, particularly preferable examples will be shown below.

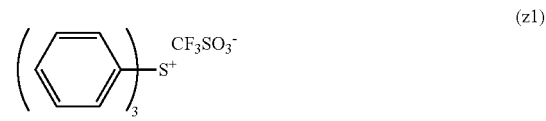
(z1)

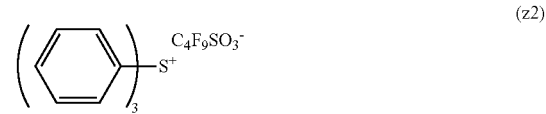
(z2)

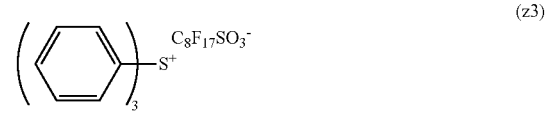
(z3)

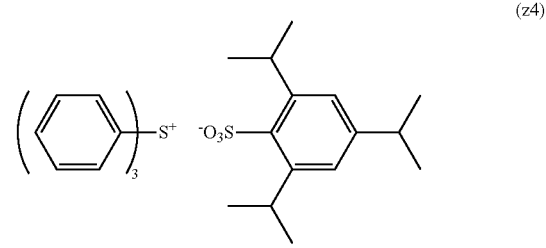
(z4)

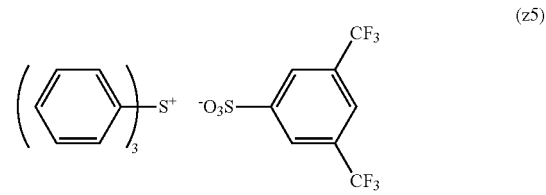
(z5)

(z6) 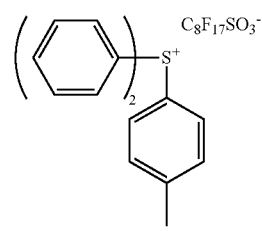
(z7) 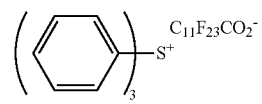
(z8) 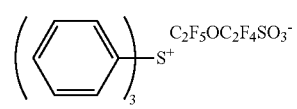
(z9) 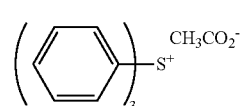
(z10) 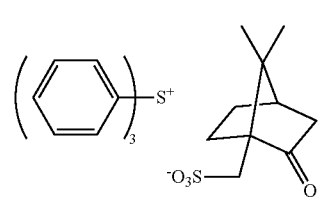
(z11) 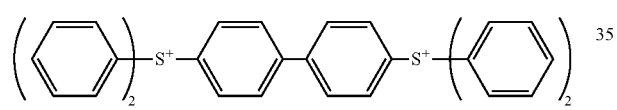
(z12) 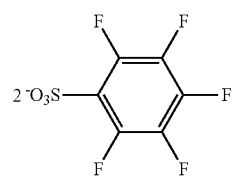
(z13) 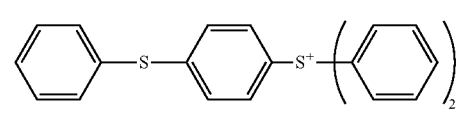
(z14) 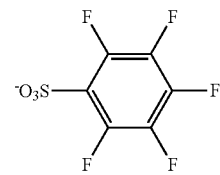
(z15) 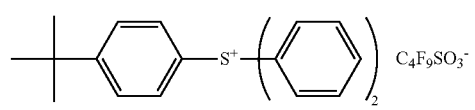
(z16) 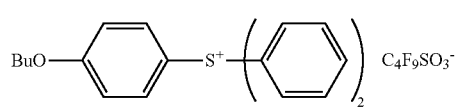
(z17) 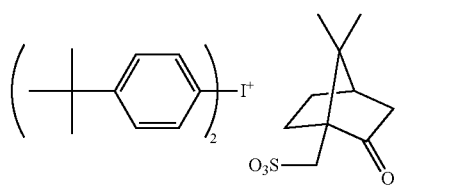
(z18) 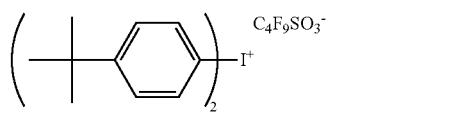
(z19) 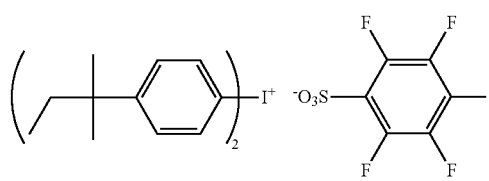
(z20) 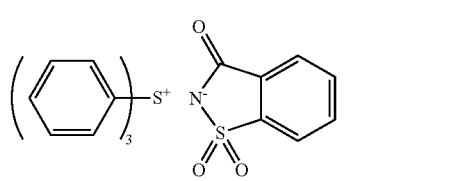
(z21) 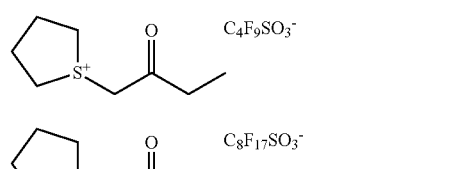
(z22) 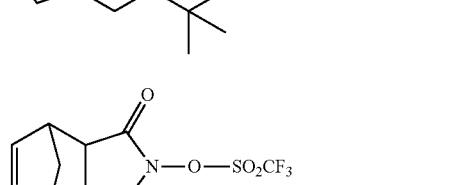
(z23) 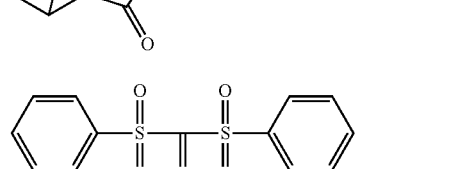
(z24) 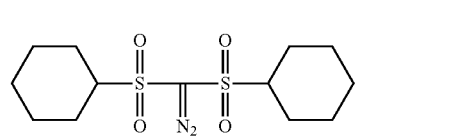
(z25) 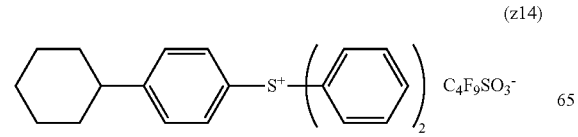

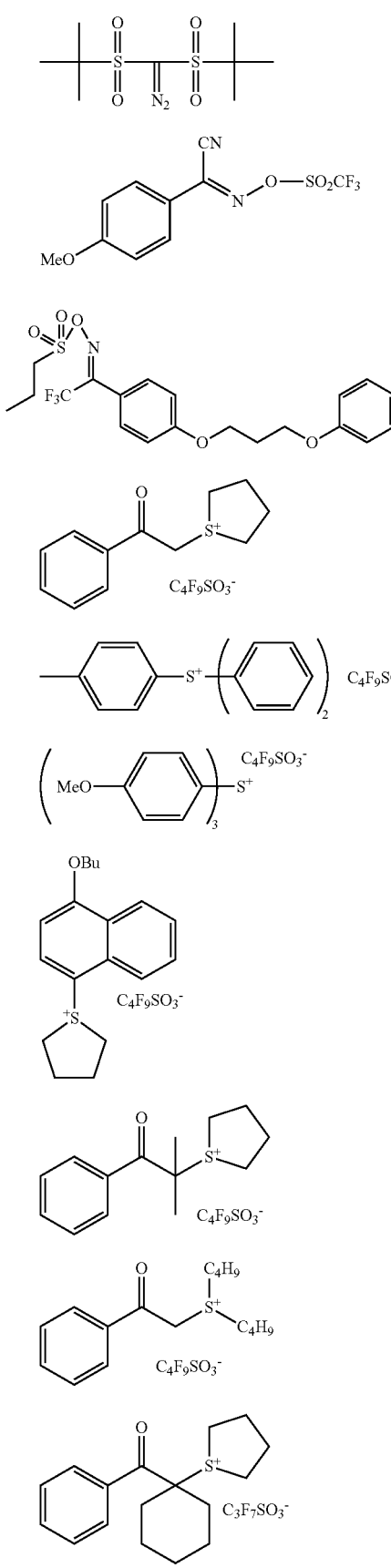
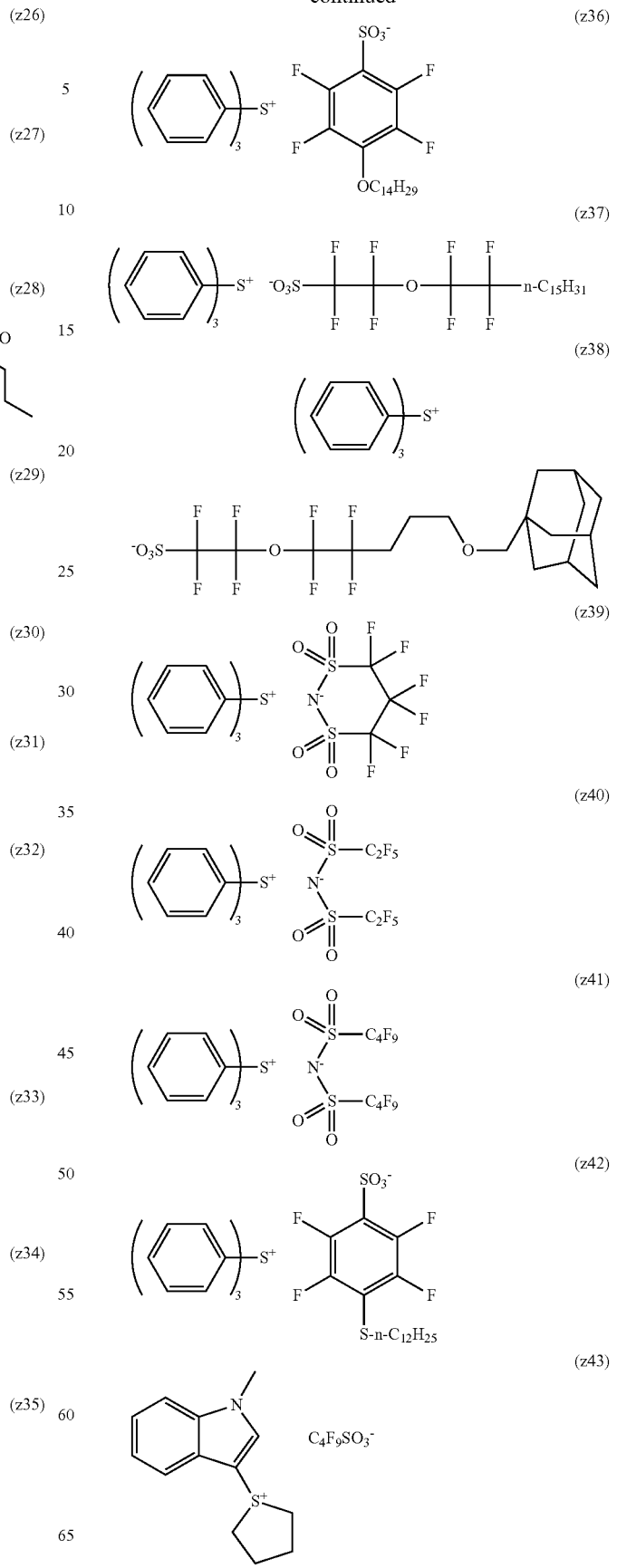

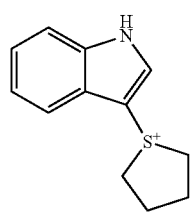 (z44)
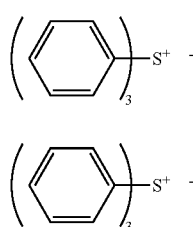 (z45)
 (z46)
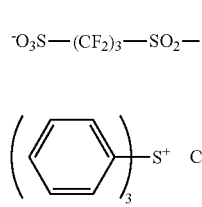 (z47)
 (z48)
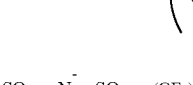 (z49)
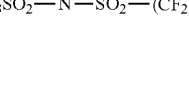 (z50)
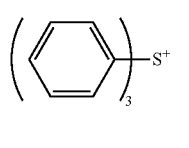 (z51)
 (z52)
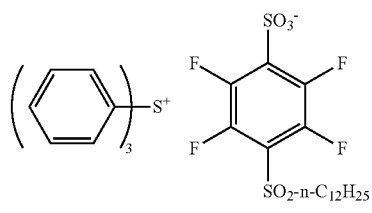 (z53)
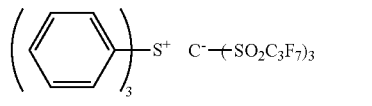 (z54)
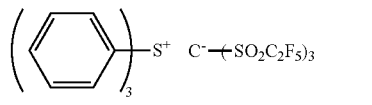 (z55)
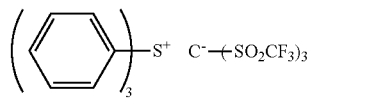 (z56)
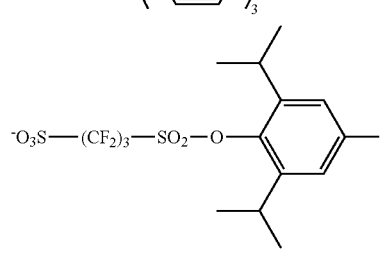 (z57)
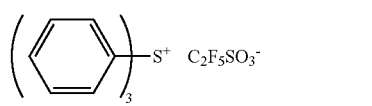 (z58)
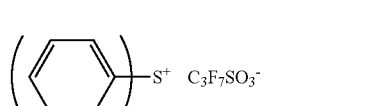 (z59)
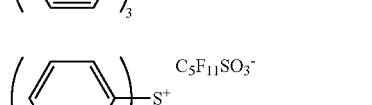 (z60)
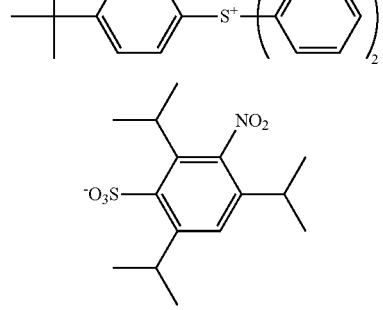 (z61)

(z62)
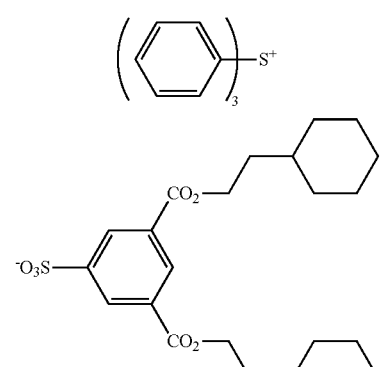
(z63)
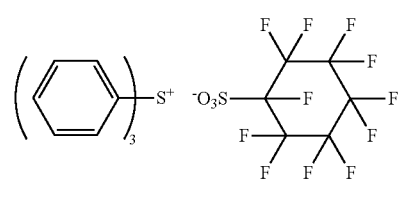
(z64)
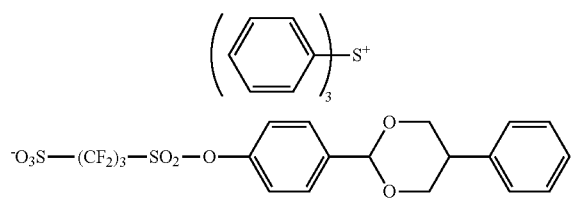
(z65)
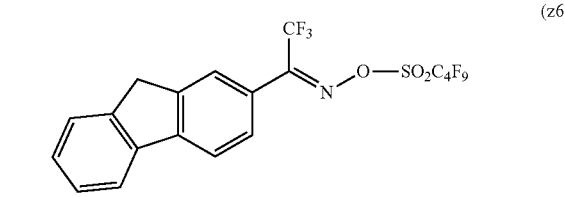
(z66)
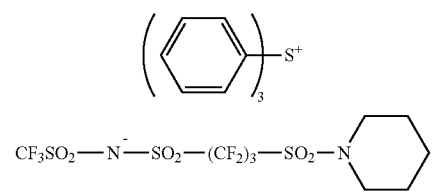
(z67)
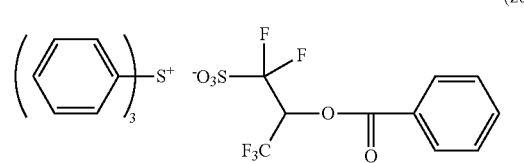
(z68)
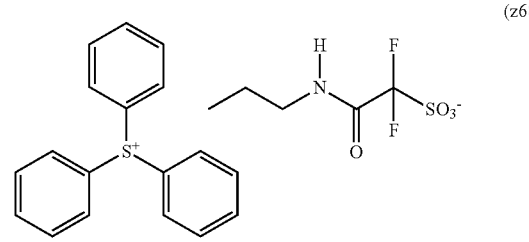
(z69)
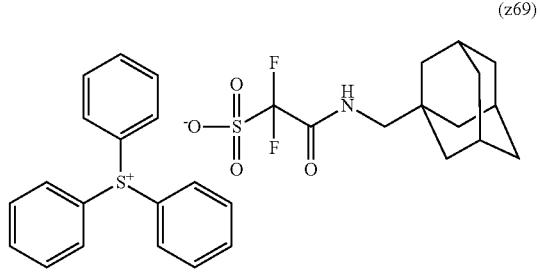
(z70)
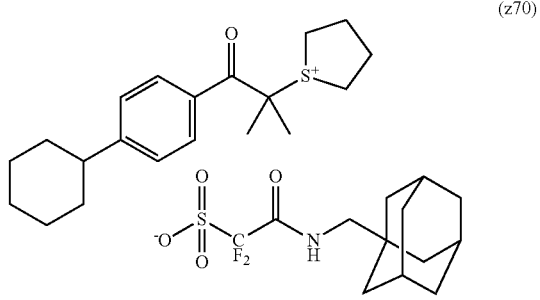
(z71)
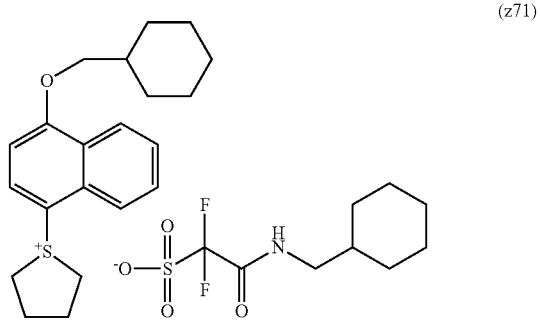
(z72)
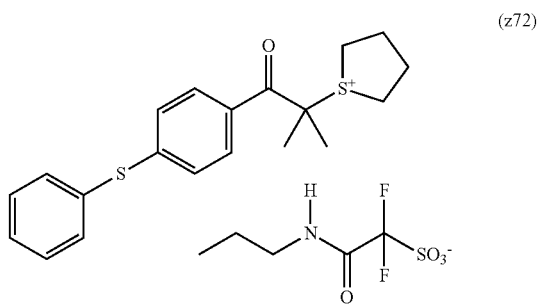
(z73)
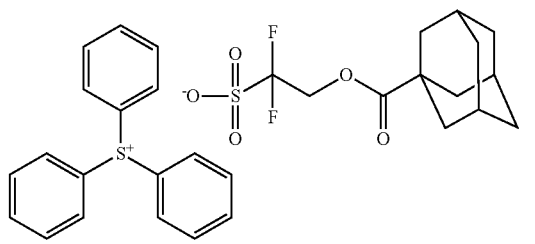

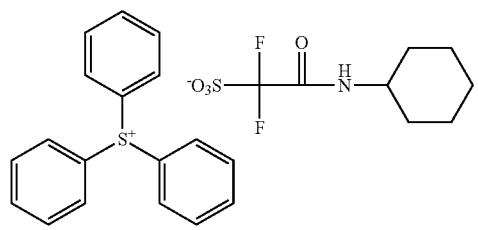
(z74)
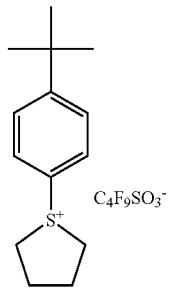
(z80)
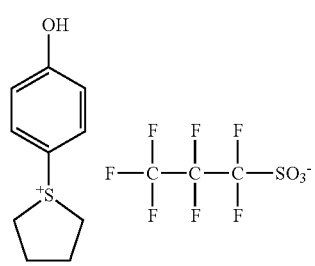
(z75)
(z81)
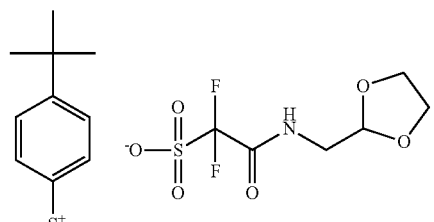
(z76)
(z82)
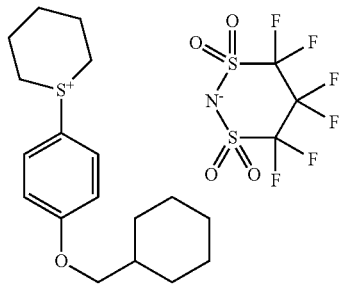
(z77)
(z83)
(z78)
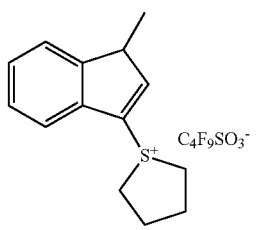
(z84)
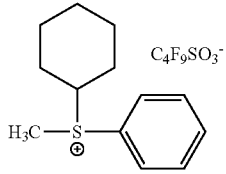
(z79)

-continued
(z85)
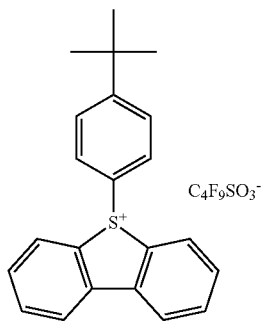
(z86)
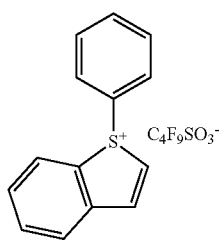
(z87)
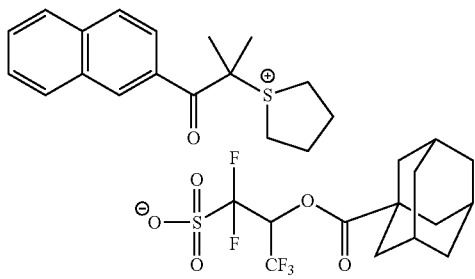
(z88)
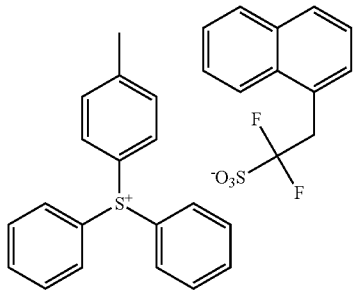
(z89)
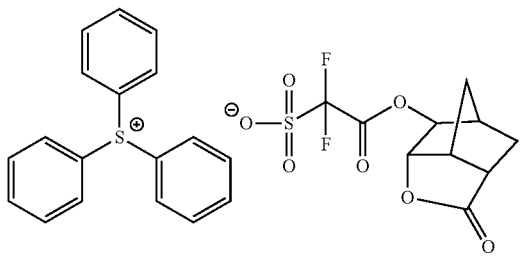
-continued
(z90)
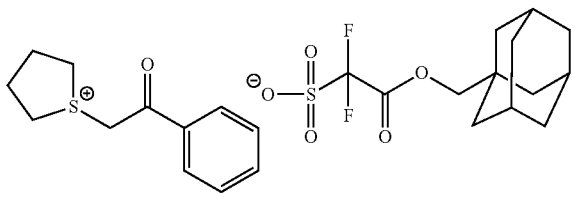
(z91)
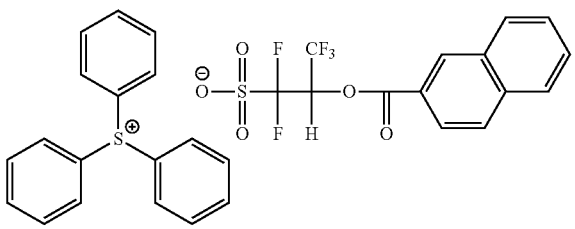
(z92)
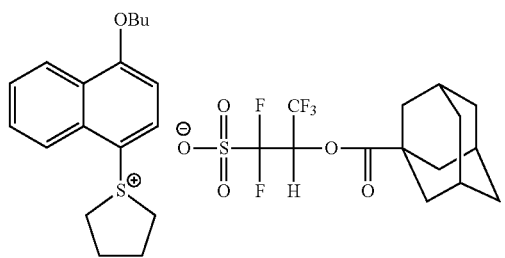
(z93)
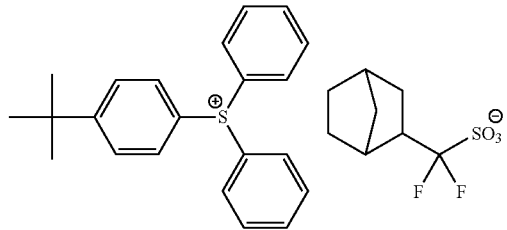
(z94)
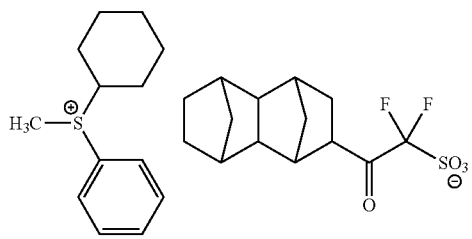
(z95)
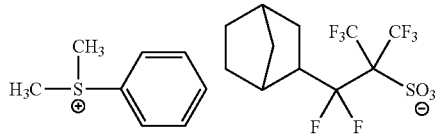

(z96) 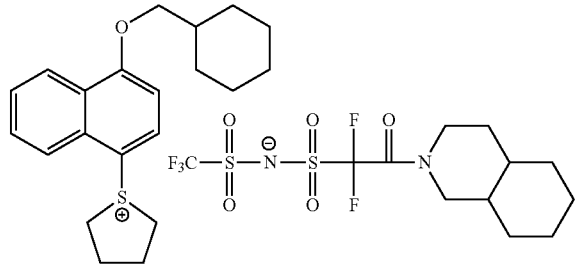

(z102) 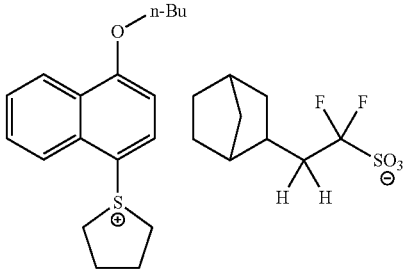

(z97) 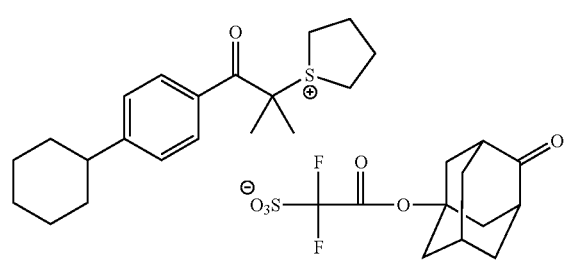

The acid-generating agent can be synthesized based on well-known methods, for example, the method disclosed in JP2007-161707A.

The acid-generating agent can be used alone or in combination of two or more kinds thereof.

The content of the compound generating an acid by being irradiated with actinic rays or radiations in the composition is preferably 0.1% by mass to 40% by mass, more preferably 1% by mass to 30% by mass, and even more preferably 4% by mass to 25% by mass, based on the total solid contents of the actinic-ray-sensitive or radiation-sensitive resin composition.

[3] Basic Compound (C)

The actinic-ray-sensitive or radiation-sensitive resin composition of the present invention preferably contains the basic compound (C) so as to reduce the change in performance caused over time from exposure to heating.

Preferable examples of the basic compound include compounds having structures represented by the following Formulae (A) to (E).

(z98) 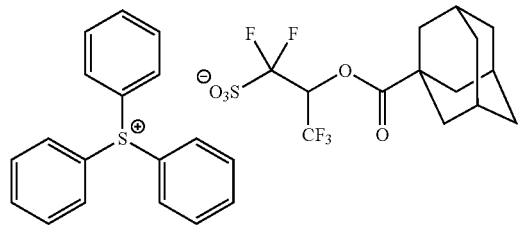

(z99) 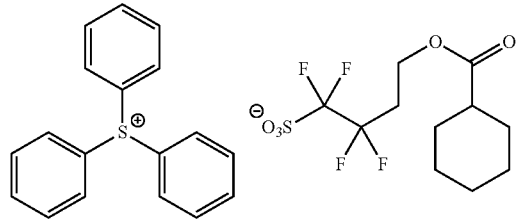

(A) 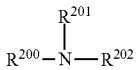

(B) 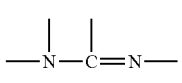

(C) 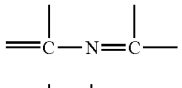

(D) 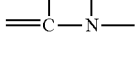

(E) 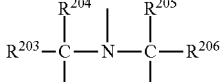

(z100) 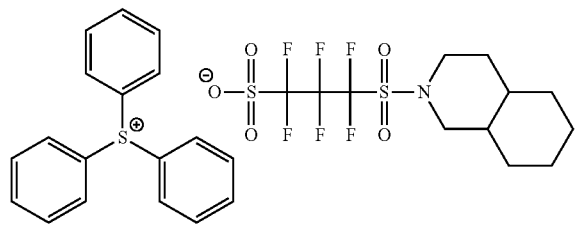

In General Formulae (A) and (E), $R^{200}$, $R^{201}$, and $R^{202}$ may be the same as or different from each other, and represent a hydrogen atom, an alkyl group (preferably having 1 to 20 carbon atoms), a cycloalkyl group (preferably having 3 to 20 carbon atoms), or an aryl group (having 6 to 20 carbon atoms). Herein, $R^{201}$ and $R^{202}$ may form a ring by binding to each other. $R^{203}$, $R^{204}$, $R^{205}$, and $R^{206}$ may be the same as or different from each other, and represent an alkyl group having 1 to 20 carbon atoms.

Regarding the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms are preferable.

(z101) 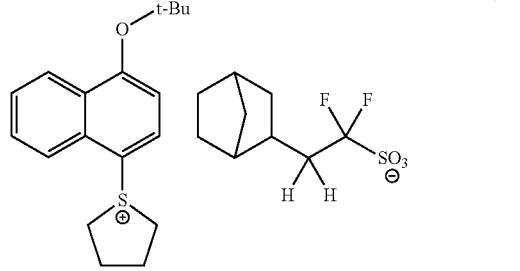

These alkyl groups in General Formulae (A) and (E) are preferably unsubstituted.

Examples of preferable compounds include guanidine, aminopyrrolidine, pyrazole, pyrazoline, piperazine, aminomorpholine, aminoalkyl morpholine, piperidine, and the like. Examples of more preferable compounds include compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, aniline derivatives having a hydroxyl group and/or an ether bond, and the like.

Examples of the compound having an imidazole structure include imidazole, 2,4,5-triphenylimidazole, benzimidazole, and the like. Examples of the compound having a diazabicyclo structure include 1,4-diazabicyclo[2,2,2]octane, 1,5-diazabicyclo[4,3,0]nona-5-ene, 1,8-diazabicyclo[5,4,0]undeca-7-ene, and the like. Examples of the compound having an onium hydroxide structure include triaryl sulfonium hydroxide, phenacyl sulfonium hydroxide, sulfonium hydroxide having a 2-oxoalkyl group, and specifically, triphenyl sulfonium hydroxide, tris(t-butylphenyl) sulfonium hydroxide, bis(t-butylphenyl)iodonium hydroxide, phenacyl thiophenium hydroxide, 2-oxopropyl thiophenium hydroxide, and the like are exemplified. The compound having an onium carboxylate structure is a compound having an onium hydroxide structure, wherein the anion portion thereof has been carboxylated. Examples of such a compound include acetate, adamantane-1-carboxylate, perfluoroalkyl carboxylate, and the like. Examples of the compound having a trialkylamine structure include tri(n-butyl)amine, tri(n-octyl)amine, and the like. Examples of the compound having an aniline structure include 2,6-diisopropylaniline, N,N-dimethylaniline, N,N-dibutylaniline, N,N-dihexylaniline, and the like. Examples of the alkylamine derivative having a hydroxyl group and/or an ether bond include ethanolamine, diethanolamine, triethanolamine, tris(methoxyethoxyethyl)amine, and the like. Examples of the aniline derivative having a hydroxyl group and/or an ether bond include N,N-bis(hydroxyethyl)aniline and the like.

Preferable examples of the basic compound further include an amine compound having a phenoxy group, an ammonium salt compound having a phenoxy group, an amine compound having a sulfonic acid ester group, and an ammonium salt compound having a sulfonic acid ester group.

It is preferable that at least one alkyl group bind to a nitrogen atom in the amine compound having a phenoxy group, the ammonium salt compound having a phenoxy group, the amine compound having a sulfonic acid ester group, and the ammonium salt compound having a sulfonic acid ester group. It is also preferable that these compounds have an oxygen atom in the alkyl chain described above, and that an oxyalkylene group be formed in the compounds. The number of the oxyalkylene group in a molecule is 1 or more, preferably 3 to 9, and more preferably 4 to 6. Among the oxyalkylene groups, a structure of —CH$_2$CH$_2$O—, —CH(CH$_3$)CH$_2$O—, or —CH$_2$CH$_2$CH$_2$O— is preferable.

Specific examples of the amine compound having a phenoxy group, the ammonium salt compound having a phenoxy group, the amine compound having a sulfonic acid ester group, and the ammonium salt compound having a sulfonic acid ester group include compounds (C1-1) to (C3-3) exemplified in [0066] of the specification of US2007/0224539A, but the present invention is not limited thereto.

As a kind of the basic compound, a nitrogen-containing organic compound having a group eliminated by the action of an acid can be used. Examples of such a compound include a compound represented by the following General Formula (F). In addition, in the compound represented by the following General Formula (F), the group eliminated by the action of an acid is eliminated, whereby the basicity is effectively exhibited in a system.

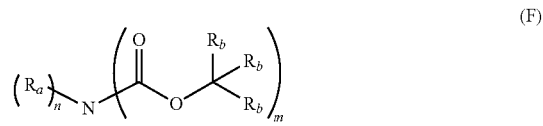

(F)

In General Formula (F), $R_a$ independently represents a hydrogen atom, an alkyl group, a cycloalkyl group, an aryl group, or an aralkyl group. When n=2, two $R_a$s may be the same as or different from each other, and the two $R_a$s may form a divalent heterocyclic hydrocarbon group (preferably having 20 or less carbon atoms) or a derivative thereof by binding to each other.

$R_b$ independently represents a hydrogen atom, an alkyl group, a cycloalkyl group, an aryl group, or an aralkyl group. Here, in —C($R_b$)($R_b$)($R_b$), when one or more $R_b$s are hydrogen atoms, at least one of the remaining $R_b$s is a cyclopropyl group or a 1-alkoxyalkyl group.

At least two $R_b$s may form an alicyclic hydrocarbon group, an aromatic hydrocarbon group, a heterocyclic hydrocarbon group, or a derivative thereof by binding to each other.

n represents an integer of 0 to 2, m represents an integer of 1 to 3, and n+m=3.

In General Formula (F), the alkyl group, cycloalkyl group, aryl group, and aralkyl group represented by $R_a$ and $R_b$ may be substituted with a functional group such as a hydroxyl group, a cyano group, an amino group, a pyrrolidino group, a piperidino group, a morpholino group, an oxo group or with an alkoxy group or a halogen atom.

Examples of the alkyl group, cycloalkyl group, aryl group, or aralkyl group (these alkyl group, cycloalkyl group, aryl group, and aralkyl group may be substituted with the functional group, alkoxy group, or halogen atom described above) of the $R_a$ and/or $R_b$ include.

A group derived from a linear or branched alkane such as methane, ethane, propane, butane, pentane, hexane, heptane, octane, nonane, decane, undecane, or dodecane; a group obtained by substituting these alkane-derived groups with one or more kinds or one or more cycloalkyl groups such as a cyclobutyl group, a cyclopentyl group, or a cyclohexyl group;

A group derived from cycloalkane such as cyclobutane, cyclopentane, cyclohexane, cycloheptane, cyclooctane, norbornane, adamantane, or noradamantane; a group obtained by substituting these cycloalkane-derived groups with one or more kinds or one or more linear or branched alkyl groups such as a methyl group, an ethyl group, an n-propyl group, an i-propyl group, an n-butyl group, a 2-methylpropyl group, a 1-methylpropyl group, or a t-butyl group;

A group derived from aromatic compounds such as benzene, naphthalene and anthracene; a group obtained by substituting these aromatic group-derived groups with one or more kinds or one or more linear or branched alkyl groups such as a methyl group, an ethyl group, an n-propyl group, an i-propyl group, an n-butyl group, a 2-methylpropyl group, a 1-methylpropyl group, or a t-butyl group;

A group derived from heterocyclic compounds such as pyrrolidine, piperidine, morpholine, tetrahydrofuran, tetrahydropyran, indole, indoline, quinoline, perhydroquinoline, indazole, and benzimidazole; a group obtained by substituting these heterocyclic compound-derived groups with one or more kinds or one or more of groups derived from a linear or branched alkyl group or a group derived from aromatic compounds; a group obtained by substituting a group derived from a linear or branched alkane and a group derived form cycloalkane with one or more kinds or one or more groups derived from aromatic compounds such as a phenyl group, a naphthyl group, and an anthracenyl group; or a group obtained by substituting the above-described substituents with a functional group such as a hydroxyl group, a cyano group, an amino group, a pyrrolidine group, a piperidine group, a morpholino group, or an oxo group.

Examples of the divalent heterocyclic hydrocarbon group (preferably having 1 to 20 carbon atoms) or the derivative thereof that the $R_a$s form by binding to each other include a group obtained by substituting a group derived from heterocyclic compounds such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane and a group derived from these heterocyclic compounds with one or more kinds or one or more groups derived from a linear or branched alkane, a group derived from a cycloalkane, a group derived from aromatic compounds, a group derived from heterocyclic compounds, or a functional group such as a hydroxyl group, a cyano group, an amino group, a pyrrolidino group, a piperidino group, a morpholino group, or an oxo group.

Specific examples of the particularly preferable examples of the present invention include N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylmorpholine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and the like.

As the compound represented by the General Formula (F), commercially available ones may be used. Alternatively, the compound may be synthesized from commercially available amine through a method disclosed in Protective Groups in Organic Synthesis, the 4$^{th}$ edition, or the like. The compound can be synthesized based on the most common method, for example, the method disclosed in JP-2009-199021A.

The molecular weight of the basic compound is preferably 250 to 2000, and even more preferably 400 to 1000. From the viewpoint of further reducing LER, the molecular weight of the basic compound is preferably 400 or more, more preferably 500 or more, and even more preferably 600 or more.

These basic compounds may be used alone or in combination of two or more kinds thereof.

The amount of the basic compound used is generally 0.001% by mass to 10% by mass, and preferably 0.01% by mass to 5% by mass, based on the solid content of the actinic-ray-sensitive or radiation-sensitive resin composition.

The ratio between the acid-generating agent and the basic compound used in the composition is preferably an acid-generating agent/a basic compound (molar ratio)=2.5 to 300. That is, in respect of the sensitivity and resolution of the resist film, the molar ratio is preferably 2.5 or higher, and in respect of inhibiting the reduction in resolution resulting from thickening of a resist pattern caused with time elapsing to heating treatment after exposure, the molar ratio is preferably 300 or lower. The acid-generating agent/basic compound (molar ratio) is more preferably 5.0 to 200, and more preferably 7.0 to 150.

[4] Solvent (D)

Examples of the solvent that can be used for preparing the actinic-ray-sensitive or radiation-sensitive resin composition of the present invention include organic solvents such as alkylene glycol monoalkyl ether carboxylate, alkylene glycol monoalkyl ether, alkyl lactate ester, alkyl alkoxy propionate, cyclic lactone (preferably having 4 to 10 carbon atoms), a monoketone compound (preferably having 4 to 10 carbon atoms) that may have a ring, alkylene carbonate, alkyl alkoxy acetate, and alkyl pyruvate.

Specific examples of these solvents include the solvents disclosed in Paragraphs [0441] to [0455] in the specification of US2008/0187860A.

In the present invention, as an organic solvent, a mixed solvent which is a mixture of a solvent containing a hydroxyl group in the structure and a solvent not containing a hydroxyl group may be used.

The solvent containing a hydroxyl group and the solvent not containing a hydroxyl group can be appropriately selected from the example compounds described above. The solvent containing a hydroxyl group is preferably alkylene glycol monoalkyl ether, alkyl lactate, or the like, and more preferably propylene glycol monomethyl ether (PGME, having another name of 1-methoxy-2-propanol) or ethyl lactate. The solvent not containing a hydroxyl group is preferably alkylene glycol monoalkyl ether acetate, alkyl alkoxy propionate, a monoketone compound that may contain a ring, cyclic lactone, alkyl acetate, or the like. Among these, propylene glycol monomethyl ether acetate (PGMEA, having another name of 1-methoxy-2-acetoxypropane), ethyl ethoxy propionate, 2-heptanone, γ-butyrolactone, cyclohexanone, and butyl acetate are particularly preferable, and propylene glycol monomethyl ether acetate, ethyl ethoxy propionate, and 2-heptanone are most preferable.

The mixing ratio (mass) between the solvent containing a hydroxyl group and the solvent not containing a hydroxyl group is 1/99 to 99/1, preferably 10/90 to 90/10, and more preferably 20/80 to 60/40. A mixed solvent that contains 50% by mass or more of the solvent not containing a hydroxyl group is particularly preferable in respect of coating uniformity.

The solvent preferably contains propylene glycol monomethyl ether acetate. In addition, the solvent is preferably a single solvent of propylene glycol monomethyl ether acetate or a mixed solvent of two or more kinds of solvents containing propylene glycol monomethyl ether acetate.

[5] Hydrophobic Resin (E)

When the actinic-ray-sensitive or radiation-sensitive resin composition of the present invention is applied particularly to the liquid immersion exposure, this composition may contain a hydrophobic resin (hereinafter, also referred to as a "hydrophobic resin (E)" or simply as a "resin (E)") that contains at least one of a fluorine atom and a silicon atom. In this manner, the hydrophobic resin (E) is localized on the surface layer of a film, and the static and dynamic contact angle of the resist film surface with respect to water (a liquid immersion medium) is improved accordingly, whereby traceability of the resist film with respect to the liquid for liquid immersion is improved.

It is preferable to design such that the hydrophobic resin (E) is localized in the interface as described above. However, contrary to a surfactant, the hydrophobic resin does not necessarily have a hydrophilic group in a molecule and may not help a polar substance and a non-polar substance to be evenly mixed.

The hydrophobic resin (E) typically contains a fluorine atom and/or a silicon atom. The fluorine atom and/or the silicon atom in the hydrophobic resin (E) may be contained in either the main chain or the side chain of the resin.

When the hydrophobic resin (E) contains a fluorine atom, the resin is preferably a resin including, as a partial structure containing the fluorine atom, an alkyl group having a fluorine atom, a cycloalkyl group having a fluorine atom, or an aryl group having a fluorine atom.

The alkyl group (preferably having 1 to 10 carbon atoms, and more preferably having 1 to 4 carbon atoms) having a fluorine atom is a linear or branched alkyl group in which at least one hydrogen atom has been substituted with a fluorine atom, and may further have a substituent other than a fluorine atom.

The cycloalkyl group having a fluorine atom is a monocyclic or polycyclic cycloalkyl group in which at least one hydrogen atom has been substituted with a fluorine atom, and may further have a substituent other than a fluorine atom.

Examples of the aryl group having a fluorine atom include aryl groups such as a phenyl group and naphthyl group in which at least one hydrogen atom has been substituted with a fluorine atom. The aryl group may further have a substituent other than a fluorine atom.

Examples of the alkyl group having a fluorine atom, the cycloalkyl group having a fluorine atom, and the aryl group having a fluorine atom preferably include groups represented by the following General formulae (F2) to (F4), but the present invention is not limited thereto.

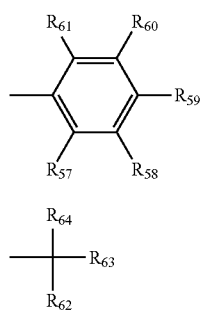

(F2)

(F3)

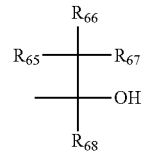

(F4)

In General formulae (F2) to (F4),
each of $R_{57}$ to $R_{68}$ independently represents a hydrogen atom, a fluorine atom, or a (linear or branched) alkyl group. Here, at least one of $R_{57}$ to $R_{61}$, at least one of $R_{62}$ to $R_{64}$, and at least one of $R_{65}$ to $R_{68}$ independently represent a fluorine atom or an alkyl group (preferably having 1 to 4 carbon atoms) in which at least one hydrogen atom has been substituted with a fluorine atom.

All of $R_{57}$ to $R_{61}$ and $R_{65}$ to $R_{67}$ are preferably fluorine atoms. $R_{62}$, $R_{63}$, and $R_{68}$ are preferably alkyl groups (preferably having 1 to 4 carbon atoms) in which at least one hydrogen atom has been substituted with a fluorine atom, and more preferably perfluoroalkyl groups having 1 to 4 carbon atoms. $R_{62}$ and $R_{63}$ may form a ring by being linked to each other.

Specific examples of the group represented by General formula (F2) include a p-fluorophenyl group, a pentafluorophenyl group, a 3,5-di(trifluoromethyl)phenyl group, and the like.

Specific examples of the group represented by General formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group, and the like. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferable, and a hexafluoroisopropyl group and a heptafluoroisopropyl group are more preferable.

Specific examples of the group represented by General formula (F4) include —C(CF$_3$)$_2$OH, —C(C$_2$F$_5$)$_2$OH, —C(CF$_3$)(CH$_3$)OH, —CH(CF$_3$)OH, and the like, and —C(CF$_3$)$_2$OH is preferable.

The partial structure having a fluorine atom may directly bind to the main chain, or may bind to the main chain via a group selected from a group consisting of an alkylene group, a phenylene group, an ether bond, a thioether bond, a carbonyl group, an ester bond, an amide bond, a urethane bond, and a ureylene bond, or via a group including a combination of two or more kinds of the above ones.

Examples of suitable repeating units having a fluorine atom include repeating units shown below.

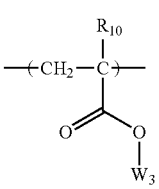

(C-Ia)

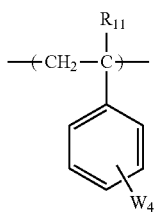
(C-Ib)

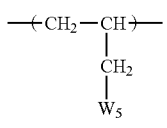
(C-Ic)

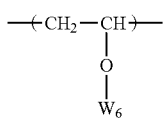
(C-Id)

In the formulae, each of $R_{10}$ and $R_{11}$ independently represents a hydrogen atom, a fluorine atom, or an alkyl group. The alkyl group is preferably a linear or branched alkyl group having 1 to 4 carbon atoms, and may have a substituent. Examples of the alkyl group having a substituent particularly include a fluorinated alkyl group.

Each of $W_3$ to $W_6$ independently represents an organic group containing at least one fluorine atom. Specific examples thereof include atomic groups of (F2) to (F4) described above.

In addition to the above repeating units, the hydrophobic resin (E) may include units shown below as the repeating unit having a fluorine atom.

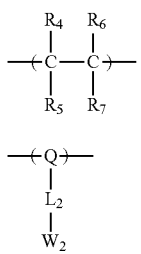
(C-II)

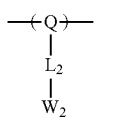
(C-III)

In the formulae, each of $R_4$ to $R_7$ independently represents a hydrogen atom, a fluorine atom, or an alkyl group. The alkyl group is preferably a linear or branched alkyl group having 1 to 4 carbon atoms, and may have a substituent. Examples of the alkyl group having a substituent particularly include a fluorinated alkyl group.

Here, at least one of $R_4$ to $R_7$ represents a fluorine atom. $R_4$ and $R_5$ or $R_6$ and $R_7$ may form a ring.

$W_2$ represents an organic group containing at least one fluorine atom, and specific examples thereof include atomic groups of (F2) to (F4) described above.

$L_2$ represents a single bond or a divalent linking group. The divalent linking group represents a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or alkyl), —NHSO$_2$—, or a divalent linking group including a combination of a plurality of the above ones.

Q represents an alicyclic structure. The alicyclic structure may have a substituent, and may be a monocyclic or polycyclic. If the structure is polycyclic, the structure may be a bridged structure. The monocyclic structure is preferably a cycloalkyl group having 3 to 8 carbon atoms, and examples thereof include a cyclopentyl group, a cyclohexyl group, a cyclobutyl group, a cyclooctyl group, and the like. Examples of the polycyclic structure include groups having a bicyclo, tricyclo, or tetracyclo structure having 5 or more carbon atoms, and a cycloalkyl group having 6 to 20 carbon atoms is preferable. Examples thereof include an adamantyl group, a norbornyl group, a dicyclopentyl group, a tricyclodecanyl group, a tetracyclododecyl group, and the like. A portion of the carbon atoms in the cycloalkyl group may be substituted with hetero atoms such as oxygen atoms. Particularly preferable examples of Q include a norbornyl group, a tricyclodecanyl group, a tetracyclododecyl group, and the like.

Specific examples of the repeating unit having a fluorine atom will be shown below, but the present invention is not limited to the examples.

In the specific examples, $X_1$ represents a hydrogen atom, —CH$_3$, —F, or —CF$_3$, and $X_2$ represents —F, or —CF$_3$.

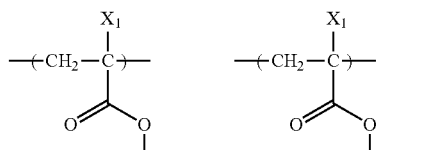

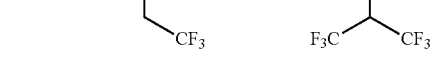

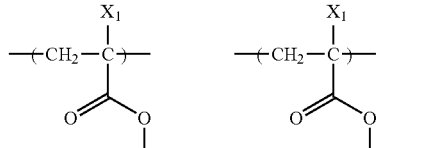

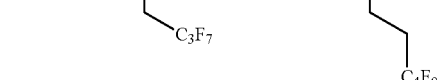

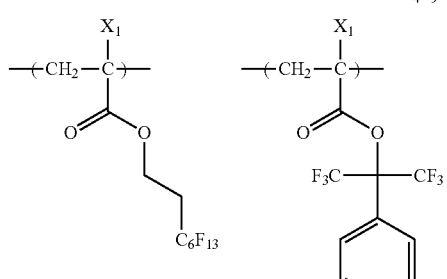

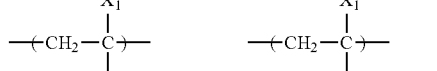

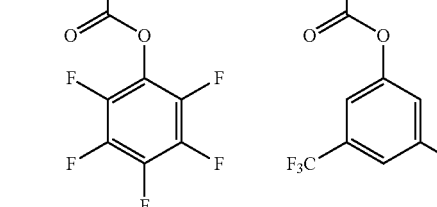

107
-continued
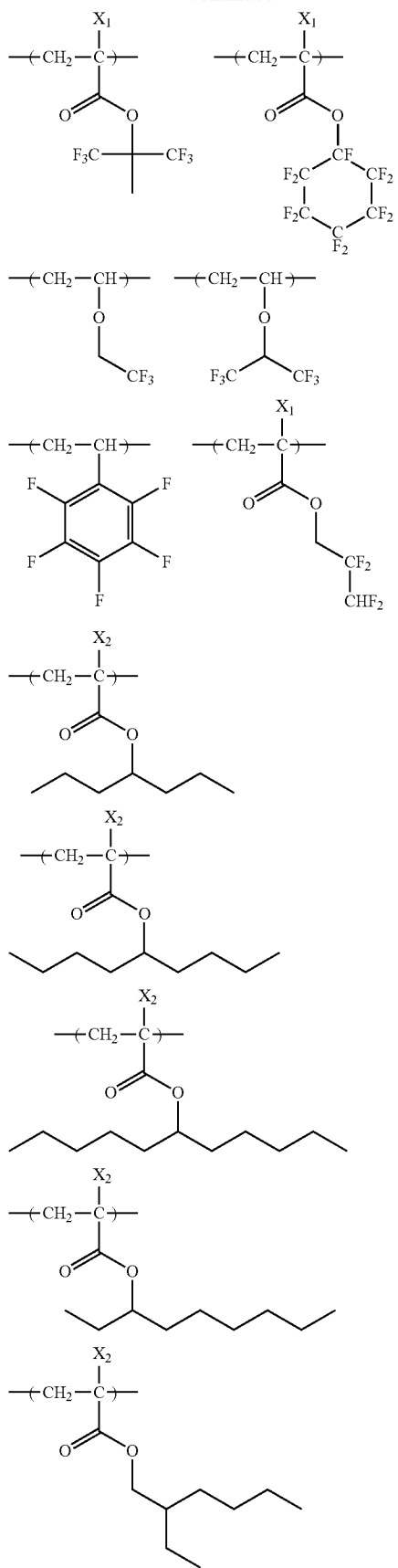
108
-continued
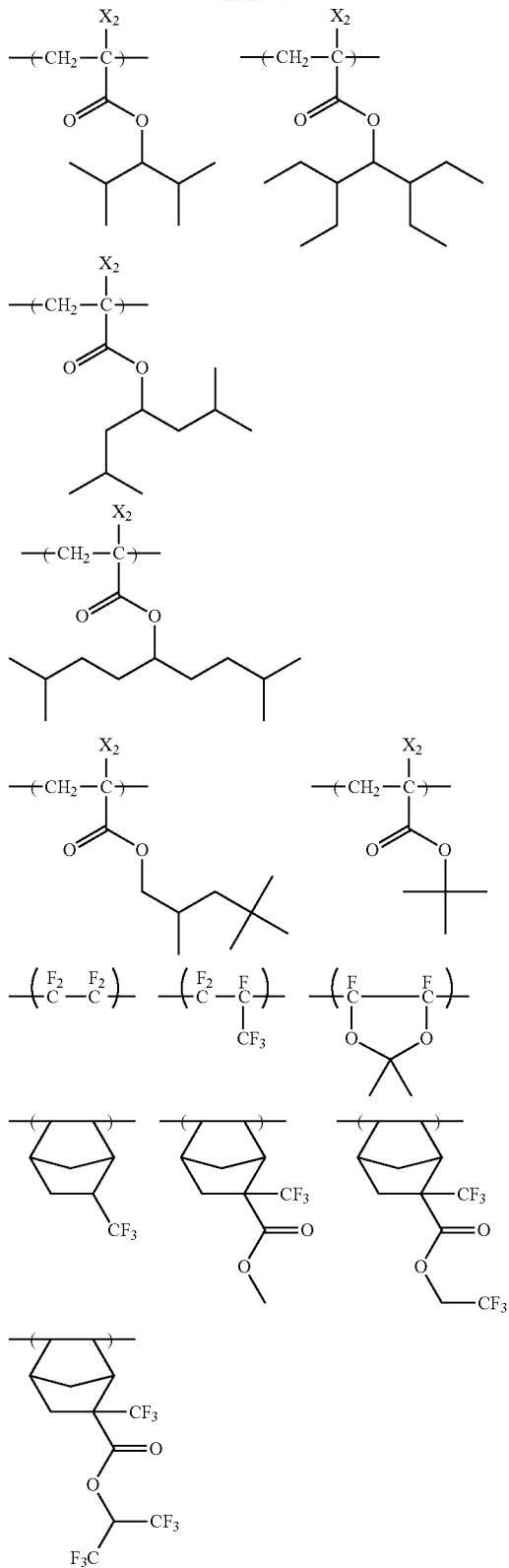
The hydrophobic resin (E) may contain a silicone atom. The hydrophobic resin (E) preferably has an alkylsilyl structure (preferably a trialkylsilyl group) or a cyclic siloxane structure as a partial structure having a silicon atom.

Specific examples of the alkylsilyl structure or the cyclic siloxane structure include groups represented by the following General formulae (CS-1) to (CS-3).

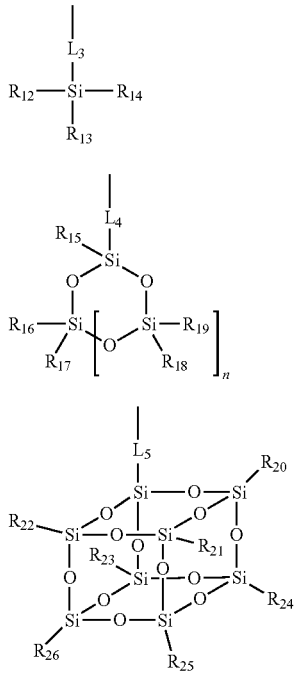

In General formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

$L_3$ to $L_5$ represent a single bond or a divalent linking group. Examples of the divalent linking group include a single group or a combination of two or more kinds of groups (preferably having 12 or less carbon atoms) selected from a group consisting of an alkylene group, a phenylene group, an ether bond, a thioether bond, a carbonyl group, an ester bond, an amide bond, a urethane bond, and a ureylene bond.

n represents an integer of 1 to 5, and is preferably an integer of 2 to 4.

Specific examples of the repeating unit having the group represented by General Formulae (CS-1) to (CS-3) will be shown below, but the present invention is not limited thereto. In the specific examples, $X_1$ represents a hydrogen atom, —$CH_3$, —F, or —$CF_3$.

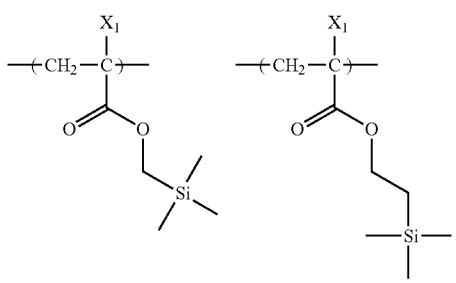

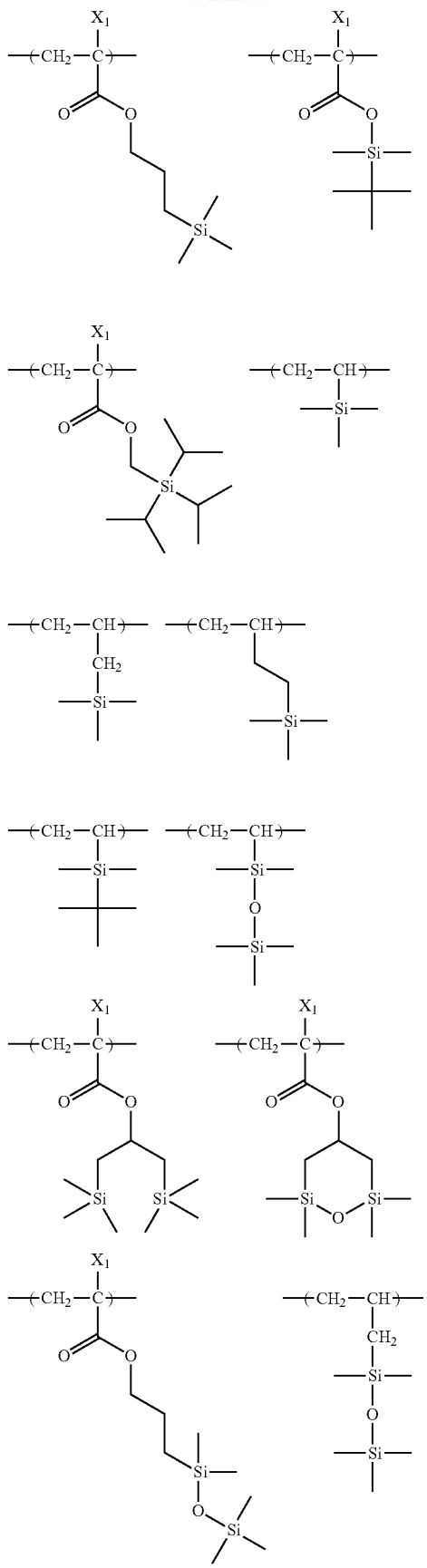

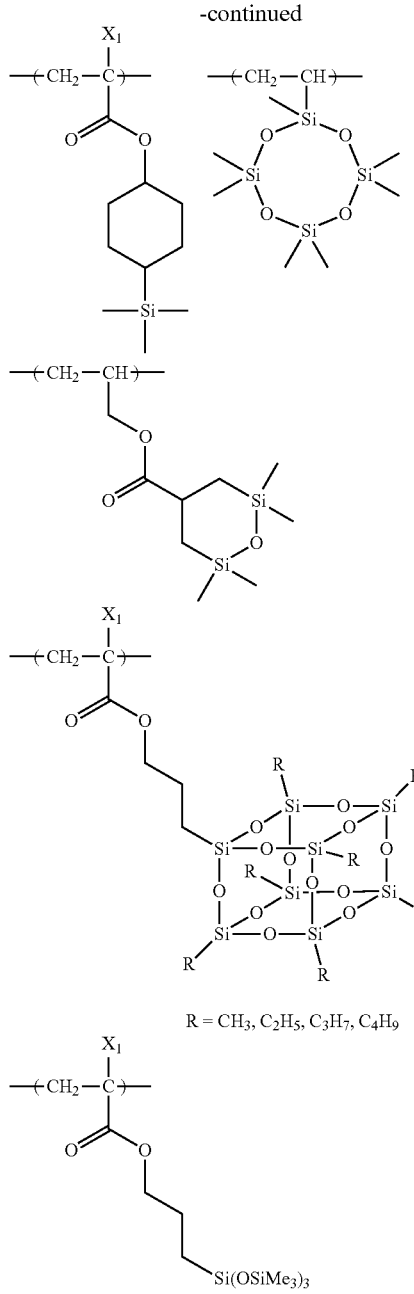

The hydrophobic resin (E) may contain at least one group selected from a group consisting of (x) to (z) shown below.

(x) an acid group (y) a group having a lactone structure, an acid anhydride group, or an acid imide group (z) a group degraded by the action of an acid Examples of the acid group (x) include a phenolic hydroxyl group, a carboxylic group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

Examples of the preferable acid group include a fluorinated alcohol group (preferably a hexafluoroisopropanol), a sulfonimide group, and a bis(alkylcarbonyl)methylene group.

Examples of a repeating unit having the acid group (x) include a repeating unit in which the acid group directly binds to the main chain of a resin, such as a repeating unit of acrylic acid or methacrylic acid, a repeating unit in which the acid group binds to the main chain of a resin via a linking group, and the like. In addition, a polymerization initiator and a chain transfer agent having an acid group can be introduced to the terminal of a polymer chain during polymerization, and any of cases is preferable. The repeating unit having the acid group (x) may contain at least any one of a fluorine atom and a silicon atom.

The content of the repeating unit having the acid group (x) is preferably 1 mol % to 50 mol %, more preferably 3 mol % to 35 mol %, and even more preferably 5 mol % to 20 mol %, based on all repeating units in the hydrophobic resin (E).

Specific examples of the repeating unit having the acid group (x) will be shown below, but the present invention is not limited thereto. In the formula, Rx represents a hydrogen atom, $CH_3$, $CF_3$, or $CH_2OH$.

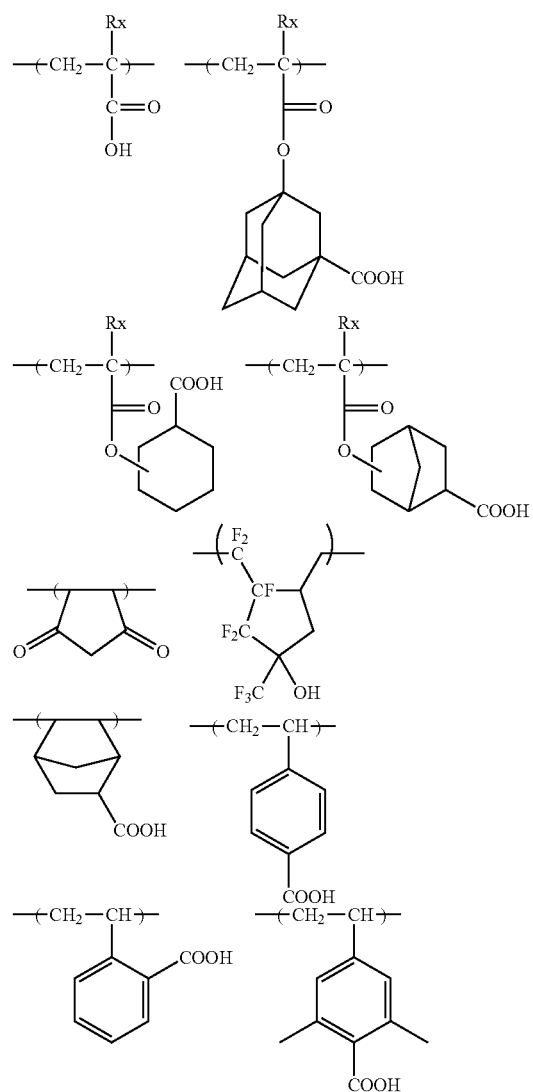

113
-continued
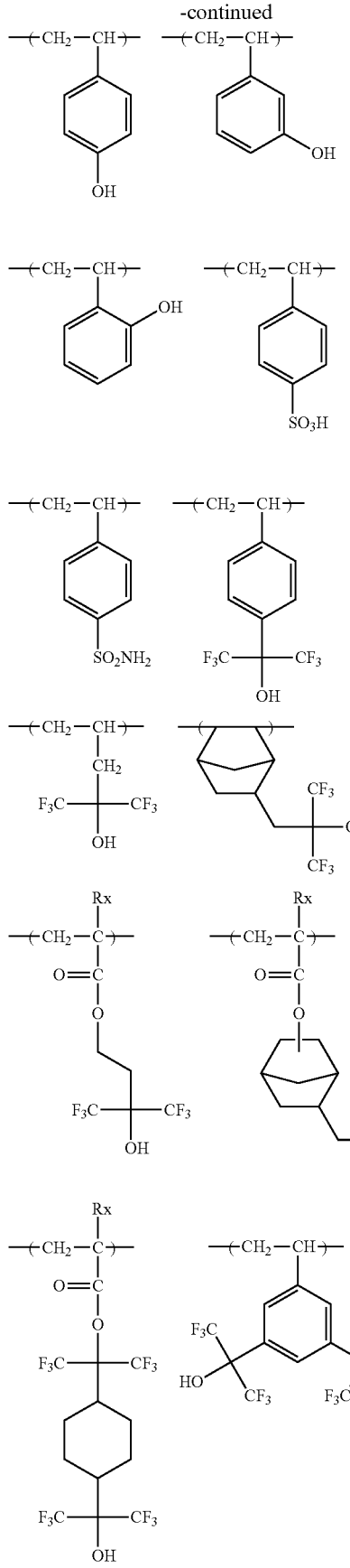
114
-continued
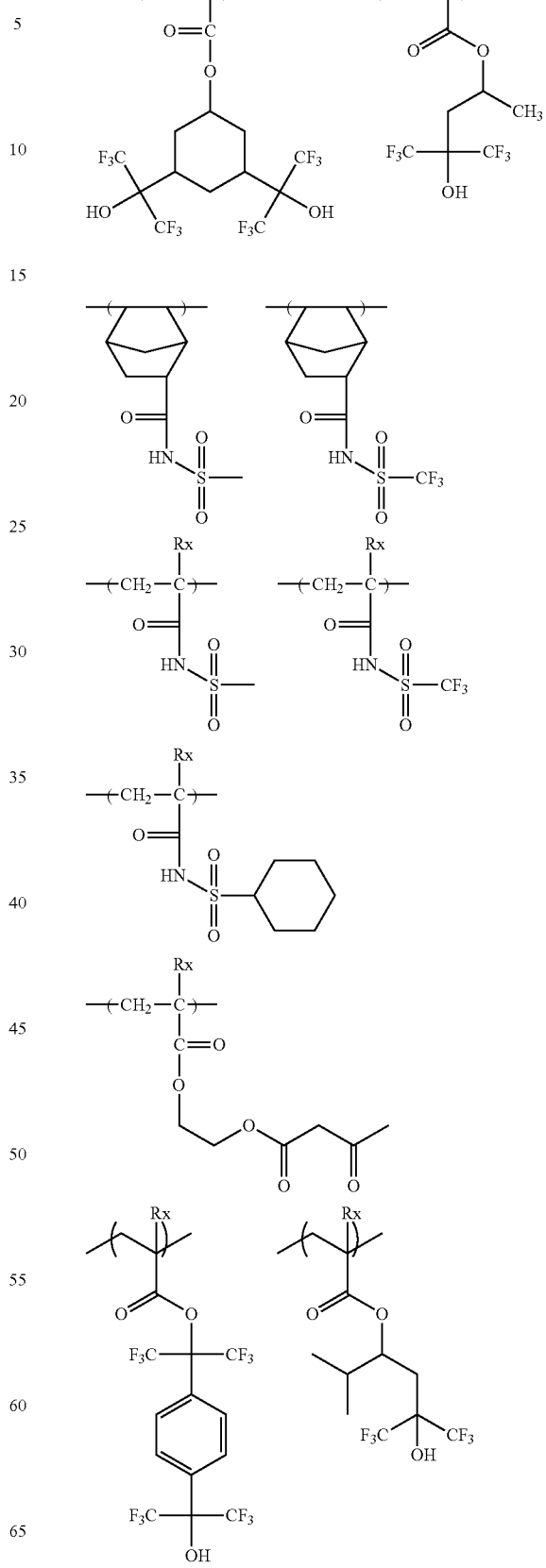

-continued

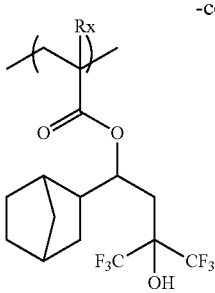

As the group having a lactone structure, the acid anhydride group, or the acid imide group (y), a group having a lactone structure is particularly preferable.

The repeating unit having these groups is a repeating unit in which these groups directly bind to the main chain of the resin, such as a repeating unit of acrylic acid ester or methacrylic acid ester. Alternatively, the repeating unit may be a repeating unit in which these groups bind to the main chain of the resin via a linking group. As another option, the repeating unit may be introduced to the terminal of the resin by using a polymerization initiator or a chain transfer agent contain these groups during polymerization.

Examples of the repeating unit containing the group having a lactone structure include the same ones as those of the repeating unit having a lactone structure described above for the acid-degradable resin (A).

The content of the repeating unit containing the group having a lactone structure, the acid anhydride group, or the acid imide group is preferably 1 mol % to 100 mol %, more preferably 3 mol % to 98 mol %, and even more preferably 5 mol % to 95 mol %, based on all repeating units in the hydrophobic resin.

Examples of the repeating unit containing the group (z) degraded by the action of an acid in the hydrophobic resin (E) include the same ones as those of the repeating unit containing an acid-degradable group exemplified for the resin (A). The repeating unit containing the group (z) degraded by the action of an acid may include at least any one of a fluorine atom and a silicon atom. The content of the repeating unit containing the group (z) degraded by the action of an acid in the hydrophobic resin (E) is preferably 1 mol % to 80 mol %, more preferably 10 mol % to 80 mol %, and even more preferably 20 mol % to 60 mol %, based on all repeating units in the resin (E).

The hydrophobic resin (E) may further contain a repeating unit represented by the following General Formula (III).

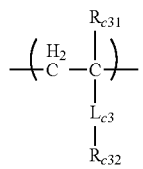

(III)

In General Formula (III), $R_{c31}$ represents a hydrogen atom, an alkyl group (which may be substituted with a fluorine atom or the like), a cyano group, or a —CH$_2$—O—Rac$_2$ group. In the formula, Rac$_2$ represents a hydrogen atom, an alkyl group, or an acyl group.

$R_{c31}$ is preferably a hydrogen atom, a methyl group, a hydroxymethyl group, or a trifluoromethyl group, and particularly preferably a hydrogen atom, or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom.

$L_{c3}$ represents a single bond or a divalent linking group.

The alkyl group of $R_{c32}$ in General Formula (III) is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group. These groups may have a substituent.

$R_{c32}$ is an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by General Formula (III) is preferably 1 mol % to 100 mol %, more preferably 10 mol % to 90 mol %, and even more preferably 30 mol % to 70 mol %, based on all repeating units in the hydrophobic resin.

The hydrophobic resin (E) preferably further contains the repeating unit represented by the following General Formula (CII-AB).

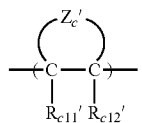

(CII-AB)

In Formula (CII-AB), each of $Rc_{11}'$ and $Rc_{12}'$ independently represents a hydrogen atom, a cyano group, a halogen atom, or an alkyl group.

$Zc'$ contains two carbon atoms (C—C) binding to each other, and represents an atomic group necessary for forming an alicyclic structure.

The content of the repeating unit represented by General Formula (CII-AB) is preferably 1 mol % to 100 mol %, more preferably 10 mol % to 90 mol %, and even more preferably 30 mol % to 70 mol %, based on all repeating units in the hydrophobic resin.

Specific examples of the repeating units represented by General Formulae (III) and (CII-AB) will be shown below, but the present invention is not limited thereto. In the formulae, Ra represents H, CH$_3$, CH$_2$OH, CF$_3$, or CN.

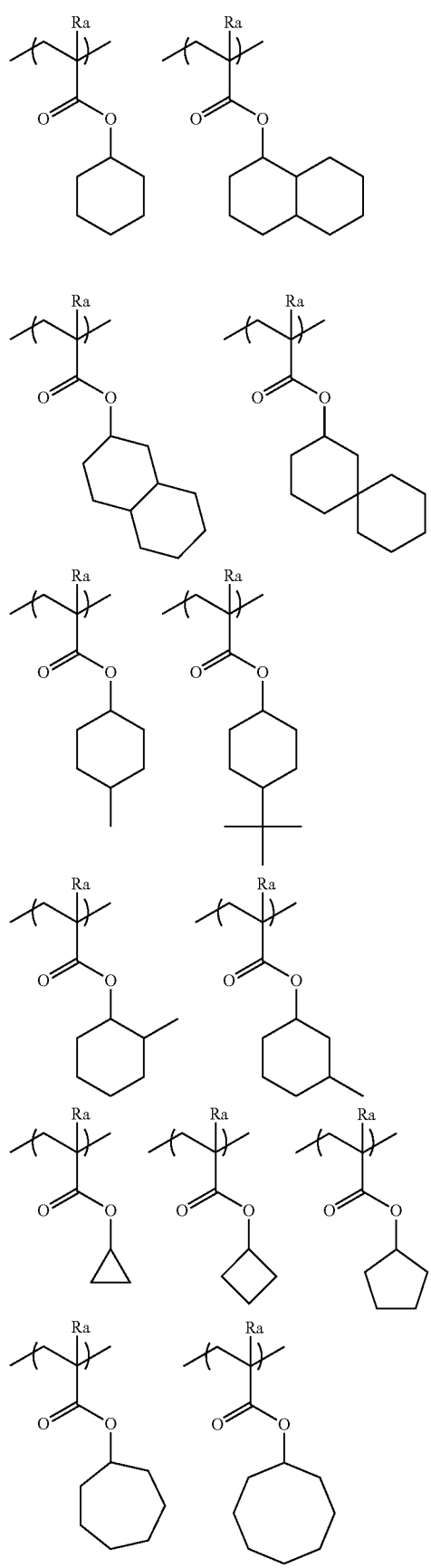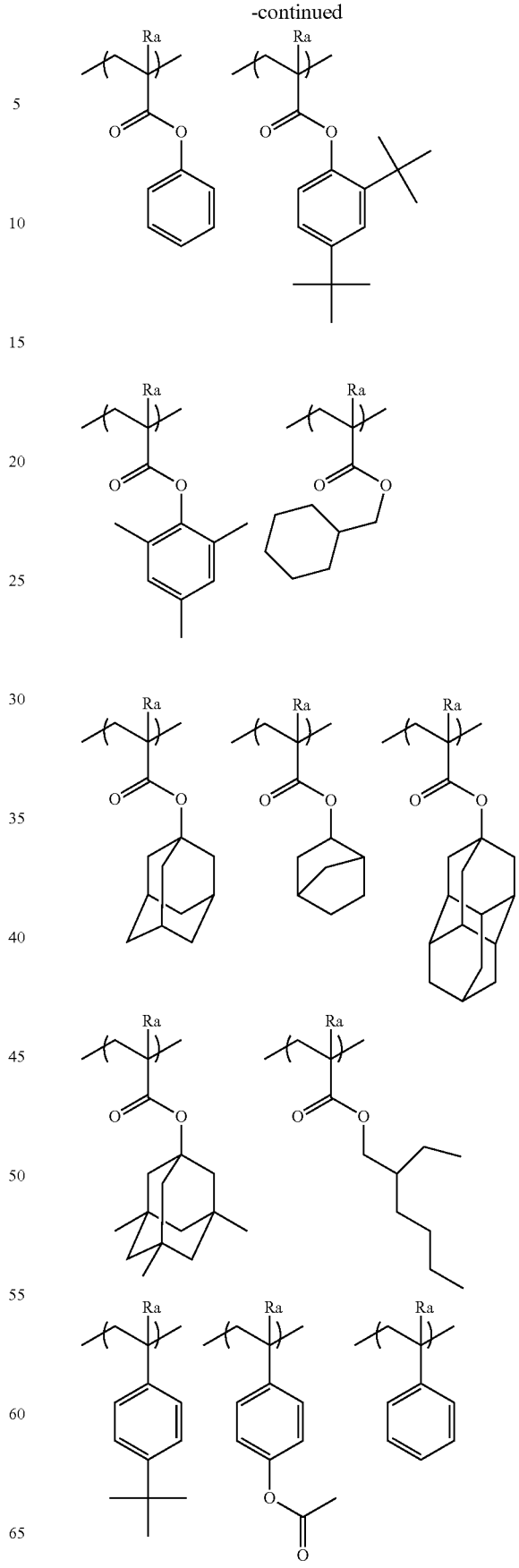

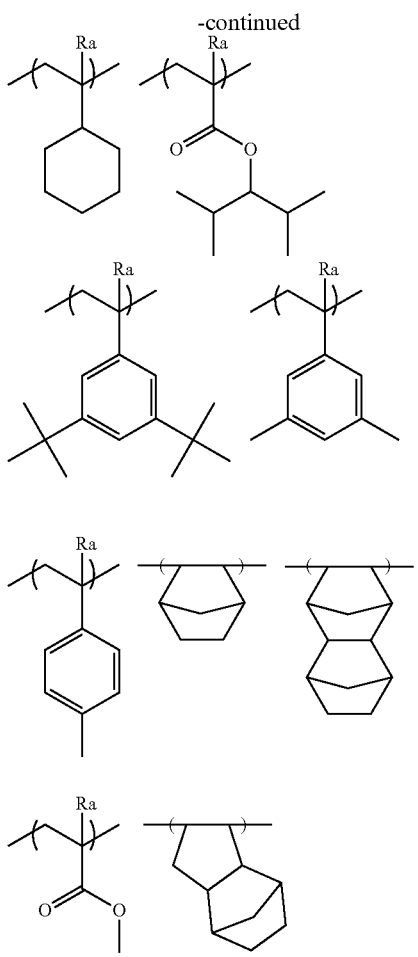

When the hydrophobic resin (E) contains a fluorine atom, the content of the fluorine atom is preferably 5% by mass to 80% by mass, and more preferably 10% by mass to 80% by mass, based on the weight average molecular weight of the hydrophobic resin (E). In addition, the content of the repeating unit containing a fluorine atom is preferably 10 mol % to 100 mol %, and more preferably 30 mol % to 100 mol %, based on all repeating units contained in the hydrophobic resin (E).

When the hydrophobic resin (E) contains a silicon atom, the content of the silicon atom is preferably 2% by mass to 50% by mass, and more preferably 2% by mass to 30% by mass, based on the weight average molecular weight of the hydrophobic resin (E). In addition, the content of the repeating unit containing a silicon atom is preferably 10 mol % to 100 mol %, and more preferably 20 mol % to 100 mol %, based on all repeating units contained in the hydrophobic resin (E).

The weight average molecular weight of the hydrophobic resin (E) calculated in terms of standard polystyrene is preferably 1,000 to 100,000, more preferably 1,000 to 50,000, and even more preferably 2,000 to 15,000.

The hydrophobic resin (E) may be used alone, or a plurality of hydrophobic resins (E) may be used concurrently.

The content of the hydrophobic resin (E) in the composition is preferably 0.01% by mass to 10% by mass, more preferably 0.05% by mass to 8% by mass, and even more preferably 0.1% by mass to 5% by mass, based on the total solid content in the composition of the present invention. In addition, needless to say, the content of the above repeating unit in the hydrophobic resin (E) does not exceed 100 mol % in total.

It is natural that the hydrophobic resin (E) contains a small amount of impurities such as metals, similarly to the resin (A), and the amount of residual monomers and oligomer components is preferably 0.01% by mass to 5% by mass, more preferably 0.01% by mass to 3% by mass, and even more preferably 0.05% by mass to 1% by mass. In this amount, an actinic-ray-sensitive or radiation-sensitive resin composition is obtained which does not have foreign matter in a liquid and does not show the change in sensitivity or the like over time. The molecular weight distribution (Mw/Mn, which is also referred to as degree of dispersion) is preferably in a range of from 1 to 5, more preferably in a range of from 1 to 3, and even more preferably in a range of from 1 to 2, in respect of resolution, the resist shape, side walls of the resist pattern, roughness, and the like.

As the hydrophobic resin (E), various commercially available products can be used, and the hydrophobic resin can also be synthesized by a common method (for example, a radical polymerization). Examples of the general synthesis method include batch polymerization in which polymerization is performed by dissolving monomer materials and initiators in a solvent and heating the resultant, and drop polymerization in which a solution including monomer materials and initiators is added dropwise to a heated solvent for 1 to 10 hours. A preferable method is the drop polymerization.

The reaction solvent, polymerization initiator, reaction conditions (temperature, concentration, and the like), and a method of purification after the reaction are the same as those that were described for the resin (A). However, for synthesizing the hydrophobic resin (E), the reaction concentration is preferably 30% by mass to 50% by mass.

Specific examples of the hydrophobic resin (E) will be shown below. In addition, the molar ratio (corresponding to the respective repeating units from left in order), weight average molecular weight, degree of dispersion of repeating units in the respective resins will be shown in the following tables.

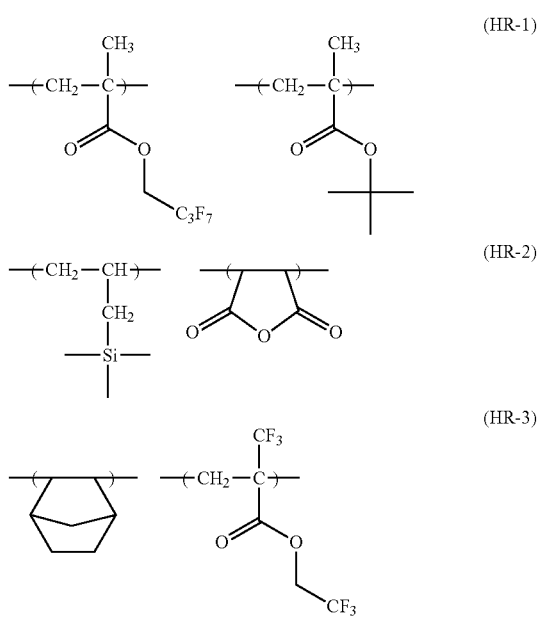

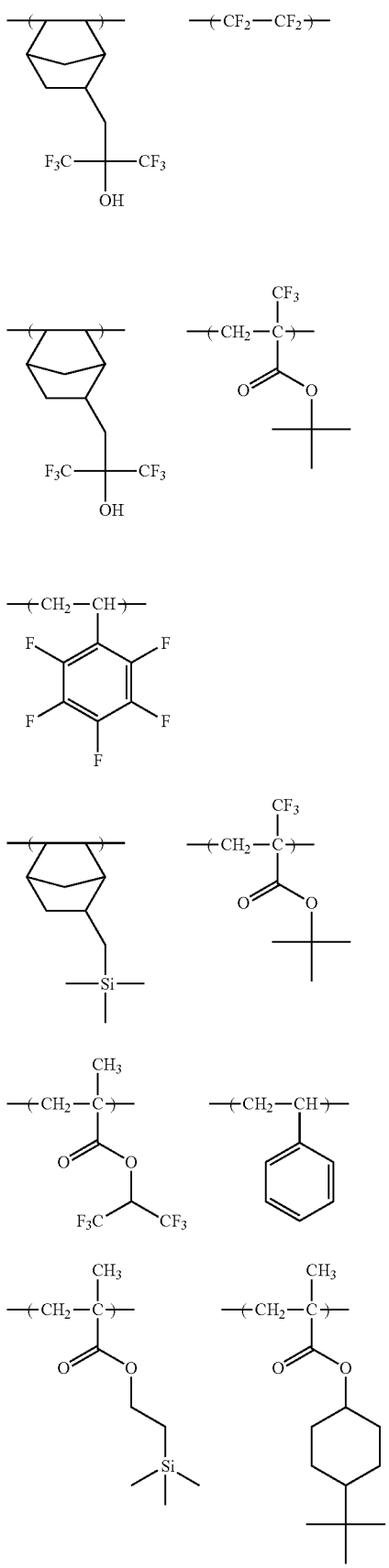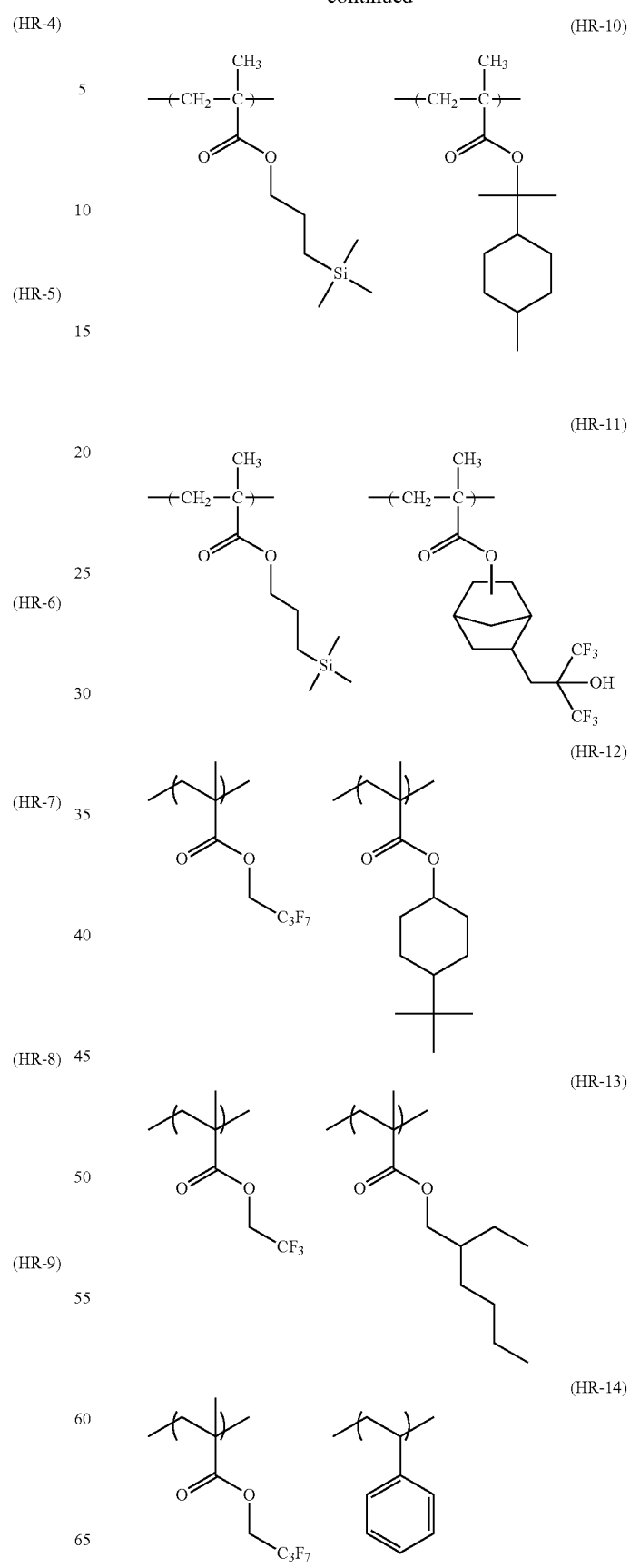

(HR-15) 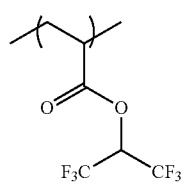
(HR-16) 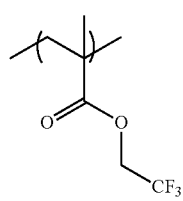
(HR-17) 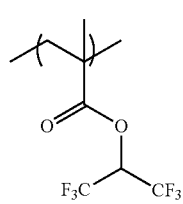
(HR-18) 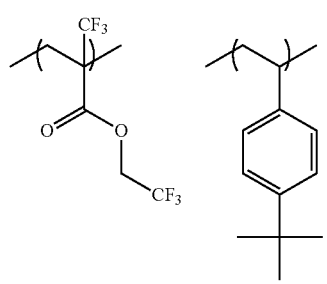
(HR-19) 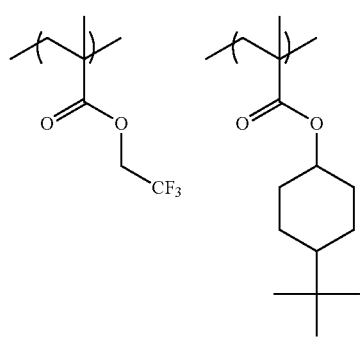
(HR-20) 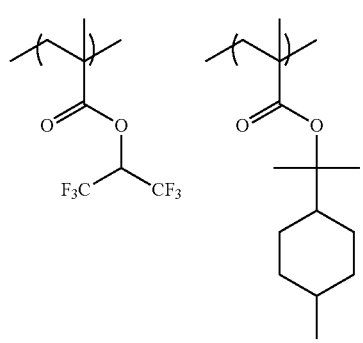
(HR-21) 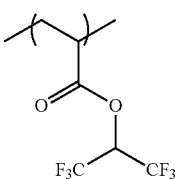 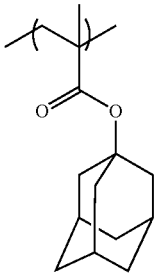
(HR-22) 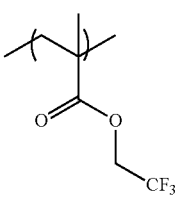 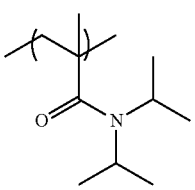
(HR-23) 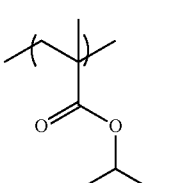 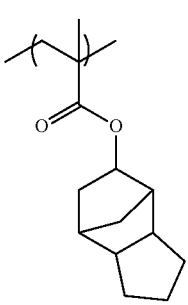
(HR-24) 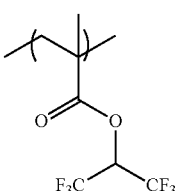 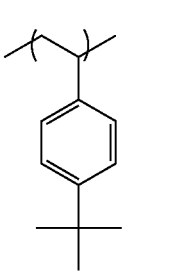
(HR-25) 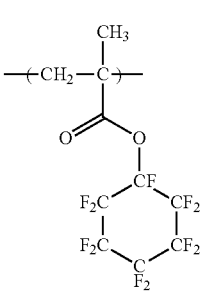 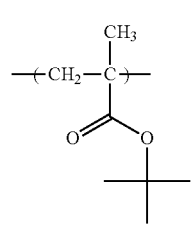
(HR-26) 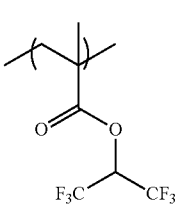 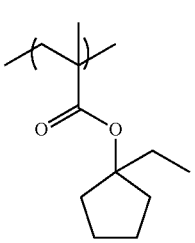

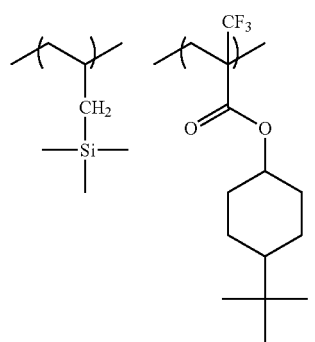

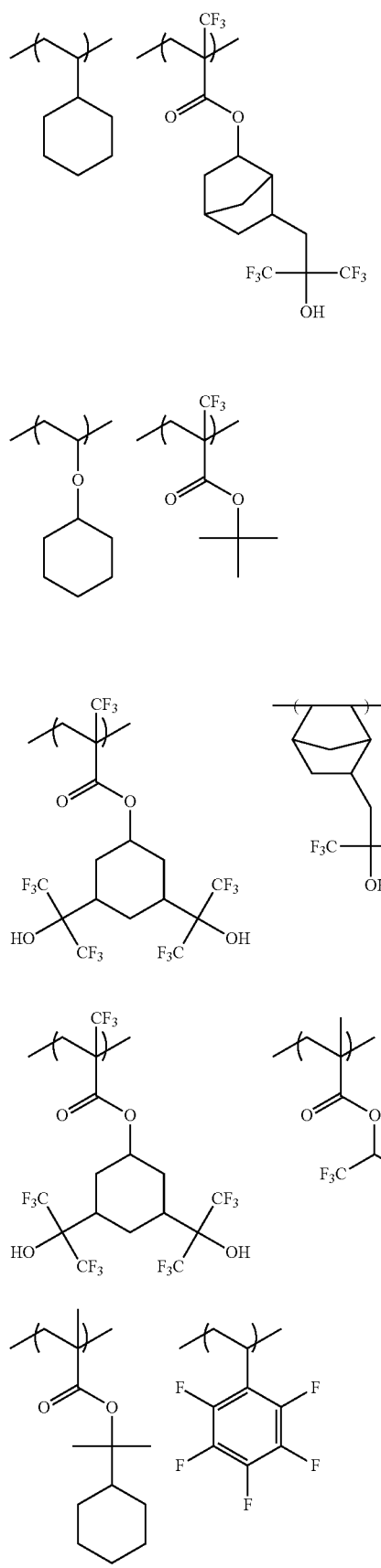
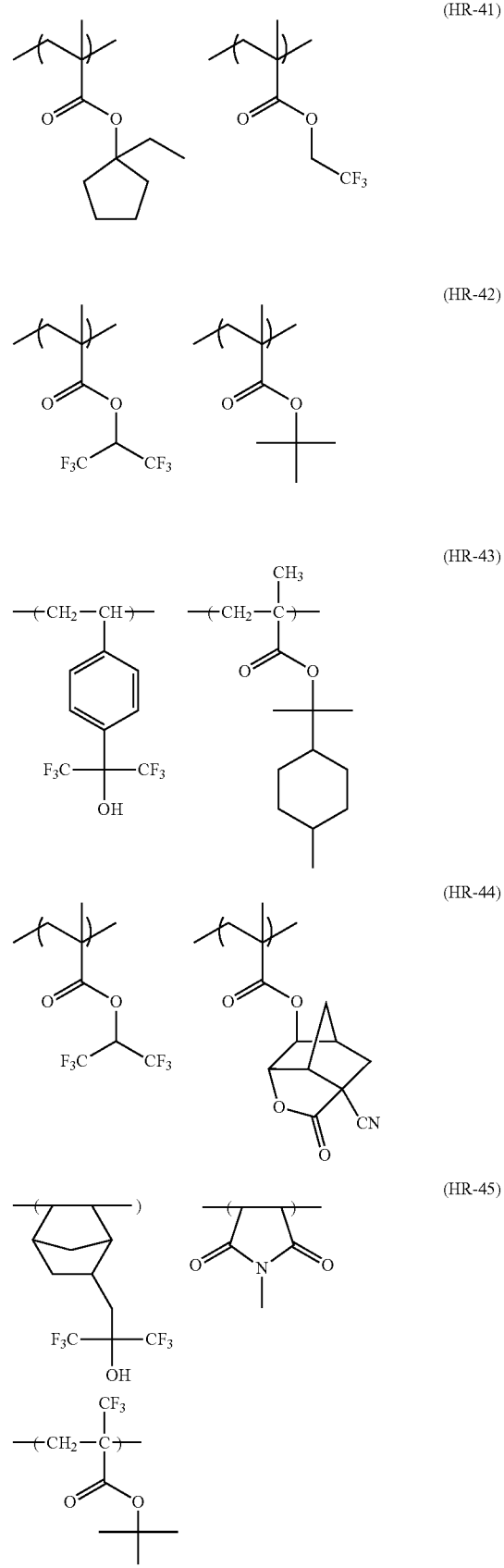

(HR-46)
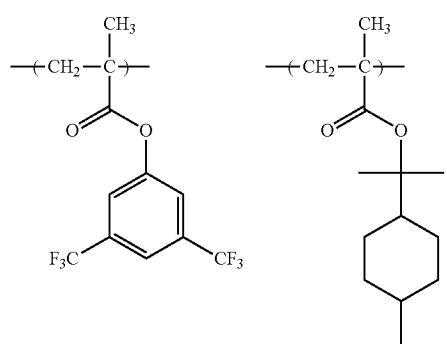
(HR-47)
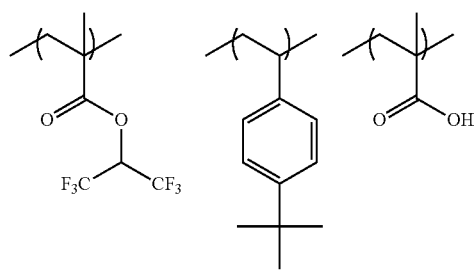
(HR-48)
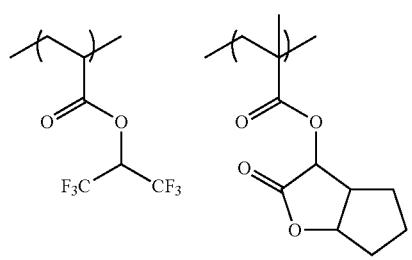
(HR-49)
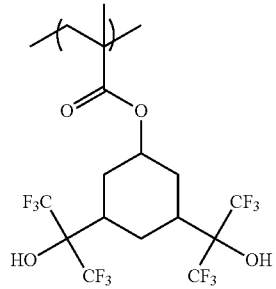
(HR-50)
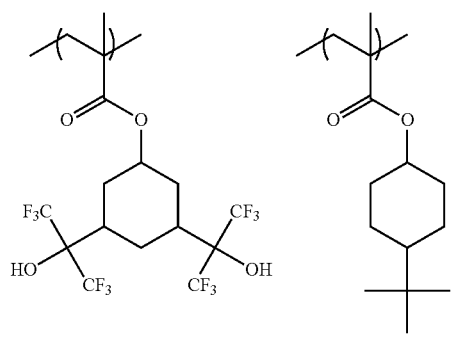
(HR-51)
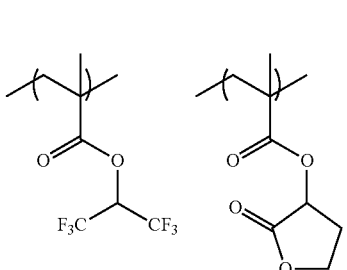
(HR-52)
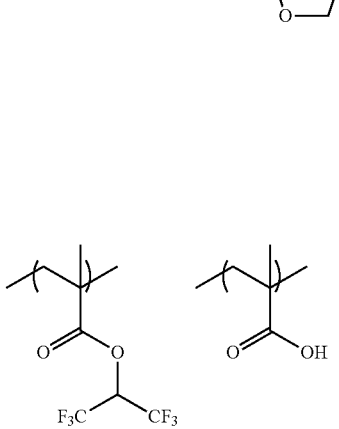
(HR-53)
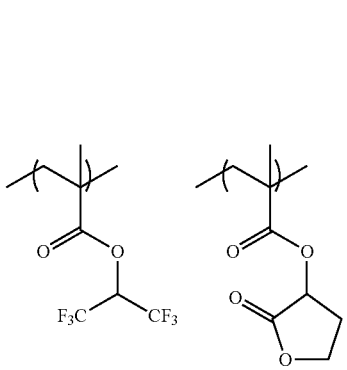
(HR-54)
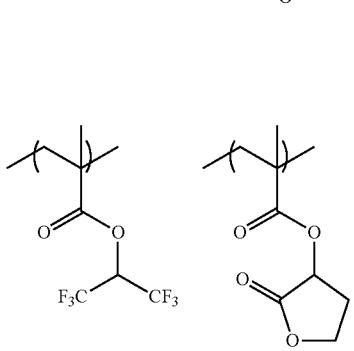
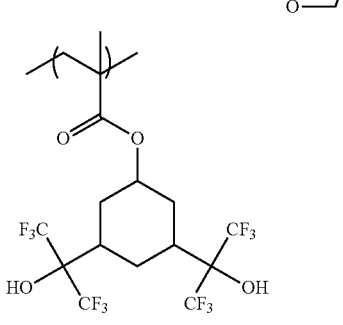

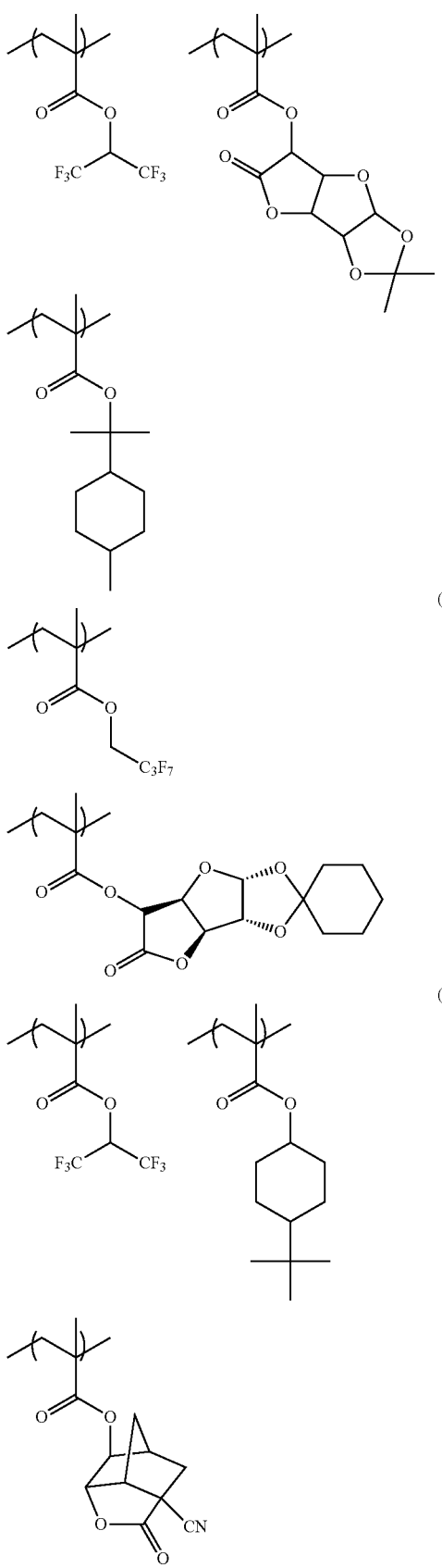
(HR-55)
(HR-56)
(HR-57)
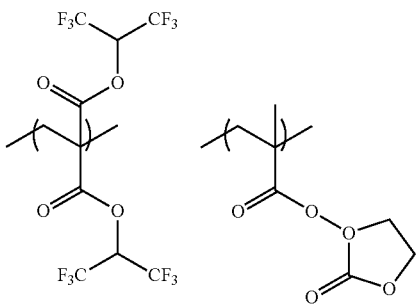
(HR-58)
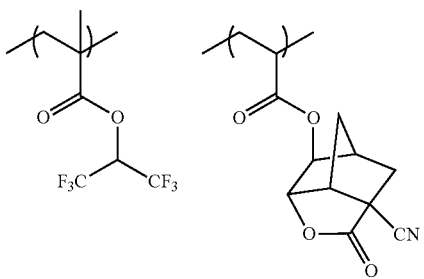
(HR-59)
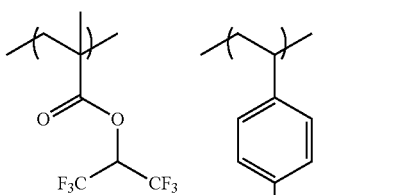
(HR-60)
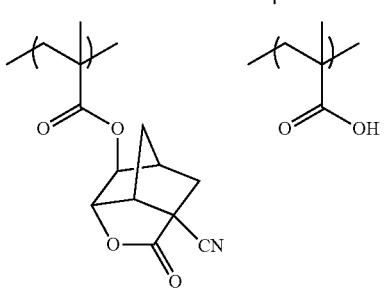
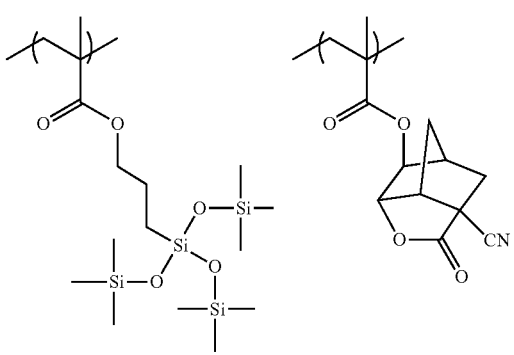
(HR-61)

(HR-62)
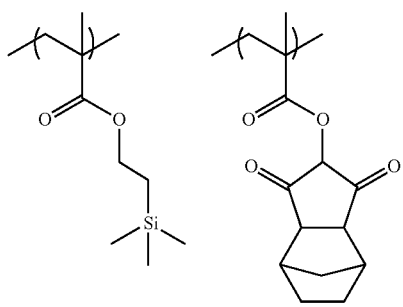
(HR-63)
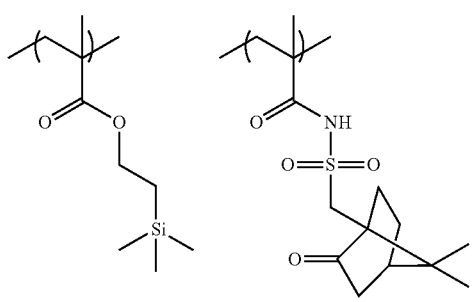
(HR-64)
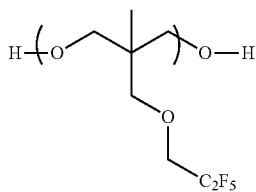
(HR-65)
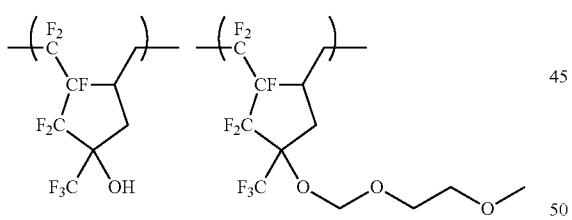
(HR-66)
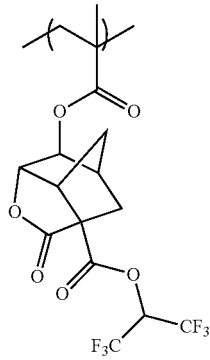
(HR-67)
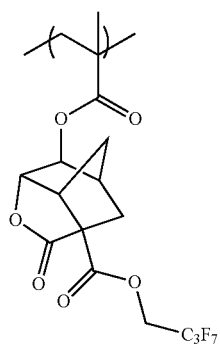
(HR-68)
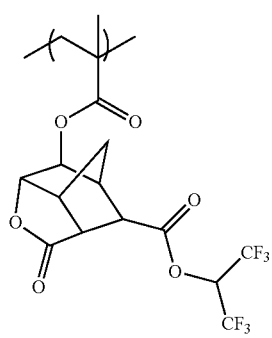
(HR-69)
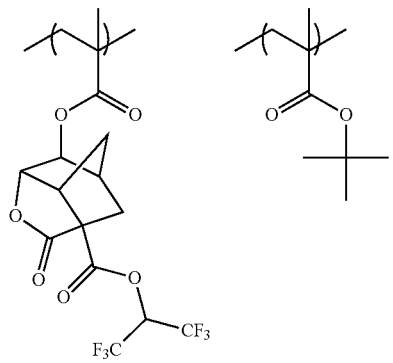
(HR-70)
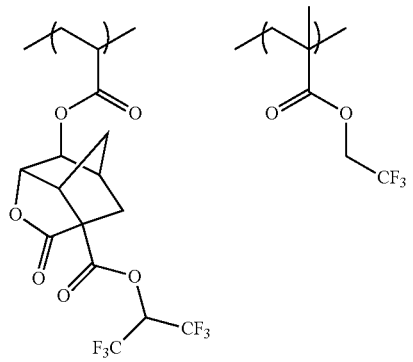

(HR-71)
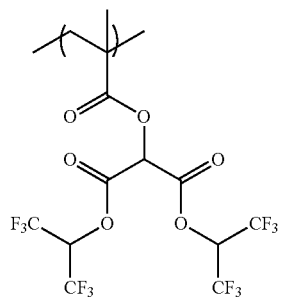
(HR-72)
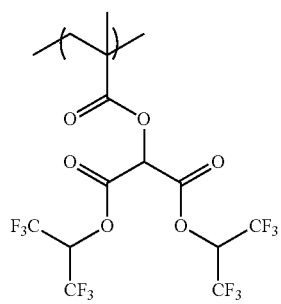 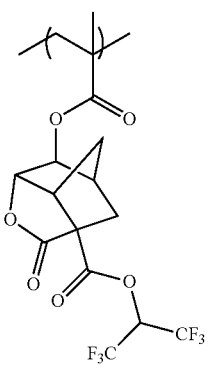
(HR-73)
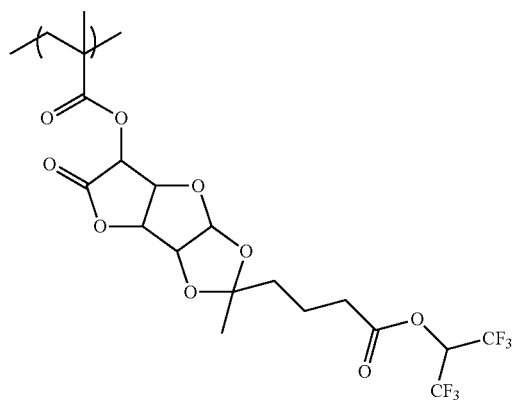
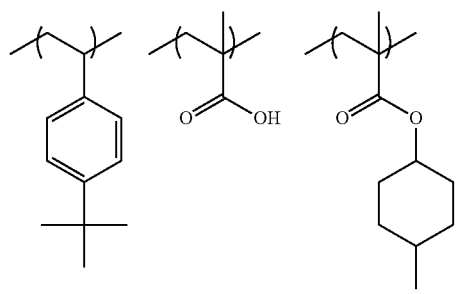
(HR-74)
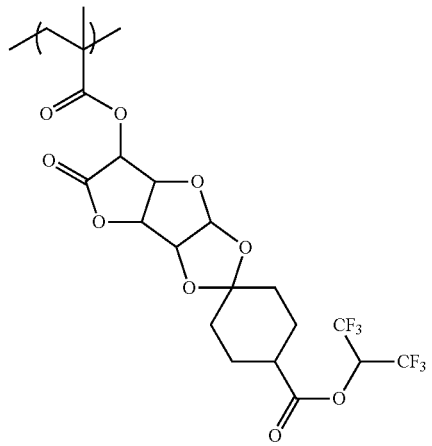
(HR-75)
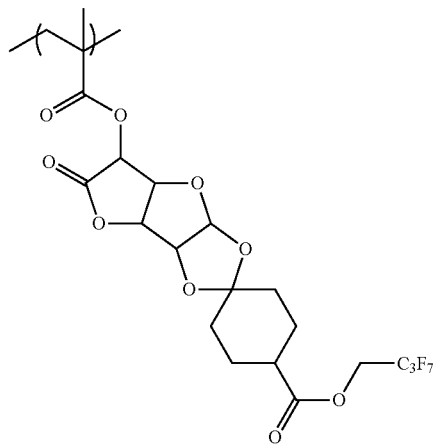
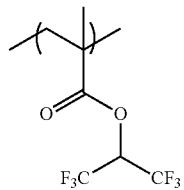
(HR-76)
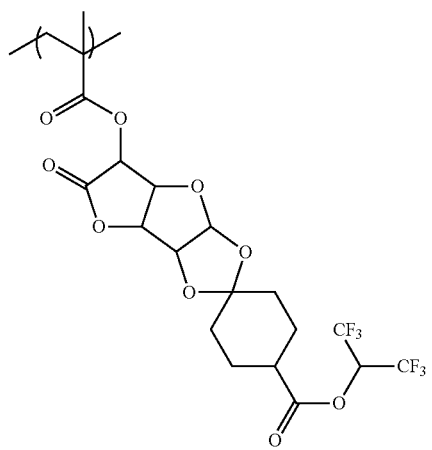

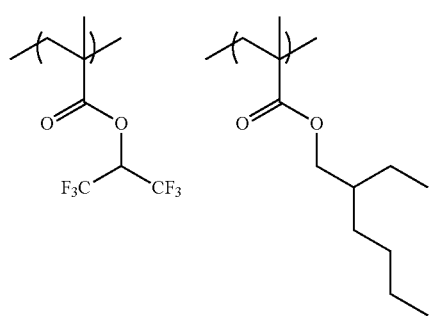
(HR-77)
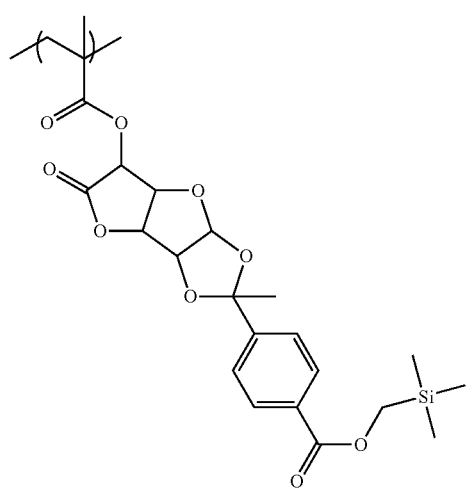
(HR-78)
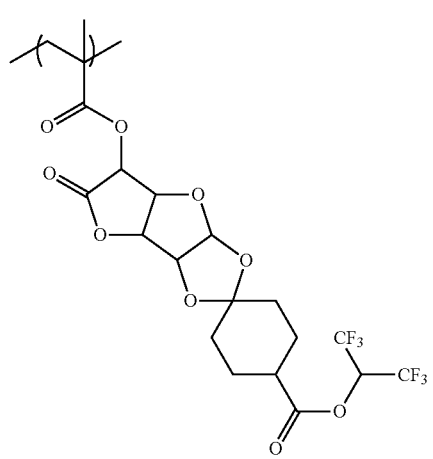
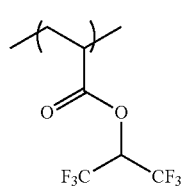
(HR-79)
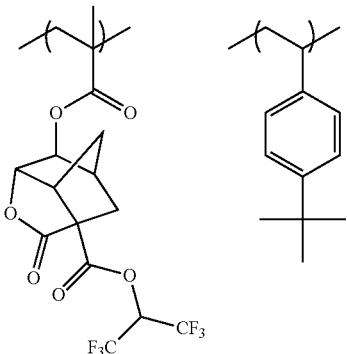
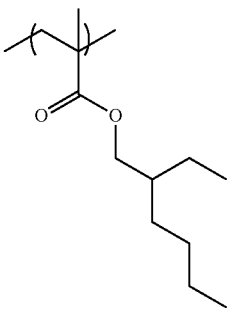
(HR-80)
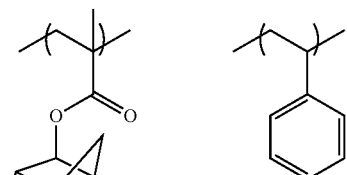
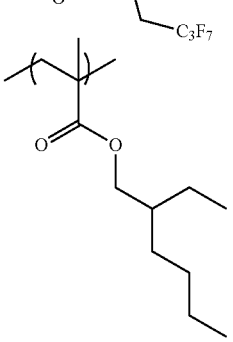
(HR-81)
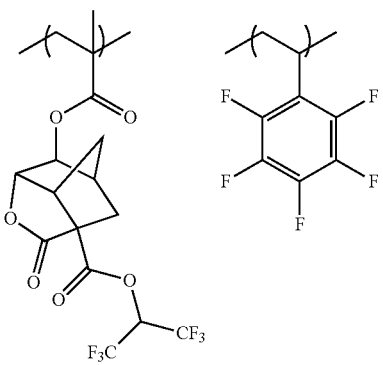

139
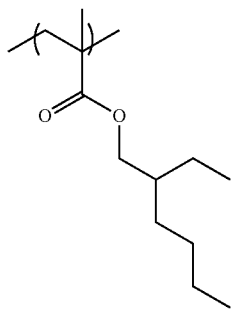
(HR-82)
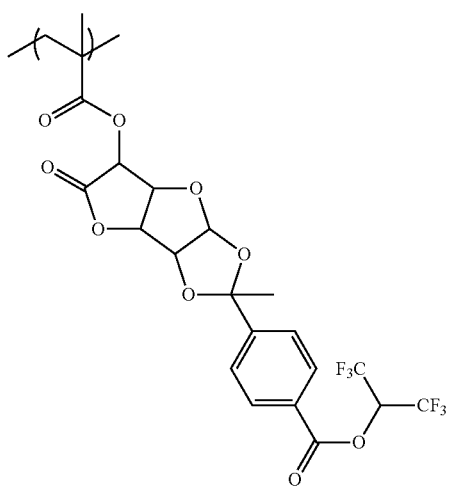
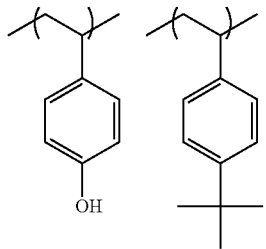
(HR-83)
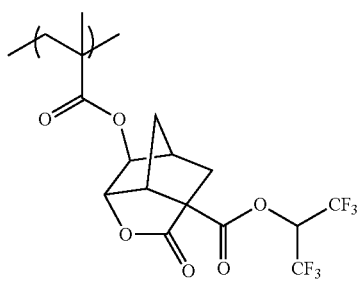
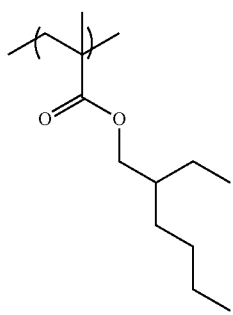
140
(HR-84)
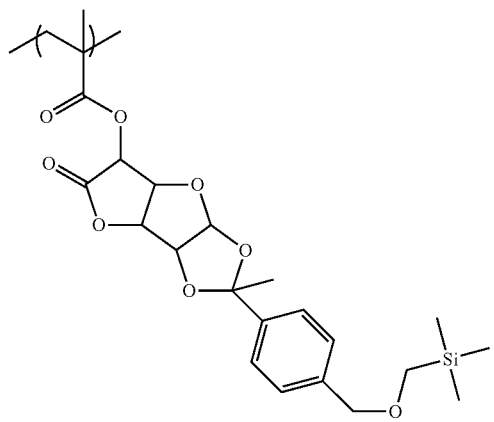
(HR-85)
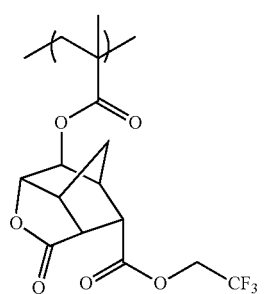
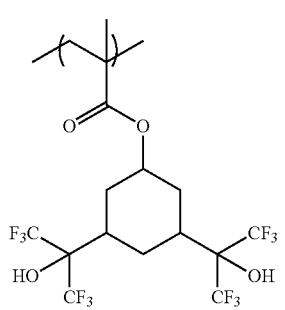
(HR-86)
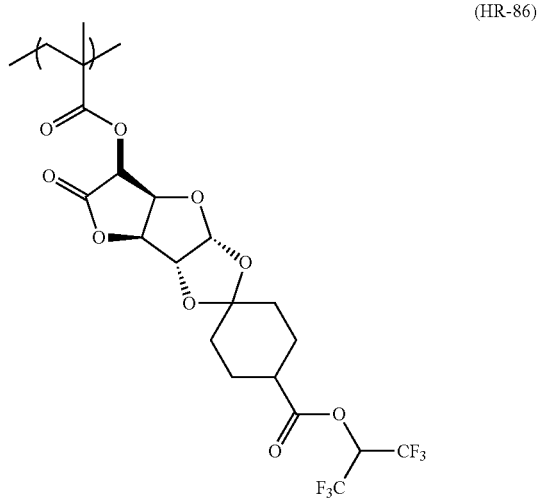

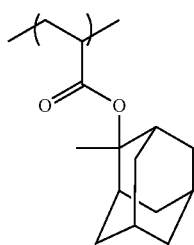
(HR-87)
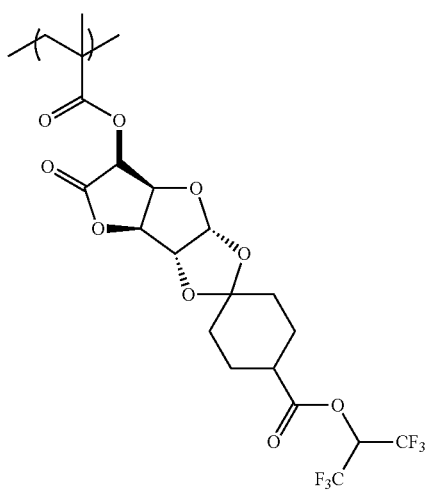
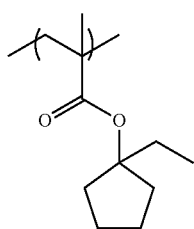
(HR-88)
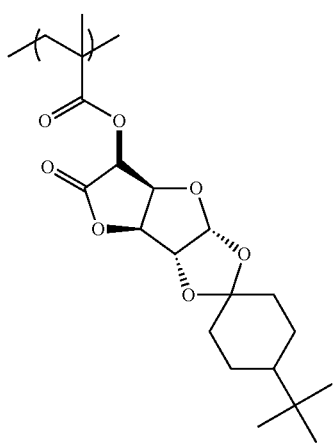
(HR-89)
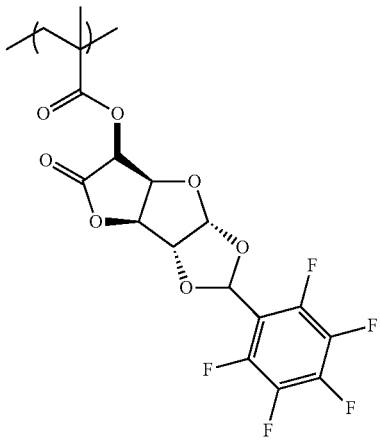
(HR-90)
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |

TABLE 1-continued

| Resin | Composition | Mw | Mw/Mn |
|---|---|---|---|
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/20 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

(6) Surfactant (F)

The actinic-ray-sensitive or radiation-sensitive resin composition of the present invention may or may not further contain a surfactant. When the actinic-ray-sensitive or radiation-sensitive resin composition further contains the surfactant, the composition preferably contains any one of a fluorine-based surfactant and/or a silicon-based surfactant (a fluorine-based surfactant, a silicon-based surfactant, and a surfactant including both a fluorine atom and a silicon atom) or two or more kinds of these surfactants.

If the actinic-ray-sensitive or radiation-sensitive resin composition of the present invention contains the surfactant, a resist pattern having small adhesion and development defects can be provided with excellent sensitivity and resolution, when an exposure light source of 250 nm or less, particularly, an exposure light source of 220 nm or less is used.

Examples of the fluorine-based surfactant and/or silicon-based surfactant include surfactants disclosed in Paragraph [0276] of the specification of US2008/0248425A, which are, for example, EFtop, EF301 and EF303 (manufactured by Shin-Akita Kasei K.K.); Fluorad FC430, 431, and 4430 (manufactured by Sumitomo 3M Inc); Magafac F171, F173, F176, F189, F113, F110, F177, F120, and R08 (manufactured by DIC CORPORATION); Surflon S-382, SC101, 102, 103, 104, 105, and 106 (manufactured by ASAHI GLASS CO., LTD.); Troysol S-366 (manufactured by Troy Chemical); GF-300 and GF-150 (manufactured by TOAGOSEI, CO., LTD.); Surflon S-393 (manufactured by SEIMI CHEMICAL CO., LTD.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA solutions Inc.); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) can also be used as the silicon-based surfactant.

As the surfactant, surfactants that use a polymer having a fluoroaliphatic group derived from fluoroaliphatic compounds which are produced by a telomerization method (which is also called a telomer method) or an oligomerization method (which is also called an oligomer method) can also be used, in addition to the well-known surfactants described above. The fluoroaliphatic compound can be synthesized by the method disclosed in JP2002-90991A.

Examples of the surfactants corresponding to those described above include Megafac F178, F-470, F-473, F-475, F-476, and F-472 (manufactured by DIC CORPORATION), a copolymer of acrylate (or methacrylate) having a $C_6F_{13}$ group and (poly(oxyalkylene))acrylate (or methacrylate), a copolymer of acrylate (or methacrylate) having a $C_3F_7$ group, (poly(oxyethylene))acrylate (or methacrylate), and (poly(oxypropylene))acrylate (or methacrylate), and the like.

In the present invention, surfactants other than the fluorine-based surfactant and/or silicon-based surfactant, which are described in Paragraph [0280] of the specification of US2008/0248425A, can also be used.

These surfactants may be used alone or in combination of several surfactants.

When the actinic-ray-sensitive or radiation-sensitive resin composition contains the surfactant, the amount of the surfactant used is preferably 0.0001% by mass to 2% by mass, and more preferably 0.0005% by mass to 1% by mass, based on the total amount (excluding a solvent) of the actinic-ray-sensitive or radiation-sensitive resin composition.

Meanwhile, if the amount of the surfactant added is set to 10 ppm or less based on the total amount (excluding a solvent) of the actinic-ray-sensitive or radiation-sensitive resin composition, the surface-localization property of the hydrophobic resin is more improved. As a result, the resist film surface can be more hydrophobic, whereby the water-traceability of the resist film in the liquid immersion exposure can be improved.

[7] Other Additives (G)

The actinic-ray-sensitive or radiation-sensitive resin composition of the present invention may or may not contain a carboxylic acid onium salt. Examples of the carboxylic acid onium salt include those disclosed in Paragraphs [0605] to [0606] of the specification of US2008/0187860A.

These carboxylic acid onium salts can be synthesized by reacting sulfonium hydroxide, iodonium hydroxide, or ammonium hydroxide with carboxylic acid and silver oxide in an appropriate solvent.

When the actinic-ray-sensitive or radiation-sensitive resin composition contains the carboxylic acid onium salt, the content of the carboxylic acid onium salt is generally 0.1% by mass to 20% by mass, preferably 0.5% by mass to 10% by mass, and more preferably 1% by mass to 7% by mass based on the total solid content of the composition.

The actinic-ray-sensitive or radiation-sensitive resin composition of the present invention can optionally further contain a dye, a plasticizer, a photosensitizer, a light absorber, an alkali-soluble resin, a dissolution inhibitor, and a compound (for example, a phenol compound having a molecular weight of 1000 or less, or an alicyclic or aliphatic compound having a carboxyl group) promoting solubility with respect to a developer, and the like. Needless to say, the total solid content amount of the respective components that constitute the actinic-ray-sensitive or radiation-sensitive resin composition does not exceed 100% by mass.

A person skilled in the art can easily synthesize the phenol compound having a molecular weight of 1000 or less with reference to methods disclosed in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include carboxylic acid derivatives having a steroid structure such as cholic acid, deoxycholic acid, and lithocholic acid, adamantane carboxylic acid derivatives, adamantane dicarboxylic acid, cyclohexane carboxylic acid, cyclohexane dicarboxylic acid, and the like, but the present invention is not limited thereto.

The actinic-ray-sensitive or radiation-sensitive resin composition of the present invention is preferably used in a film thickness of 30 nm to 250 nm, and more preferably used in a film thickness of 30 nm to 200 nm, from the viewpoint of improving resolving power. The solid content concentration in the composition is set within an appropriate range so as to make the composition have appropriate viscosity and to improve coatability and film formability, and the above film thickness can be formed in this manner.

The solid content concentration of the actinic-ray-sensitive or radiation-sensitive resin composition of the present invention is generally 1.0% by mass to 10% by mass, preferably 2.0% by mass to 5.7% by mass, and more preferably 2.0% by mass to 5.3% by mass. By setting the solid content concentration within the above range, a resist solution can be evenly coated onto a substrate, and a resist pattern that is excellent in the line edge roughness can be formed. Though unclear, the reason is assumed to be that, by setting the solid content concentration to 10% by mass or less, preferably 5.7% by mass or less, the aggregation of a material, particularly, the photoacid-generating agent in the resist solution is inhibited, and consequently, a uniform resist film can be formed.

The solid content concentration is percent by weight of the weight of resist components excluding a solvent, based on the total weight of the actinic-ray-sensitive or radiation-sensitive resin composition.

To use the actinic-ray-sensitive or radiation-sensitive resin composition of the present invention, the above-described components are dissolved in a solvent, followed by filtering through a filter, and coated on a support. The pore size of the filter is 0.1 μm or less, more preferably 0.05 μm or less, and even more preferably 0.03 μm or less, and the filter is preferably made of polytetrafluoroethylene, polyethylene, or nylon. In the filtering using a filter, circulative filtering may be performed as described in JP2002-62667A, or filtering may be performed by a plurality of types of filters connected in series or in parallel. In addition, the composition may be filtered a plurality of times. Moreover, the composition may be subjected to deaeration treatment before and after the filtering.

[8] Pattern Forming Method

The pattern forming method (negative pattern forming method) of the present invention includes at least (1) forming a film (resist film) using an actinic-ray-sensitive or radiation-sensitive resin composition, (2) exposing the film, and (3) developing the exposed film using a developer that contains an organic solvent.

The exposing in the above (2) may be liquid immersion exposure.

The pattern forming method of the present invention preferably includes (4) baking after (2) exposing.

The pattern forming method of the present invention may further include (5) developing using an alkaline developer.

In the pattern forming method of the present invention, (2) exposing may be performed a plurality of times.

In the pattern forming method of the present invention, (4) baking may be performed a plurality of times.

The resist film is formed of the above-described actinic-ray-sensitive or radiation-sensitive resin composition of the present invention. More specifically, the resist film is preferably formed on a substrate. In the pattern forming method of the present invention, forming the film using an actinic-ray-sensitive or radiation-sensitive resin composition on a substrate, exposing the film, and developing can be performed by a generally known method.

Before the film is exposed after being formed, the pattern forming method preferably also includes prebake (PB).

In addition, after the exposing and before the developing, the pattern forming method preferably also includes Post Exposure Bake (PEB).

In both the PB and PEB, the baking temperature is preferably 70° C. to 130° C., and more preferably 80° C. to 120° C.

The baking time is preferably 30 seconds to 300 seconds, more preferably 30 seconds to 180 seconds, and even more preferably 30 seconds to 90 seconds.

The baking can be performed using a unit provided to a general exposing and developing machine, and a hot plate or the like may also be used.

By the baking, the reaction of the exposed portion is promoted, and the sensitivity or pattern profile is improved.

There is no limitation on the wavelength of a light source used for an exposure apparatus in the present invention, and examples of the light source include infrared light, visible light, ultraviolet light, far-ultraviolet light, extreme ultraviolet light, X rays, electron beams, and the like. Among these, far-ultraviolet light preferably having a wavelength of 250 nm or less, more preferably having a wavelength of 220 nm or less, and particularly preferably having a wavelength of 1 nm to 200 nm can be exemplified. More specifically, a KrF excimer laser (248 nm), an ArF excimer laser (193 nm), and an $F_2$ excimer laser (157 nm), X rays, EUV (13 nm), electron beams, and the like are exemplified. Among these, a KrF excimer laser, an ArF excimer laser, EUV, and electron beams are preferable, and an ArF excimer laser is more preferable.

To the exposing of the present invention, liquid immersion exposure can be applied.

The liquid immersion exposure is a technique for improving resolving power, which is a technique of filling a liquid (also referred to as a "liquid for liquid immersion" hereinafter) having a high refractive index between a projection lens and a sample so as to perform exposure.

As described above, provided that $\lambda_0$ is a wavelength of exposure light in the air, n is a refractive index of a liquid for liquid immersion with respect to the air, and that θ is a beam convergence half angle which is $NA_0=\sin\theta$, when the liquid immersion is performed, the "effect of liquid immersion" can be indicated by calculating the resolving power and depth of focus from the following formulae. Herein, $k_1$ and $k_2$ are coefficients relating to the process.

(Resolving power)=$k_1 \cdot (\lambda_0/n)NA_0$ (Depth of focus)=$\pm k_2 \cdot (\lambda_0/n)NA_0^2$ That is, the effect of liquid immersion is equivalent to the effect obtained when an exposure wavelength of 1/n is used. In other words, in a case of a projection optical system of the same NA, the depth of focus can be increased n-fold by the liquid immersion. The liquid immersion is effective for various pattern shapes and can be combined with super resolution techniques such as a phase shift method and a modified illumination method that are being examined currently.

When the liquid immersion exposure is performed, (1) before the film is exposed after being formed on a substrate and/or (2) before the film is baked after being exposed through the liquid for liquid immersion, the film surface may be washed with an aqueous chemical liquid.

The liquid for liquid immersion is preferably a liquid which is transparent to the exposure wavelength and has as small a temperature coefficient of a refractive index as possible so as to minimize the distortion of an optical image projected onto the film. Particularly, when the exposure light source is an ArF excimer laser (wavelength: 193 nm), it is preferable to use water in respect that water is easily obtained and handled, in addition to the above-described viewpoints.

When water is used, an additive (liquid) which decreases the surface tension of water and increases surfactant potency may be added in a slight proportion. As the additive, a material which does not dissolve the resist film on a wafer and negligibly affects an optical coat of the lower surface of a lens element is preferable.

As the additive, for example, an aliphatic alcohol that has almost the same refractive index as that of water is preferable, and specific examples thereof include methyl alcohol, ethyl alcohol, isopropyl alcohol, and the like. By adding the alcohol having almost the same refractive index as that of water, an advantage that even if the concentration of the alcohol contained in the water changes due to evaporation of the alcohol component, change in the refractive index caused in an overall liquid can be minimized is obtained.

When a substance that is opaque to light of 193 nm and impurities that have a refractive index greatly differing from that of water are mixed in, since the optical image projected onto the resist is distorted, distilled water is preferable as water to be used. In addition, pure water filtered through an ion exchange filter or the like may be used.

The electrical resistance of water used as the liquid for liquid immersion is desirably 18.3 MΩ cm or higher, and TOC (organic substance concentration) thereof is desirably 20 ppb or lower. The water is desirably subjected to deaeration treatment.

By increasing the refractive index of the liquid for liquid immersion, a lithography performance can be improved. From such a viewpoint, an additive for improving refractive index may be added to water, or heavy water ($D_2O$) may be used instead of water.

When the film formed using the composition of the present invention is exposed through a liquid immersion medium, the above-described hydrophobic resin (E) can be optionally further added. The addition of the hydrophobic resin (E) improves backward contact angle of the film surface. The backward contact angle of the film is preferably 60° to 90°, and more preferably 70° or more.

In the liquid immersion exposure, an exposure head needs to scan a wafer at a high speed so as to follow the movement of forming an exposure pattern, and the liquid for liquid immersion needs to move on the wafer. Accordingly, the contact angle of the liquid for liquid immersion with respect to the resist film that is in a dynamic state is important, and the resist is required to have a performance that can follow the high-speed scanning of the exposure head without causing droplets to remain.

In order not to cause the film to directly contact the liquid for liquid immersion, a film (hereinafter, also referred to as a "topcoat") that is poorly soluble in a liquid for liquid immersion may be provided between the film formed using the composition of the present invention and the liquid for liquid immersion. As properties required for the topcoat, coating suitability to the upper layer portion of the resist, transparency to radiations, particularly to radiation with a wavelength of 193 nm, and poor solubility in a liquid for liquid immersion can be exemplified. It is preferable that the topcoat can be evenly coated onto the upper layer of the resist without being mixed with the resist.

The topcoat is preferably a polymer not containing an aromatic group, from the viewpoint of the transparency to radiations having a wavelength of 193 nm.

Specific examples of such a polymer include a hydrocarbon polymer, an acrylic acid ester polymer, polymethacrylic acid, polyacrylic acid, polyvinyl ether, a silicon-containing polymer, and a fluorine-containing polymer. The hydrophobic resin (E) described above is also suitable as the topcoat. If impurities are eluted from the topcoat to the liquid for liquid immersion, the optical lens is contaminated. Accordingly, residual monomer components of the polymer contained in the topcoat is preferably small.

For removing the topcoat, a developer may be used, or another remover may be used. As the remover, a solvent that rarely penetrates the film is preferable. From the viewpoint that the removing can be performed simultaneously with developing treatment, it is preferable that the topcoat can be removed by an alkaline developer. From the viewpoint of removing the topcoat with an alkaline developer, the topcoat is preferably acidic. However, from the viewpoint of a non-intermixing property with respect to the film, the topcoat may be neutral or alkaline.

It is preferable that there be no difference or small difference in the refractive index between the topcoat and the liquid for liquid immersion. In this case, the resolving power can be improved. When the exposure light source is an ArF excimer laser (wavelength: 193 nm), it is preferable to use water as the liquid for liquid immersion. Consequently, the topcoat for ArF liquid immersion exposure preferably has a refractive index close to the refractive index (1.44) of water. In addition, from the viewpoint of transparency and refractive index, the topcoat is preferably a thin film.

It is preferable that the topcoat be not mixed with the film and the liquid for liquid immersion. From such a viewpoint, when the liquid for liquid immersion is water, the solvent used for the topcoat is preferably poorly soluble in the solvent used for the composition of the present invention and is a water-insoluble medium. Moreover, when the liquid for liquid immersion is an organic solvent, the topcoat may be water-soluble or water-insoluble.

In the present invention, the substrate for forming a film is not particularly limited, and inorganic substrates such as silicon, SiN, $SiO_2$, and SiN, a coated inorganic substrate such as SOG, and the like which are generally used in a production process of a semiconductor such as IC, a production process of a circuit board of a liquid crystal, a thermal head, or the like, and other lithography processes of photofabrication can be used. In addition, an organic antireflection film may be optionally formed between the film and the substrate.

When the pattern forming method of the present invention further includes developing using an alkaline developer, as the alkaline developer, for example, an aqueous alkaline solution of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine, and di-n-butylamine; tertiary amines such as triethylamine and methyl diethylamine; alcohol amines such as dimethylethanolamine and triethanolamine; quaternary ammonium salts such as tetramethyl ammonium hydroxide and tetraethyl ammonium hydroxide; and cyclic amines such as pyrrole and piperidine can be used.

In addition, to the above aqueous alkaline solution, alcohols and a surfactant can be added in an appropriate amount for use.

An alkali concentration of the alkaline developer is generally 0.1% by mass to 20% by mass.

A pH of the alkaline developer is generally 10.0 to 15.0.

Particularly, a 2.38% by mass aqueous tetramethylammonium hydroxide solution is desirable.

As a rinsing liquid used in rinsing treatment performed after alkali development, pure water is used, and a surfactant may be added thereto in an appropriate amount for use.

In addition, after the development treatment or rinsing treatment, treatment for removing the developer or rinsing liquid attached onto the pattern by using supercritical fluid can be performed.

In the pattern forming method of the present invention, as the developer (hereinafter, also referred to as an organic developer) used in the developing using a developer that contains an organic solvent, a polar solvent such as a ketone-based solvent, an ester-based solvent, an alcohol-based solvent, an amide-based solvent, or an ether-based solvent and a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, and the like.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, methyl formate, ethyl formate, butyl formate, propyl formate, ethyl lactate, butyl lactate, propyl lactate, and the like.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol; glycol-based solvents such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, or methoxymethyl butanol; and the like.

Examples of the ether-based solvent include dioxane, tetrahydrofuran, and the like in addition to the above-described glycol ether-based solvents.

As the amide-based solvent, for example, N-methyl-2-pyrrolidone, N,N-dimethylacetamide, N,N-dimethylformamide, hexamethyl phosphoric triamide, 1,3-dimethyl-2-imidazolidinone, and the like can be used.

Examples of the hydrocarbon-based solvent include an aromatic hydrocarbon-based solvent such as toluene or xylene and an aliphatic hydrocarbon-based solvent such as pentane, hexane, octane, or decane.

The above solvent may be used as a mixture of plural kinds thereof or used by being mixed with a solvent other than the above solvents and with water. Here, in order to sufficiently bring about the effects of the present invention, the moisture content in the whole developer is preferably less than 10% by mass, and it is more preferable that the developer substantially do not contain moisture.

That is, the amount of the organic solvent used in the organic developer is preferably 90% by mass to 100% by mass, and more preferably 95% by mass to 100% by mass, based on the total amount of the developer.

Particularly, the organic developer preferably is a developer containing at least one kind of organic solvent selected from a group consisting of a ketone-based solvent, an ester-based solvent, an alcohol-based solvent, an amide-based solvent, and an ether-based solvent.

The vapor pressure of the organic developer is preferably 5 kPa or lower, more preferably 3 kPa or lower, and particularly preferably 2 kPa or lower at 20° C. If the vapor pressure of the organic developer is 5 kPa or lower, the developer is inhibited from being vaporized on the substrate or in a development cup, and the temperature uniformity in a wafer surface is improved. As a result, dimensional uniformity in the wafer surface is improved Specific examples of the organic developer having a vapor pressure of 5 kPa or lower include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, or methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, butyl formate, propyl formate, ethyl lactate, butyl lactate, or propyl lactate;

an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; an ether-based solvent such as tetrahydrofuran; an amide-based solvent such as N-methyl-2-pyrrolidone, N,N-dimethylacetamide, or N,N-dimethylformamide; an aromatic hydrocarbon-based solvent such as toluene or xylene; and an aliphatic hydrocarbon-based solvent such as octane or decane.

Specific examples of the organic developer having a vapor pressure of 2 kPa or lower which is a particularly preferable range include a ketone-based solvent such as 1-octanone, 2-octanone, 1-nonanone, 2-nonanone, 4-heptanone, 2-hexanone, diisobutyl ketone, cyclohexanone, methyl cyclohexanone, or phenyl acetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, ethyl lactate, butyl lactate, or propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol, or n-decanol; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; an amide-based solvent such as N-methyl-2-pyrrolidone, N,N-dimethylacetamide, or N,N-dimethylformamide; an aromatic hydrocarbon-based solvent such as xylene; and an aliphatic hydrocarbon-based solvent such as octane or decane.

To the organic developer, a surfactant can be optionally added in an appropriate amount.

The surfactant is not particularly limited, and for example, ionic or nonionic fluorine-based surfactants and/or silicon-based surfactants can be used. Examples of these fluorine-based surfactants and/or silicon-based surfactants include surfactants disclosed in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), the specification of US5405720A, the specification of US5360692A, the specification of US5529881A, the specification of U.S. Pat. No. 5,296,330A, the specification of U.S. Pat. No. 5,436,098A, the specification of U.S. Pat. No. 5,576,143A, the specification of U.S. Pat. No. 5,294,511A, and the specification of U.S. Pat. No. 5,824,451A, and among these, nonionic surfactants are preferable. The nonionic surfactant is not particularly limited, but it is more preferable to use fluorine-based surfactants or silicon-based surfactants.

The amount of the surfactant used is generally 0.001% by mass to 5% by mass, preferably 0.005% by mass to 2% by mass, and even more preferably 0.01% by mass to 0.5% by mass, based on the total amount of the developer.

As the developing method, for example, a method (dipping) of dipping a substrate in a tank filled with a developer for a certain time, a method (paddling) in which a developer is heaped on the substrate surface by surface tension and stopped as it is for a certain time to perform developing, a method (spraying) of spraying a developer to the substrate surface, a method (dynamic dispense method) in which a developer is continuously discharged onto a substrate which rotates at a constant speed while a developer-discharging nozzle is scanned at a constant speed, and the like can be applied.

When the above various developing methods include discharging of developer to the resist film from a developing nozzle of the developing apparatus, the discharge pressure (flow rate of the discharged developer per unit area) of the discharged developer is preferably 2 mL/sec/mm$^2$ or less, more preferably 1.5 mL/sec/mm$^2$ or less, and even more preferably 1 mL/sec/mm$^2$ or less. The lower limit of the flow rate is not particularly limited, but in consideration of throughput, the lower limit is preferably 0.2 mL/sec/mm$^2$ or higher.

If the discharge pressure of the discharged developer is in the above range, pattern defectiveness caused by resist residue remaining after developing can be markedly reduced.

The detail of the mechanism is unclear, but it is considered that, presumably, if the discharge pressure is set within the above range, the pressure that the developer applies to the resist film is reduced, whereby a phenomenon in which the resist film or the resist pattern is accidently scraped and collapsed is inhibited.

The discharge pressure (mL/sec/mm$^2$) of the developer is a value of pressure in the outlet of the developing nozzle of the developing apparatus.

Examples of methods of adjusting the discharge pressure of the developer include a method of adjusting the discharge pressure by using a pump, a method of changing the discharge pressure by adjusting the pressure by means of providing pressure from a pressurizing tank, and the like.

In addition, after the developing using a developer that contains an organic solvent, the developing may be stopped while the organic solvent is substituted with another solvent.

After the developing using a developer that contains an organic solvent, it is preferable to wash the resist film with a rinsing liquid.

The rinsing liquid used in rinsing that is performed after the developing using a developer that contains an organic solvent is not particularly limited so long as the rinsing liquid does not dissolve the resist pattern, and a solution containing a general organic solvent can be used as the rinsing liquid. As the rinsing liquid, it is preferable to use a rinsing liquid containing at least one kind of organic solvent selected from a group consisting of a hydrocarbon-based solvent, a ketone-based solvent, an ester-based solvent, an alcohol-based solvent, an amide-based solvent, and an ether-based solvent.

Specific examples of the hydrocarbon-based solvent, ketone-based solvent, ester-based solvent, alcohol-based solvent, amide-based solvent, and ether-based solvent include the same ones as those described for the developer containing an organic solvent.

After the developing using a developer that contains an organic solvent, rinsing is performed more preferably using a rinsing liquid containing at least one kind of organic solvent selected from a group consisting of a ketone-based solvent, an ester-based solvent, an alcohol-based solvent, and an amide-based solvent, even more preferably using a rinsing liquid containing an alcohol-based solvent or an ester-based solvent, particularly preferably using a rinsing liquid containing a monohydric alcohol, and most preferably using a rinsing liquid containing a monohydric alcohol having 5 or more carbon atoms.

Examples of the monohydric alcohol used in the rinsing include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and the like can be used. As particularly preferable monohydric alcohols having 5 or more carbon atoms, 1-hexanol, 2-hexanol, 4-methyl-2-pentanol, 1-pentanol, 3-methyl-1-butanol, and the like can be used.

The respective components described above may be used as a mixture of plural kinds thereof, or may be used by being mixed with organic solvents other than the above ones.

The moisture content in the rinsing liquid is preferably 10% by mass or less, more preferably 5% by mass or less, and particularly preferably 3% by mass or less. If the moisture content is 10% by mass or less, excellent development properties can be obtained.

The vapor pressure of the rinsing liquid used after the developing using a developer that contains an organic solvent is preferably 0.05 kPa to 5 kPa, more preferably 0.1 kPa to 5 kPa, and most preferably 0.12 kPa to 3 kPa at 20° C. If the vapor pressure of the rinsing liquid is 0.05 kPa to 5 kPa, the temperature uniformity in the wafer surface is improved, and swelling caused by the permeation of the rinsing liquid is inhibited, whereby the dimensional uniformity in the wafer surface is improved.

The rinsing liquid to which a surfactant has been added in an appropriate amount can also be used.

In the rinsing, the wafer having undergone the developing using a developer that contains an organic solvent is washed with the rinsing liquid containing the above organic solvent. There is no particular limitation of the washing method, and for example, a method (rotation coating) of continuously discharging the rinsing liquid onto a substrate rotating at a constant speed, a method (dipping) of dipping the substrate in a tank filled with the rinsing liquid for a certain time, a method (spraying) of spraying the rinsing liquid to the substrate surface, and the like can be applied. Among these, it is preferable to wash the wafer by the rotation coating and rotate the washed substrate at a frequency of rotation of 2000 rpm to 4000 rpm so as to remove the rinsing liquid from the substrate. In addition, it is preferable to add post bake after the rinsing. By the baking, the developer and rinsing liquid remaining between or in the patterns are removed. The baking after rinsing is generally performed at 40° C. to 160° C., preferably at 70° C. to 95° C. generally for 10 seconds to 3 minutes, and preferably for 30 seconds to 90 seconds.

Examples

Hereinafter, the present invention will be described in more detail based on examples, but the content of the present invention is not limited thereto.

<Acid-Degradable Resin>

The resins (P-1) to (P-8) and (PA-1) to (PA-4) shown below were synthesized in the following manner.

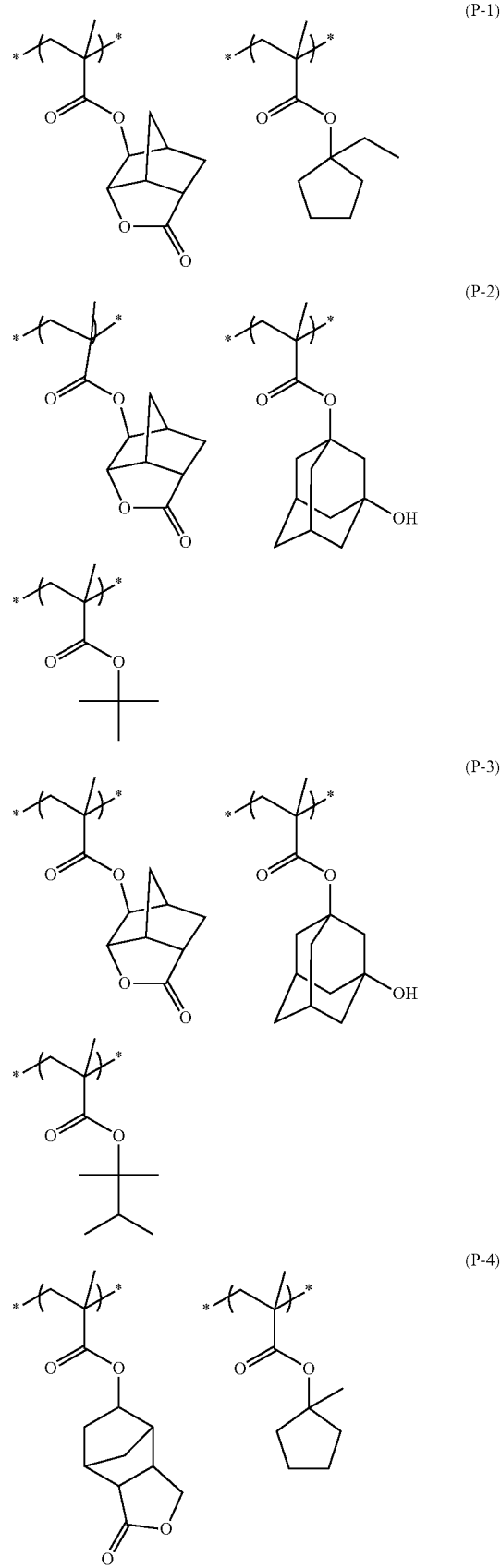

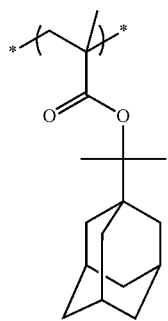
(P-5)
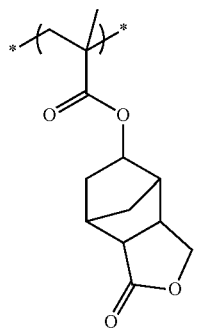
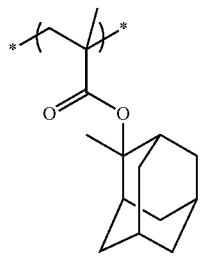
(P-6)
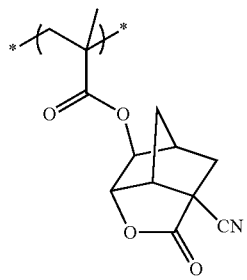
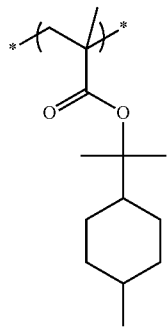
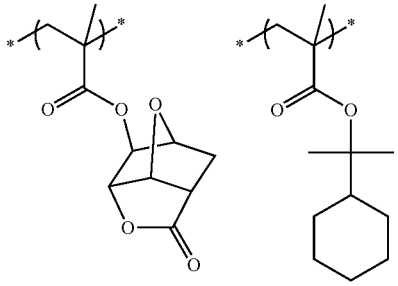
(P-7)
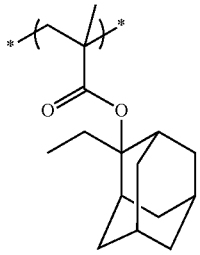
(P-8)
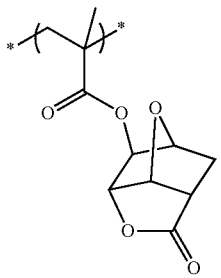 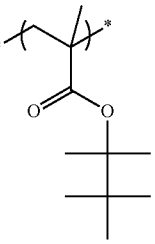
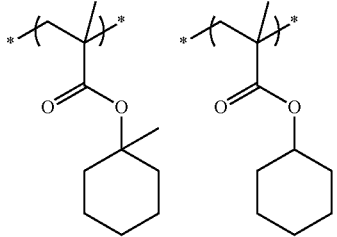
(PA-1)
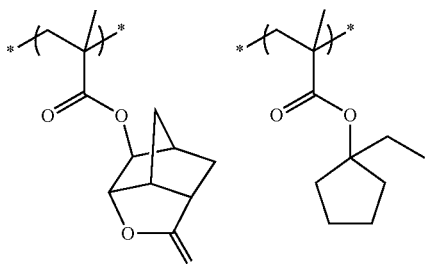
(PA-2)
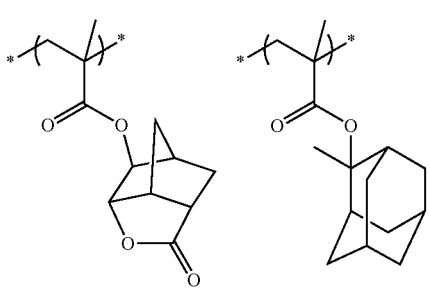

-continued

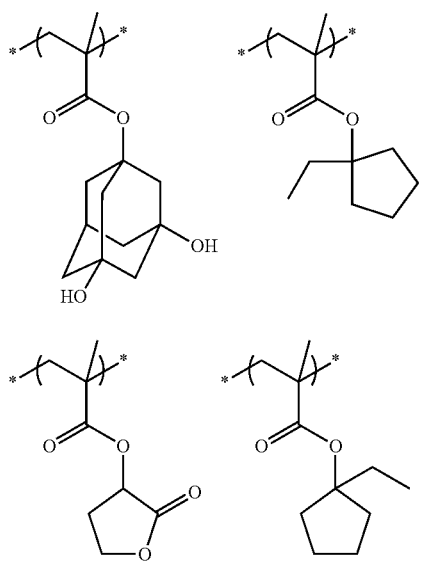
(PA-3)
(PA-4)

In the following Table 3, the weight average molecular weight Mw, the degree of dispersion Mw/Mn, and the compositional ratio (molar ratio; corresponding from left in order) of the respective repeating units in resins (P-1) to (P-8) and (PA-1) to (PA-4) are summarized.

TABLE 3

| Compound No. | Mw | Mw/Mn | Compositional ratio | | | |
|---|---|---|---|---|---|---|
| P-1 | 6900 | 1.57 | 35 | 65 | | |
| P-2 | 13200 | 1.68 | 20 | 10 | 70 | |
| P-3 | 11000 | 1.62 | 20 | 10 | 70 | |
| P-4 | 17200 | 1.82 | 15 | 65 | 20 | |
| P-5 | 8200 | 1.65 | 25 | 5 | 70 | |
| P-6 | 9500 | 1.73 | 20 | 15 | 65 | |
| P-7 | 12300 | 1.70 | 30 | 60 | 10 | |
| P-8 | 9800 | 1.72 | 15 | 60 | 20 | 5 |
| PA-1 | 8500 | 1.60 | 40 | 60 | | |
| PA-2 | 9200 | 1.64 | 50 | 50 | | |
| PA-3 | 10200 | 1.72 | 30 | 70 | | |
| PA-4 | 13000 | 1.69 | 35 | 65 | | |

[Synthesis Examples of Acid-Degradable Resin (Resin A)]

114 g of cyclohexanone was introduced to a three-necked flask under a nitrogen gas flow, followed by heating at 85° C., thereby preparing a solvent 1. Subsequently, a monomer-1 (38.9 g) and a monomer-2 (59.2 g) shown below were dissolved in cyclohexanone (211 g), and a polymerization initiator V-601 (manufactured by Wako Pure Chemical Industries, Ltd.) was added thereto at 4.2 mol % based on the total amount of the monomers and dissolved. The thus obtained solution was added dropwise to the solvent 1 over 6 hours, and after the dropwise addition ended, the resultant was allowed to react at 85° C. for 2 hours. After the reaction solution was cooled, a mixed solvent containing methanol 2660 g/water 296 g was added dropwise thereto, and the thus obtained precipitate was collected and dried, thereby obtaining 77 g of a resin (P-1). The weight average molecular weight of the obtained resin (P-1) was 6900, the degree of dispersion (Mw/Mn) was 1.57, and the compositional ratio measured by $^{13}$C-NMR was 35/65.

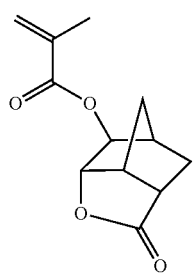
monomer-1

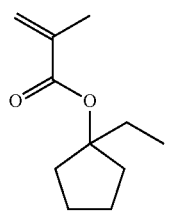
monomer-2

Resins (P-2) to (P-8) and (PA-1) to (PA-4) were synthesized in the same manner as the resin (P-1). The weight average molecular weight, the degree of dispersion (Mw/Mn), and the compositional ratio of these resins are as shown in the above Table 3.

<Acid-Generating Agent>

The acid-generating agent was used by being appropriately selected from the acid-generating agents z1 to z102 described above.

<Basic Compound>

As basic compounds, the following compounds (N-1) to (N-8) were prepared.

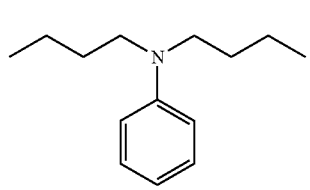
N-1

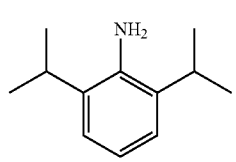
N-2

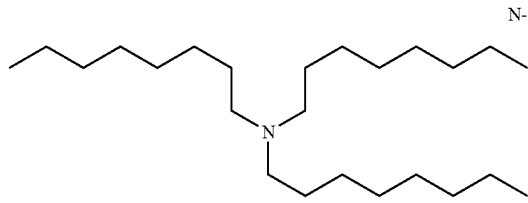
N-3

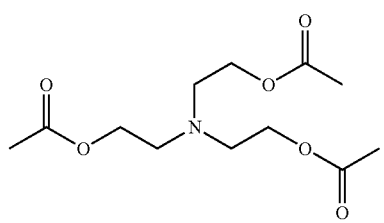
N-4

-continued

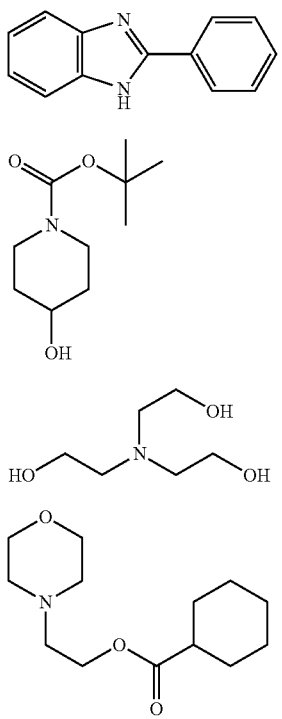

N-5

N-6

N-7

N-8

<Hydrophobic Resin>

The hydrophobic resin was used by being appropriately selected form the above-exemplified resins (HR-1) to (HR-90).

The hydrophobic resin (HR-83) was synthesized based on the disclosures of the specification of US2010/0152400A, WO2010/067905A, WO2010/067898A, and the like.

<Surfactant>

As surfactants, the following were prepared

W-1: Megafac F176 (manufactured by DIC CORPORATION; a fluorine-based surfactant)

W-2: Megafac R08 (manufactured by DIC CORPORATION; a fluorine and silicon-based surfactant)

W-3: polysiloxane polymer KP-341 (manufactured by Shin-Etsu Chemical Co., Ltd; a silicon-based surfactant)

W-4: Troysol S-366 (manufactured by Troy Chemical)

W-5: KH-20 (manufactured by Asahi Kasei Corporation)

W-6: PolyFox PF-6320 (manufactured by OMNOVA solution Inc.; a fluorine-based surfactant)

<Solvent>

As solvents, the following were prepared.

(a group)

SL-1: propylene glycol monomethyl ether acetate (PGMEA)

SL-2: propylene glycol monomethyl ether propionate

SL-3: 2-heptanone (b group)

SL-4: ethyl lactate

SL-5: propylene glycol monomethyl ether (PGME)

SL-6: cyclohexanone (c group)

SL-7: γ-butyrolactone

SL-8: propylene carbonate

<Developer>

As developers, the following were prepared.

SG-1: butyl acetate

SG-2: methyl amyl ketone

SG-3: ethyl-3-ethoxy propionate

SG-4: pentyl acetate

SG-5: isopentyl acetate

SG-6: propylene glycol monomethyl ether acetate (PGMEA)

SG-7: cyclohexanone

<Rinsing Liquid>

As rinsing liquids, the following were used.

SR-1: 4-methyl-2-pentanol

SR-2: 1-hexanol

SR-3: butyl acetate

SR-4: methyl amyl ketone

SR-5: ethyl-3-ethoxy propionate

<Negative Development>

(Preparation of Resist)

The components shown in the following Table 4 were dissolved in the solvents shown in the same table at 3.5% by mass in terms of a solid content, and the respective solutions were filtered through a polyethylene filter having a pore size of 0.03 μm, thereby preparing actinic-ray-sensitive or radiation-sensitive resin compositions (resist compositions). ARC29SR (manufactured by NISSAN CHEMICAL INDUSTRIES, LTD.) for forming an organic antireflection film was coated onto a silicon wafer, followed by baking at 205° C. for 60 seconds, thereby forming an antireflection film having a film thickness of 95 nm. The actinic-ray-sensitive or radiation-sensitive resin composition was coated onto the antireflection film, followed by baking (PB: Prebake) at 100° C. for 60 seconds, thereby forming a resist film having a film thickness of 100 nm.

The obtained wafer was subjected to pattern exposure through an exposure mask (line/space=binary mask 60 nm/60 nm) by using an ArF excimer laser liquid immersion scanner (manufactured by ASML; XT 1700i, NA 1.20, C-Quad, outer sigma 0.981, inner sigma 0.895, XY deflection). As the liquid for liquid immersion, ultrapure water was used. Thereafter, the wafer was baked (PEB: Post Exposure Bake) at the temperature shown in Table 4 for 60 seconds. Next, developing was performed by paddling the developer for 30 seconds, and while the developer was shaken off, the wafer was rinsed by paddling the rinsing liquid shown in Table 4 for 30 seconds. Subsequently, the wafer was rotated at a frequency of rotation of 4000 rpm for 30 seconds, followed by baking at 90° C. for 60 seconds. In this manner, a resist pattern with a line and space having a line width of 60 nm (1:1) was obtained.

(Resist Evaluation)

[Sensitivity (Eopt)]

The obtained pattern was observed using a scanning electron microscope (SEM manufactured by Hitachi, Ltd., S-9380I1), and the irradiation energy applied when resolving the resist pattern with a line and space having a line width of 60 nm (1:1) was taken as sensitivity (Eopt). The smaller the value, the higher the sensitivity.

[Line Width Roughness (LWR)]

A line and space of 60 nm (1:1) resolved with the exposure amount in the sensitivity (Eopt) was observed from the top of the pattern by a scanning electron microscope (SEM (manufactured by Hitachi, Ltd., S-8840)) for distance measurement. At this time, the line width at arbitrary points was observed and evaluated under measuring variation of 3 σ. The smaller the value, the better the performance.

[Exposure Latitude (EL) (%)]

An exposure amount that reproduces a mask pattern of a line and space having a line width of 60 nm (1:1) was taken as an optimal exposure amount, an exposure amount range that allows the pattern size to be 60 nm±10% when the exposure amount was changed was determined, and the value was divided by the optimal exposure amount so as to be expressed as a percentage. The larger the value, the smaller the change in performance caused by the change in the exposure amount, which indicates excellent exposure latitude.

[Film Thickness of Pattern Portion]

The film thickness of the finally obtained resist pattern was measured. The larger the value, the better the performance.

The results of the above evaluations are shown in the following Table 4.

TABLE 4

| | Acid-degradable resin | (g) | Acid-generating agent | (g) | Hydrophobic resin | (g) | Basic compound | (g) | Surfactant | (g) | Solvent | (Mass ratio) |
|---|---|---|---|---|---|---|---|---|---|---|---|---|
| Example | | | | | | | | | | | | |
| 1 | P-1 | 10 | z71 | 0.9 | HR-3 | 0.06 | N-1 | 0.15 | W-2 | 0.003 | SL-1/SL-5 | 60/40 |
| 2 | P-2 | 10 | z45 | 1 | HR-24 | 0.06 | N-2 | 0.15 | W-3 | 0.003 | SL-1/SL-5 | 60/40 |
| 3 | P-3 | 10 | z39 | 1.2 | HR-9 | 0.06 | N-3 | 0.15 | W-1 | 0.003 | SL-1/SL-5 | 60/40 |
| 4 | P-4 | 10 | z71 | 0.8 | HR-26 | 0.06 | N-4 | 0.15 | W-4 | 0.003 | SL-1/SL-5 | 80/20 |
| 5 | P-5 | 10 | z45 | 1 | HR-24 | 0.06 | N-5 | 0.15 | W-5 | 0.003 | SL-7/SL-5 | 70/30 |
| 6 | P-6 | 10 | z100 | 0.8 | HR-3 | 0.06 | N-6 | 0.15 | W-6 | 0.003 | SL-1 | 100 |
| 7 | P-7 | 10 | z45 | 1 | HR-24 | 0.06 | N-7 | 0.15 | W-2 | 0.003 | SL-6/SL-5 | 70/30 |
| 8 | P-8 | 10 | z71 | 1 | HR-24 | 0.03/0.03 | N-8 | 0.15 | W-3 | 0.003 | SL-1/SL-3 | 80/20 |
| 9 | P-1/P-2 | 5/5 | z45 | 1 | HR-24 | 0.06 | N-7 | 0.15 | W-6 | 0.003 | SL-1/SL-4 | 90/10 |
| 10 | P-1/PA-1 | 7/3 | z45 | 1 | HR-24 | 0.06 | N-2 | 0.15 | W-2 | 0.003 | SL-1/SL-8 | 90/10 |
| 11 | P-1 | 10 | z29/z39 | 0.7/0.3 | HR-26 | 0.06 | N-4 | 0.15 | W-3 | 0.003 | SL-1/SL-2 | 90/10 |
| 12 | P-1 | 10 | z45 | 1 | HR-83/HR-24 | 0.05/0.01 | N-6 | 0.15 | W-1 | 0.003 | SL-1/SL-6 | 90/10 |
| 13 | P-1 | 10 | z45 | 1 | HR-24 | 0.06 | N-3/N-7 | 0.15 | W-4 | 0.003 | SL-1 | 100 |
| | | | | | | | | 0.08/0.07 | | | | |
| 14 | P-1 | 10 | z45 | 0.9 | HR-3 | 0.06 | N-4 | 0.15 | W-2/W-3 | 0.001/0.002 | SL-1/SL-5 | 70/30 |
| 15 | P-1 | 10 | z45 | 1 | HR-3 | 0.06 | N-4 | 0.15 | — | — | SL-1/SL-5 | 70/30 |
| Comparative Example | | | | | | | | | | | | |
| 1 | PA-1 | 10 | z45 | 1 | HR-24 | 0.06 | N-5 | 0.15 | W-3 | 0.003 | SL-6/SL-5 | 80/20 |
| 2 | PA-2 | 10 | z45 | 1 | HR-24 | 0.06 | N-1 | 0.15 | W-2 | 0.003 | SL-7/SL-5 | 70/30 |
| 3 | PA-3 | 10 | z45 | 1 | HR-9 | 0.06 | N-2 | 0.15 | W-5 | 0.003 | SL-1 | 100 |
| 4 | PA-4 | 10 | z45 | 1 | HR-3 | 0.06 | N-6 | 0.15 | W-6 | 0.003 | SL-1/SL-5 | 60/40 |

| | Developer | (Mass ratio) | Rinsing liquid | (Mass ratio) | PEB temperature (°C.) | Sensitivity [mJ/cm$^2$] | LWR [nm] | EL [%] | Film thickness of pattern portion (nm) | Molecular weight of eliminated substance | Molecular weight of eliminated substance [mol average] |
|---|---|---|---|---|---|---|---|---|---|---|---|
| Example | | | | | | | | | | | |
| 1 | SG-1 | 100 | SR-1 | 100 | 100 | 29.2 | 5.5 | 15 | 75 | 96 | 96 |
| 2 | SG-2 | 100 | SR-2 | 100 | 120 | 40.2 | 5.2 | 17 | 84 | 56 | 56 |
| 3 | SG-1 | 100 | SR-1/SR-3 | 80/20 | 100 | 29.3 | 5.0 | 16 | 76 | 84 | 84 |
| 4 | SG-3 | 100 | SR-5 | 100 | 110 | 30.2 | 5.1 | 19 | 65 | 82/176 | 104 |
| 5 | SG-5 | 100 | SR-1 | 100 | 110 | 35.1 | 5.4 | 20 | 59 | 148 | 148 |
| 6 | SG-6 | 100 | SR-2 | 100 | 100 | 27.7 | 5.8 | 19 | 64 | 138 | 138 |
| 7 | SG-2/SG-7 | 80/20 | SR-1 | 100 | 100 | 27.5 | 5.5 | 19 | 64 | 124/162 | 129 |
| 8 | SG-1/SG-3 | 60/40 | SR-1/SR-4 | 70/30 | 100 | 30.1 | 5.0 | 14 | 69 | 98/96 | 98 |
| 9 | SG-3/SG-7 | 70/30 | SR-1 | 100 | 120 | 35.2 | 5.3 | 16 | 79 | 96/56 | 76 |
| 10 | SG-4 | 100 | SR-2 | 100 | 100 | 30.9 | 5.8 | 13 | 77 | 96 | 96 |
| 11 | SG-1/SG-7 | 90/10 | SR-1 | 100 | 100 | 32.0 | 5.2 | 15 | 73 | 96 | 96 |
| 12 | SG-2/SG-3 | 50/50 | SR-1/SR-3 | 70/30 | 100 | 27.4 | 5.4 | 15 | 74 | 96 | 96 |
| 13 | SG-1 | 100 | SR-1 | 100 | 100 | 30.1 | 5.3 | 15 | 72 | 96 | 96 |
| 14 | SG-4 | 100 | SR-3 | 100 | 100 | 31.9 | 5.3 | 16 | 73 | 96 | 96 |
| 15 | SG-5 | 100 | SR-1 | 100 | 100 | 32.2 | 5.2 | 15 | 73 | 96 | 96 |
| Comparative Example | | | | | | | | | | | |
| 1 | SG-1 | 100 | SR-1 | 100 | 100 | 28.2 | 6.3 | 9 | 78 | 96 | 96 |
| 2 | SG-1 | 100 | SR-1 | 100 | 100 | 32.5 | 7.8 | 10 | 64 | 148 | 148 |
| 3 | SG-1 | 100 | SR-1 | 100 | 120 | 50.6 | 7.8 | 12 | 84 | 96 | 96 |
| 4 | SG-1 | 100 | SR-1 | 100 | 85 | 32.3 | 5.6 | 3 | 67 | 96 | 96 |

From the results shown in Table 4, it is clearly understood that even if Comparative Examples 1 and 2 contain the repeating unit represented by General Formula (I) or (II), the Comparative Examples 1 and 2 in which the repeating unit having an acid-degradable group does not reach 65 mol % exhibit great line width roughness (LWR) and small exposure latitude (EL), which shows that the Comparative Examples 1 and 2 are poor in both the LWR and EL.

In addition, it is understood that even if Comparative Examples 3 and 4 contain 65 mol % or more of the repeating unit having an acid-degradable group, the Comparative Examples 3 and 4 that do not contain the repeating unit represented by General Formula (I) or (II) exhibit particularly great LWR or particularly small EL, which shows that the Comparative Examples 3 and 4 are particularly poor either in LWR or in EL.

On the other hand, it is understood that Examples 1 to 15 that contain 65 mol % or more of the repeating unit having an acid-degradable group and the repeating unit represented by General Formula (I) or (II) exhibit small LWR, great EL, which shows that Examples 1 to 15 are excellent in both the LWR and EL. In addition, it is understood that Examples 1 to 15 are also excellent in sensitivity.

Particularly, comparing Comparative Example 1 containing 60 mol % of the repeating unit having an acid-degradable group with Example 1 containing 65 mol % of the repeating unit having an acid-degradable group, Example 1 exhibits small LWR and great EL. From this result, it is clearly understood that Example 1 is excellent in both the LWR and EL.

Moreover, it is understood that in Examples 1 to 4 and 6 to 15 which contain, as the repeating unit having an acid-degradable group, 50 mol % or more of the repeating unit that generates an eliminated substance having a molecular weight of 140 or less by the degradation of the acid-degradable group, the film thickness of the pattern portion is large, and film thinning is particularly small and excellent. Particularly, it is understood that in Examples 1 to 3 and 8 to 15 in which the molecular weight of the eliminated substance that is generated by the degradation of an acid-degradable group is 100 or less, the film thickness of the pattern portion is particularly large, and the film thinning is particularly small and excellent.

In addition, the each resist films prepared by Examples 1 to 8 was subjected to dry exposure in the same condition as in the liquid immersion exposure described above, except that the line width was changed to 80 nm, and these resist films also showed excellent results.

What is claimed is:

1. A pattern forming method comprising:
    (1) forming a film by using an actinic-ray-sensitive or radiation-sensitive resin composition containing a resin that includes;
    65 mol % or more of a repeating unit represented by the following General Formula (AI) as a repeating unit having a group which generates a polar group by being degraded by the action of an acid based on all repeating units in the resin, and
    at least one kind of repeating unit represented by the following General Formula (I) or (II);
    (2) exposing the film; and
    (3) developing the exposed film using a developer that contains an organic solvent:

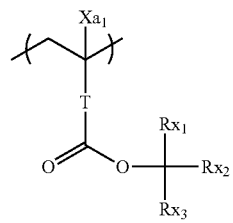

wherein in General Formula (AI), $Xa_1$ represents a hydrogen atom, a methyl group which may have a substituent, or a group represented by —$CH_2$—$R_9$, where $R_9$ represents a hydrogen atom or a monovalent organic group;

T represents a single bond; and each of $Rx_1$ to $Rx_3$ independently represents an alkyl group or a cycloalkyl group; and two or more of $Rx_1$ to $Rx_3$ may form a cycloalkyl group by binding to each other,

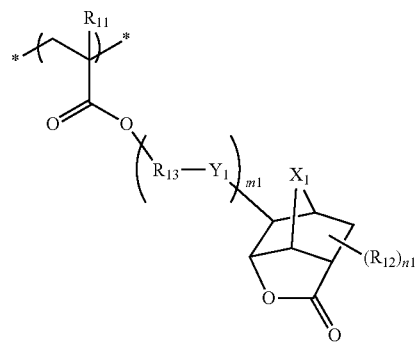

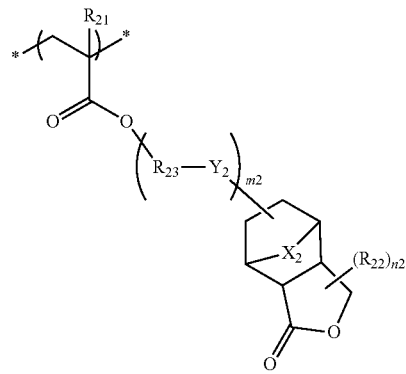

wherein in General Formulae (I) and (II), each of $R_{11}$ and $R_{21}$ independently represents a hydrogen atom or an alkyl group;

each of $R_{12}$ and $R_{22}$ independently represents an alkyl group, a cycloalkyl group, an alkoxy group, an alkoxycarbonyl group, a carboxyl group, a halogen atom, a hydroxyl group, or a cyano group;

each of $R_{13}$ and $R_{23}$ independently represents an alkylene group, a cycloalkylene group, or a combination thereof, provided that when a plurality of $R_{13}$s are present, each $R_{13}$ may be the same as or different from each other, and provided that when a plurality of $R_{23}$s are present, each $R_{23}$ may be the same as or different from each other;

each of $Y_1$ and $Y_2$ independently represents a single bond, an ether bond, an ester bond, an amide bond, a urethane bond, or a ureylene bond, provided that when a plurality of $Y_1$s are present, each $Y_1$ may be the same as or different from each other, and provided that when a plurality of $Y_2$s are present, each $Y_2$ may be the same as or different from each other;

each of $X_1$ and $X_2$ independently represents a methylene group, a methyl methylene group, a dimethyl methylene group, an ethylene group, an oxygen atom, or a sulfur atom, each of m1 and m2 independently represents an integer of 0 to 4;

each of n1 and n2 independently represents an integer of 0 to 4, provided that when n1 is 2 or greater, a plurality of $R_{12}$s may be the same as or different from each other or may form a ring by binding to each other, and provided that when n2 is 2 or greater, a plurality of $R_{22}$s may be the same as or different from each other or may form a ring by binding to each other.

2. The pattern forming method according to claim 1, wherein the content of the organic solvent in the developer is 90% by mass to 100% by mass based on the total amount of the developer.

3. The pattern forming method according to claim 1, wherein the resin contains, as the repeating unit having a group which generates a polar group, 50 mol % or more of a repeating unit generating an eliminated substance having a molecular weight of 140 or less by the action of an acid, based on all repeating units in the resin.

4. The pattern forming method according to claim 1, wherein the resin further contains a repeating unit having a hydroxyl adamantyl group or a dihydroxy adamantyl group.

5. The pattern forming method according to claim 1, wherein the resin does not have an acid group.

6. The pattern forming method according to claim 1, wherein the actinic-ray-sensitive or radiation-sensitive resin composition further contains a hydrophobic resin.

7. The pattern forming method according to claim 6, wherein the hydrophobic resin contains at least any one of a fluorine atom and a silicon atom.

8. The pattern forming method according to claim 1, wherein the developer contains at least one kind of organic solvent selected from a group consisting of a ketone-based solvent, an ester-based solvent, an alcohol-based solvent, an amide-based solvent, and an ether-based solvent.

9. The pattern forming method according to claim 1, further comprising (4) washing the developed film using a rinsing liquid containing an organic solvent.

10. The pattern forming method according to claim 1, wherein the exposing in (2) is liquid immersion exposure.

11. The pattern forming method according to claim 1, wherein m1 in the General Formula (I) represents 0.

12. The pattern forming method according to claim 1, wherein the repeating unit represented by General Formula (AI) is at least one of a repeating unit represented by the following General Formula (1) and a repeating unit represented by the following General Formula (2):

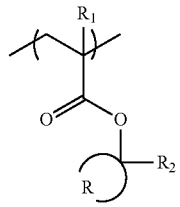

(1)

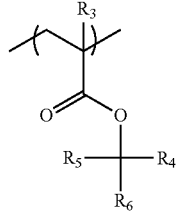

(2)

wherein in General Formulae (1) and (2), each of $R_1$ and $R_3$ independently represents a hydrogen atom, a methyl group which may have a substituent, or a group represented by —CH—$R_9$, where $R_9$ represents a hydroxyl group or a monovalent organic group;

each of $R_2$, $R_4$, $R_5$, and $R_6$ independently represents an alkyl group or a cycloalkyl group; and R represents an atomic group that is necessary for forming an alicyclic structure with a carbon atom.

13. The pattern forming method according to claim 1, wherein the actinic-ray-sensitive or radiation-sensitive resin composition further contains a nitrogen-containing organic compound having a group eliminated by the action of an acid represented by the following General Formula (F);

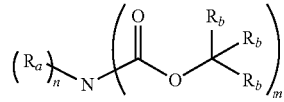

(F)

in General Formula (F), $R_a$ represents a hydrogen atom, an alkyl group, a cycloalkyl group, an aryl group, or an aralkyl group, when n=2, two $R_a$s may be the same as or different from each other, and the two $R_a$s may form a divalent heterocyclic hydrocarbon group or a derivative thereof by binding to each other, $R_b$ independently represents a hydrogen atom, an alkyl group, a cycloalkyl group, an aryl group, or an aralkyl group, in —C($R_b$)($R_b$)($R_b$), when one or more $R_b$s are hydrogen atoms, at least one of the remaining $R_b$s is a cyclopropyl group or a 1-alkoxyalkyl group, at least two $R_b$s may form an alicyclic hydrocarbon group, an aromatic hydrocarbon group, a heterocyclic hydrocarbon group, or a derivative thereof by binding to each other, n represents an integer of 0 to 2, m represents an integer of 1 to 3, and n+m=3.

14. The pattern forming method according to claim 1, wherein the repeating unit represented by the General Formula (AI) is at least one repeating unit selected from the group consisting of repeating units represented by the following General Formulas:

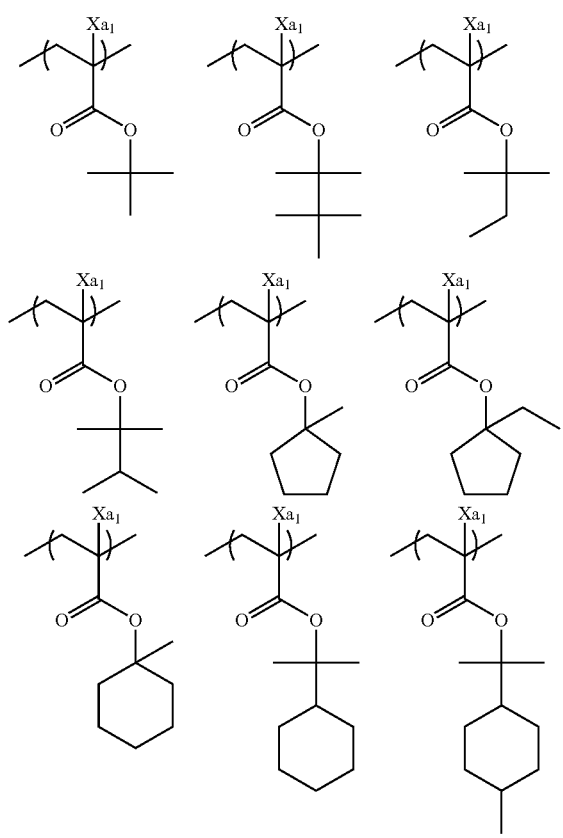

wherein in the General Formulas, $Xa_1$ represents a hydrogen atom, $CH_3$, $CF_3$, or $CH_2OH$.

15. A pattern forming method comprising:
(1) forming a film by using an actinic-ray-sensitive or radiation-sensitive resin composition containing a resin that includes:
65 mol % or more of a repeating unit having a group which generates a polar group by being degraded by the action of an acid based on all repeating units in the resin, and
at least one kind of repeating unit represented by the following General Formula (I) or (II);
(2) exposing the film; and
(3) developing the exposed film using a developer that contains an organic solvent:

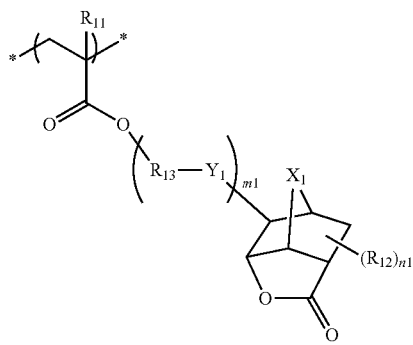

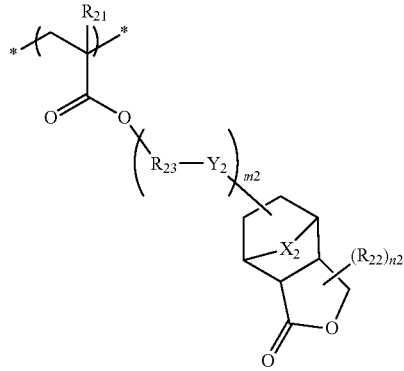

wherein in General Formulae (I) and (II),
each of $R_{11}$ and $R_{21}$ independently represents a hydrogen atom or an alkyl group;
each of $R_{12}$ and $R_{22}$ independently represents an alkyl group, a cycloalkyl group, an alkoxy group, an alkoxycarbonyl group, a carboxyl group, a halogen atom, a hydroxyl group, or a cyano group;
each of $R_{13}$ and $R_{23}$ independently represents an alkylene group, a cycloalkylene group, or a combination thereof, provided that when a plurality of $R_{13}$s are present, each $R_{13}$ may be the same as or different from each other, and provided that when a plurality of $R_{23}$s are present, each $R_{23}$ may be the same as or different from each other;
each of $Y_1$ and $Y_2$ independently represents a single bond, an ether bond, an ester bond, an amide bond, a urethane bond, or a ureylene bond, provided that when a plurality of $Y_1$s are present, each $Y_1$ may be the same as or different from each other, and provided that when a plurality of $Y_2$s are present, each $Y_2$ may be the same as or different from each other;
each of $X_1$ and $X_2$ independently represents a methylene group, a methyl methylene group, a dimethyl methylene group, an ethylene group, an oxygen atom, or a sulfur atom,
m1 represents 0,
m2 represents an integer of 0 to 4;
each of n1 and n2 independently represents an integer of 0 to 4, provided that when n1 is 2 or greater, a plurality of $R_{12}$s may be the same as or different from each other or may form a ring by binding to each other, and provided that when n2 is 2 or greater, a plurality of $R_{22}$s may be the same as or different from each other or may form a ring by binding to each other.

16. The pattern forming method according to claim 15,
wherein the actinic-ray-sensitive or radiation-sensitive resin composition further contains a nitrogen-containing organic compound having a group eliminated by the action of an acid represented by the following General Formula (F);

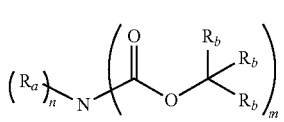

in General Formula (F), $R_a$ represents a hydrogen atom, an alkyl group, a cycloalkyl group, an aryl group, or an aralkyl group, when n=2, two $R_a$s may be the same as or different from each other, and the two $R_a$s may form a divalent heterocyclic hydrocarbon group or a derivative thereof by binding to each other, $R_b$ independently represents a hydrogen atom, an alkyl group, a cycloalkyl group, an aryl group, or an aralkyl group, in —$C(R_b)(R_b)(R_b)$, when one or more $R_b$s are hydrogen atoms, at least one of the remaining $R_b$s is a cyclopropyl group or a 1-alkoxyalkyl group, at least two $R_b$s may form an alicyclic hydrocarbon group, an aromatic hydrocarbon group, a heterocyclic hydrocarbon group, or a derivative thereof by binding to each other, n represents an integer of 0 to 2, m represents an integer of 1 to 3, and n+m=3.

* * * * *